US007743262B2

(12) United States Patent  
Walmsley

(10) Patent No.: US 7,743,262 B2
(45) Date of Patent: Jun. 22, 2010

(54) INTEGRATED CIRCUIT INCORPORATING PROTECTION FROM POWER SUPPLY ATTACKS

(75) Inventor: Simon Robert Walmsley, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 966 days.

(21) Appl. No.: 10/866,608

(22) Filed: Jun. 14, 2004

(65) Prior Publication Data

US 2004/0236961 A1 Nov. 25, 2004

Related U.S. Application Data

(60) Continuation of application No. 09/517,384, filed on Mar. 2, 2000, now Pat. No. 7,346,586, which is a division of application No. 09/113,223, filed on Jul. 10, 1998, now Pat. No. 6,442,525.

(51) Int. Cl.
G06F 12/14 (2006.01)
(52) U.S. Cl. ............... 713/194; 713/300; 327/142; 327/143; 327/198
(58) Field of Classification Search .............. 713/194, 713/340, 320, 300, 172; 726/36; 340/429, 340/566; 361/1; 235/375, 379, 380; 307/43; 327/63, 78, 142, 143, 198, 162; 365/222; 323/268

See application file for complete search history.

(56) References Cited

U.S. PATENT DOCUMENTS

| 3,866,217 | A |   | 2/1975  | Bennett, Jr.            |
| 4,262,284 | A |   | 4/1981  | Stieff et al.           |
| 4,529,870 | A |   | 7/1985  | Chaum                   |
| 4,710,613 | A |   | 12/1987 | Shigenaga               |
| 4,736,423 | A |   | 4/1988  | Matyas                  |
| 4,799,061 | A |   | 1/1989  | Abraham et al.          |
| 4,800,590 | A |   | 1/1989  | Vaughan                 |
| 4,827,113 | A |   | 5/1989  | Rikuna                  |
| 4,862,501 | A | * | 8/1989  | Kamitake et al. ... 713/172 |
| 4,902,910 | A | * | 2/1990  | Hsieh ............... 327/143 |
| 5,036,461 | A |   | 7/1991  | Elliott et al.          |
| 5,136,642 | A |   | 8/1992  | Kawamura et al.         |
| 5,153,532 | A |   | 10/1992 | Albers et al.           |
| 5,196,840 | A |   | 3/1993  | Leith et al.            |
| 5,245,657 | A |   | 9/1993  | Sakurai                 |
| 5,311,595 | A |   | 5/1994  | Bjerrum et al.          |
| 5,499,294 | A |   | 3/1996  | Friedman                |
| 5,500,517 | A | * | 3/1996  | Cagliostro ......... 235/486 |
| 5,506,905 | A |   | 4/1996  | Markowski et al.        |

(Continued)

FOREIGN PATENT DOCUMENTS

GB  1595797 A   8/1981
WO  WO 93/04425 A1  3/1993

Primary Examiner—Thanhnga B Truong

(57) ABSTRACT

An integrated circuit including: non-volatile memory for containing secret information; and a detection unit for preventing at least one form of power supply attack on the secret information, the detection unit comprising:
a first comparator having a first input connected to a first reference voltage and a second input connected to a power supply line, the first comparator being configured to output a first detection signal when a power supply voltage moves beyond a first predetermined limit determined by the first reference voltage; and
an output to provide a signal to delete, overwrite, or otherwise render unreadable at least the secret information in the memory when the first detection signal is output by the first comparator.

4 Claims, 8 Drawing Sheets

U.S. PATENT DOCUMENTS

| | | |
|---|---|---|
| 5,515,441 A | 5/1996 | Faucher |
| 5,619,571 A | 4/1997 | Sandstrom et al. |
| 5,629,642 A * | 5/1997 | Yoshimura .................. 327/142 |
| 5,633,932 A | 5/1997 | Davis et al. |
| 5,646,591 A * | 7/1997 | Issa et al. .................... 340/566 |
| 5,757,388 A | 5/1998 | Stephenson |
| 5,768,389 A | 6/1998 | Ishii |
| 5,923,759 A | 7/1999 | Lee |
| 5,982,899 A | 11/1999 | Probst |
| 5,987,134 A | 11/1999 | Shin et al. |
| 5,990,786 A * | 11/1999 | Issa et al. .................... 340/429 |
| 6,028,937 A | 2/2000 | Tatebayashi et al. |
| 6,049,880 A * | 4/2000 | Song ......................... 713/300 |
| 6,088,450 A | 7/2000 | Davis et al. |
| 6,192,473 B1 | 2/2001 | Ryan, Jr. et al. |
| 6,374,354 B1 | 4/2002 | Walmsley et al. |
| 6,642,757 B2 * | 11/2003 | Ikehashi et al. ............. 327/143 |

* cited by examiner

INTEGRATED CIRCUIT INCORPORATING PROTECTION FROM POWER SUPPLY ATTACKS

CROSS REFERENCES TO RELATED APPLICATIONS

The present application is a Continuation of U.S. application Ser. No. 09/517,384 filed on Mar. 2, 2000, now issued U.S. Pat. No. 7,346,586, which is a Divisional of U.S. application Ser. No. 09/113,223 filed on Jul. 10, 1998, now issued U.S. Pat. No. 6,442,525.

TECHNICAL FIELD

This invention concerns a validation protocol for determining whether an untrusted authentication chip is valid, or not. The protocol may be used to determine the physical presence of a valid authentication chip and from that determine whether a consumable containing the chip is valid. In another aspect the invention also concerns a system for validating the chip.

BACKGROUND OF THE INVENTION

The process of authentication has particular application in any system (chip or software) that manipulates secure data. This includes Internet commerce, peer to peer communication, Smart Cards, Authentication chips, electronic keys, and cryptographic equipment. Whilst the description of the preferred embodiments of the present invention assumes a System/consumable relationship, it is a trivial matter to extend the protocol for other uses. An example is Internet commerce, where each consumer is effectively the consumable, and the Shop is the System. Another usage is Smart Cards, where each smart card can have a unique key, known to the System.

Existing solutions to the problem of authenticating consumables have typically relied on physical patents on packaging. However this does not stop inferior refill operations or clone manufacture in countries with weak industrial property protection. Consequently a much higher level of protection is required.

SUMMARY OF THE INVENTION

This invention is a validation protocol (described as Protocol 2) for determining whether an untrusted authentication chip is valid, or not, including the steps of:

Generating a random number and encrypting it with an asymmetric encryption function using a first key;

Passing the encrypted random number to an untrusted authentication chip;

Decrypting the encrypted random number with an asymmetric decryption function using a secret key, in the untrusted authentication chip;

Comparing the decrypted random number with the original random number, and in the event of a match considering the untrusted chip to be valid;

Otherwise considering the untrusted chip to be invalid.

The random number does not have to be secret, but must be seeded with a different initial value each time it is generated so that it changes each time.

Use of an asymmetrical encryption function allows encryption outside the untrusted chip to be performed in an insecure environment and the encryption key need not be secret. The first key may be a public key. The encryption can be implemented in software or hardware, with the proviso that the seed for the random number generator is different for each chip or system. The protocol therefore can be implemented as a Single Chip Protocol or as a Double Chip Protocol.

When it is implemented as a single chip protocol the random number generation, encryption, passing and comparison steps take place in an external system. The system may be in a printer or other device in which consumables such as ink cartridges are mounted. The untrusted chip will be in the consumable.

When it is implemented as a double chip protocol the random number generation and encryption steps take place in second authentication chip, and an external system receives the random number and the encrypted version before passing only the encrypted version to the untrusted chip. The system also receives back the decrypted version from the untrusted chip and performs the comparison. Again the system may be in a printer or other device in which consumables such as ink cartridges are mounted. The untrusted chip will be in the consumable.

Each key should be 2048 bits or larger.

The Protocol has the following advantages:

The secret decryption key is not revealed during the authentication process, so a clone chip cannot generate the random number without the key or access to a validated chip.

If encryption takes place in a physical chip the remainder of the system is easy to design.

There are a number of well-documented and cryptanalyzed asymmetric algorithms to chose from for implementation, including patent-free and license-free solutions.

In another aspect the invention is a validation system for determining whether an untrusted authentication chip is valid, the system including a random number generator, an asymmetric encryptor to encrypt generated random numbers and a first key for the encryptor, and an untrusted authentication chip. The untrusted chip includes an asymmetric decryption function to decrypt encrypted random numbers and a secret key for the decryption function. Comparison means are also provided to compare a decrypted random number with an original random number, and in the event of a match considering the untrusted chip to be valid. Otherwise considering the untrusted chip to be invalid.

BRIEF DESCRIPTION OF THE DRAWINGS

Notwithstanding any other forms which may fall within the scope of the present invention, preferred forms of the invention will now be described, by way of example only, with reference to the accompanying drawings in which.

BEST MODE OF THE INVENTION

Authentication Chip

Authentication Chips

Figure 1:
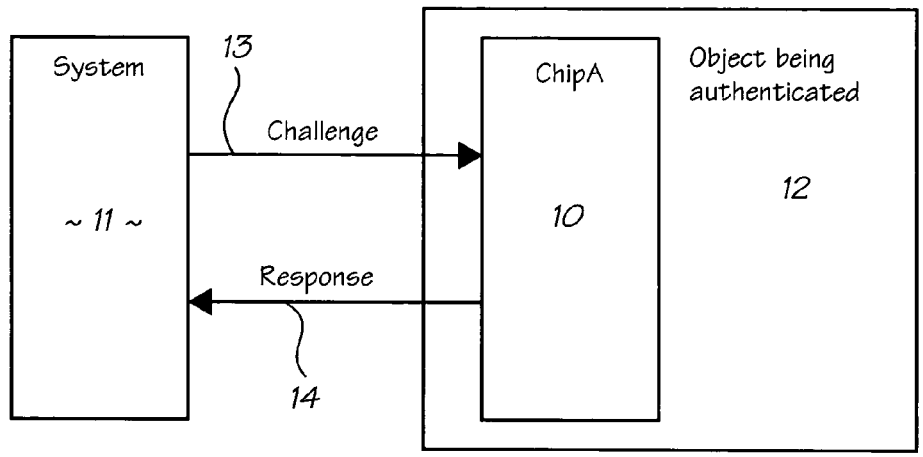
FIG. 1 illustrates a single authentication chip data protocol.

The authentication chip of the preferred embodiment is responsible for ensuring that only correctly manufactured print rolls are utilized in the camera system. The authentication chip utilizes technologies that are generally valuable when utilized with any consumables and are not restricted to print roll system. Manufacturers of other systems that require consumables (such as a laser printer that requires toner cartridges) have struggled with the problem of authenticating consumables, to varying levels of success. Most have resorted to specialized packaging. However this does not stop home refill operations or clone manufacture. The prevention of copying is important to prevent poorly manufactured substitute consumables from damaging the base system. For example, poorly filtered ink may clog print nozzles in an ink jet printer, causing the consumer to blame the system manufacturer and not admit the use of non-authorized consumables.

To solve the authentication problem, the Authentication chip contains an authentication code and circuit specially designed to prevent copying. The chip is manufactured using the standard Flash memory manufacturing process, and is low cost enough to be included in consumables such as ink and toner cartridges. Once programmed, the Authentication chips as described here are compliant with the NSA export guidelines. Authentication is an extremely large and constantly growing field. Here we are concerned with authenticating consumables only.

Symbolic Nomenclature

The following symbolic nomenclature is used throughout the discussion of this embodiment:

| Symbolic Nomenclature | Description |
| --- | --- |
| F[X] | Function F, taking a single parameter X |
| F[X, Y] | Function F, taking two parameters, X and Y |
| X \| Y | X concatenated with Y |
| X ∧ Y | Bitwise X AND Y |
| X ∨ Y | Bitwise X OR Y (inclusive-OR) |
| X⊕Y | Bitwise X XOR Y (exclusive-OR) |
| ~X | Bitwise NOT X (complement) |
| X ← Y | X is assigned the value Y |
| X ← {Y, Z} | The domain of assignment inputs to X is Y and Z. |
| X = Y | X is equal to Y |
| X ≠ Y | X is not equal to Y |
| ⇓X | Decrement X by 1 (floor 0) |
| ⇑X | Increment X by 1 (with wrapping based on register length) |
| Erase X | Erase Flash memory register X |
| SetBits[X, Y] | Set the bits of the Flash memory register X based on Y |

| Symbolic Nomenclature | Description |
| --- | --- |
| Z ← ShiftRight[X, Y] | Shift register X right one bit position, taking input bit from Y and placing the output bit in Z |

Basic Terms

A message, denoted by M, is plaintext. The process of transforming M into cyphertext C, where the substance of M is hidden, is called encryption. The process of transforming C back into M is called decryption. Referring to the encryption function as E, and the decryption function as D, we have the following identities:

$$E[M]=C$$

$$D[C]=M$$

Therefore the following identity is true:

$$D[E[M]]=M$$

Symmetric Cryptography

A symmetric encryption algorithm is one where:

the encryption function E relies on key $K_1$, the decryption function D relies on key $K_2$, $K_2$ can be derived from $K_1$, and $K_1$ can be derived from $K_2$.

In most symmetric algorithms, $K_1$ usually equals $K_2$. However, even if $K_1$ does not equal $K_2$, given that one key can be derived from the other, a single key K can suffice for the mathematical definition. Thus:

$$E_K[M]=C$$

$$D_K[C]=M$$

An enormous variety of symmetric algorithms exist, from the textbooks of ancient history through to sophisticated modern algorithms. Many of these are insecure, in that modern cryptanalysis techniques can successfully attack the algorithm to the extent that K can be derived. The security of the particular symmetric algorithm is normally a function of two things: the strength of the algorithm and the length of the key. The following algorithms include suitable aspects for utilization in the authentication chip.

DES

Blowfish

RC5

IDEA

DES

DES (Data Encryption Standard) is a US and international standard, where the same key is used to encrypt and decrypt. The key length is 56 bits. It has been implemented in hardware and software, although the original design was for hardware only. The original algorithm used in DES is described in U.S. Pat. No. 3,962,539. A variant of DES, called triple-DES is more secure, but requires 3 keys: $K_1$, $K_2$, and $K_3$. The keys are used in the following manner:

$$E_{K3}[D_{K2}[E_{K1}[M]]]=C$$

$$D_{K3}[E_{K2}[D_{K1}[C]]]=M$$

The main advantage of triple-DES is that existing DES implementations can be used to give more security than single key DES. Specifically, triple-DES gives protection of equivalent key length of 112 bits. Triple-DES does not give the equivalent protection of a 168-bit key (3×56) as one might naively expect. Equipment that performs triple-DES decoding and/or encoding cannot be exported from the United States.

Blowfish

Blowfish, is a symmetric block cipher first presented by Schneier in 1994. It takes a variable length key, from 32 bits to 448 bits. In addition, it is much faster than DES. The Blowfish algorithm consists of two parts: a key-expansion part and a data-encryption part. Key expansion converts a key of at most 448 bits into several subkey arrays totaling 4168 bytes. Data encryption occurs via a 16-round Feistel network. All operations are XORs and additions on 32-bit words, with four index array lookups per round. It should be noted that decryption is the same as encryption except that the subkey arrays are used in the reverse order. Complexity of implementation is therefore reduced compared to other algorithms that do not have such symmetry.

RC5

Designed by Ron Rivest in 1995, RC5 has a variable block size, key size, and number of rounds. Typically, however, it uses a 64-bit block size and a 128-bit key. The RC5 algorithm consists of two parts: a key-expansion part and a data-encryption part. Key expansion converts a key into 2r+2 subkeys (where r=the number of rounds), each subkey being w bits. For a 64-bit blocksize with 16 rounds (w=32, r=16), the subkey arrays total 136 bytes. Data encryption uses addition mod $2^w$, XOR and bitwise rotation.

IDEA

Developed in 1990 by Lai and Massey, the first incarnation of the IDEA cipher was called PES. After differential cryptanalysis was discovered by Biham and Shamir in 1991, the algorithm was strengthened, with the result being published in 1992 as IDEA. IDEA uses 128 bit-keys to operate on 64-bit plaintext blocks. The same algorithm is used for encryption and decryption. It is generally regarded to be the most secure block algorithm available today. It is described in U.S. Pat. No. 5,214,703, issued in 1993.

Asymmetric Cryptography

As alternative an asymmetric algorithm could be used. An asymmetric encryption algorithm is one where:
the encryption function E relies on key $K_1$,
the decryption function D relies on key $K_2$,
$K_2$ cannot be derived from $K_1$ in a reasonable amount of time, and
$K_1$ cannot be derived from $K_2$ in a reasonable amount of time.

Thus:

$$E_{K1}[M]=C$$

$$D_{K2}[C]=M$$

These algorithms are also called public-key because one key $K_1$ can be made public. Thus anyone can encrypt a message (using $K_1$), but only the person with the corresponding decryption key ($K_2$) can decrypt and thus read the message. In most cases, the following identity also holds:

$$E_{K2}[M]=C$$

$$D_{K1}[C]=M$$

This identity is very important because it implies that anyone with the public key $K_1$ can see M and know that it came from the owner of $K_2$. No-one else could have generated C because to do so would imply knowledge of $K_2$. The property of not being able to derive $K_1$ from $K_2$ and vice versa in a reasonable time is of course clouded by the concept of reasonable time. What has been demonstrated time after time, is that a calculation that was thought to require a long time has been made possible by the introduction of faster computers, new algorithms etc. The security of asymmetric algorithms is based on the difficulty of one of two problems: factoring large numbers (more specifically large numbers that are the product of two large primes), and the difficulty of calculating discrete logarithms in a finite field. Factoring large numbers is conjectured to be a hard problem given today's understanding of mathematics. The problem however, is that factoring is getting easier much faster than anticipated. Ron Rivest in 1977 said that factoring a 125-digit number would take 40 quadrillion years. In 1994 a 129-digit number was factored. According to Schneier, you need a 1024-bit number to get the level of security today that you got from a 512-bit number in the 1980's. If the key is to last for some years then 1024 bits may not even be enough. Rivest revised his key length estimates in 1990: he suggests 1628 bits for high security lasting until 2005, and 1884 bits for high security lasting until 2015. By contrast, Schneier suggests 2048 bits are required in order to protect against corporations and governments until 2015.

A number of public key cryptographic algorithms exist. Most are impractical to implement, and many generate a very large C for a given M or require enormous keys. Still others, while secure, are far too slow to be practical for several years. Because of this, many public-key systems are hybrid—a public key mechanism is used to transmit a symmetric session key, and then the session key is used for the actual messages. All of the algorithms have a problem in terms of key selection. A random number is simply not secure enough. The two large primes p and q must be chosen carefully—there are certain weak combinations that can be factored more easily (some of the weak keys can be tested for). But nonetheless, key selection is not a simple matter of randomly selecting 1024 bits for example. Consequently the key selection process must also be secure.

Of the practical algorithms in use under public scrutiny, the following may be suitable for utilization:
RSA
DSA
ElGamal

RSA

The RSA cryptosystem, named after Rivest, Shamir, and Adleman, is the most widely used public-key cryptosystem, and is a de facto standard in much of the world. The security of RSA is conjectured to depend on the difficulty of factoring large numbers that are the product of two primes (p and q). There are a number of restrictions on the generation of p and q. They should both be large, with a similar number of bits, yet not be close to one another (otherwise pq≈√pq). In addition, many authors have suggested that p and q should be strong primes. The RSA algorithm patent was issued in 1983 (U.S. Pat. No. 4,405,829).

DSA

DSA (Digital Signature Standard) is an algorithm designed as part of the Digital Signature Standard (DSS). As defined, it cannot be used for generalized encryption. In addition, compared to RSA, DSA is 10 to 40 times slower for signature verification. DSA explicitly uses the SHA-1 hashing algorithm (see definition in One-way Functions below). DSA key generation relies on finding two primes p and q such that q divides p−1. According to Schneier, a 1024-bit p value is required for long term DSA security. However the DSA standard does not permit values of p larger than 1024 bits (p must also be a multiple of 64 bits). The US Government owns the DSA algorithm and has at least one relevant patent (U.S. Pat. No. 5,231,688 granted in 1993).

ElGamal

The ElGamal scheme is used for both encryption and digital signatures. The security is based on the difficulty of calculating discrete logarithms in a finite field. Key selection involves the selection of a prime p, and two random numbers g and x such that both g and x are less than p. Then calculate y=gx mod p. The public key is y, g, and p. The private key is x.

Cryptographic Challenge-Response Protocols and Zero Knowledge Proofs

The general principle of a challenge-response protocol is to provide identity authentication adapted to a camera system. The simplest form of challenge-response takes the form of a secret password. A asks B for the secret password, and if B responds with the correct password, A declares B authentic. There are three main problems with this kind of simplistic protocol. Firstly, once B has given out the password, any observer C will know what the password is. Secondly, A must know the password in order to verify it. Thirdly, if C impersonates A, then B will give the password to C (thinking C was A), thus compromising B. Using a copyright text (such as a haiku) is a weaker alternative as we are assuming that anyone is able to copy the password (for example in a country where intellectual property is not respected). The idea of cryptographic challenge-response protocols is that one entity (the claimant) proves its identity to another (the verifier) by demonstrating knowledge of a secret known to be associated with that entity, without revealing the secret itself to the verifier during the protocol. In the generalized case of cryptographic challenge-response protocols, with some schemes the verifier knows the secret, while in others the secret is not even known by the verifier. Since the discussion of this embodiment specifically concerns Authentication, the actual cryptographic challenge-response protocols used for authentication are detailed in the appropriate sections. However the concept of Zero Knowledge Proofs will be discussed here. The Zero Knowledge Proof protocol, first described by Feige, Fiat and Shamir is extensively used in Smart Cards for the purpose of authentication. The protocol's effectiveness is based on the assumption that it is computationally infeasible to compute square roots modulo a large composite integer with unknown factorization. This is provably equivalent to the assumption that factoring large integers is difficult. It should be noted that there is no need for the claimant to have significant computing power. Smart cards implement this kind of authentication using only a few modular multiplications. The Zero Knowledge Proof protocol is described in U.S. Pat. No. 4,748,668.

One-Way Functions

A one-way function F operates on an input X, and returns F[X] such that X cannot be determined from F[X]. When there is no restriction on the format of X, and F[X] contains fewer bits than X, then collisions must exist. A collision is defined as two different X input values producing the same F[X] value—i.e. $X_1$ and $X_2$ exist such that $X_1 \neq X_2$ yet $F[X_1]=F[X_2]$. When X contains more bits than F[X], the input must be compressed in some way to create the output. In many cases, X is broken into blocks of a particular size, and compressed over a number of rounds, with the output of one round being the input to the next. The output of the hash function is the last output once X has been consumed. A pseudo-collision of the compression function CF is defined as two different initial values $V_1$ and $V_2$ and two inputs $X_1$ and $X_2$ (possibly identical) are given such that $CF(V_1, X_1)=CF(V_2, X_2)$. Note that the existence of a pseudo-collision does not mean that it is easy to compute an $X_2$ for a given $X_1$.

We are only interested in one-way functions that are fast to compute. In addition, we are only interested in deterministic one-way functions that are repeatable in different implementations. Consider an example F where F[X] is the time between calls to F. For a given F[X] X cannot be determined because X is not even used by F. However the output from F will be different for different implementations. This kind of F is therefore not of interest.

In the scope of the discussion of the implementation of the authentication chip of this embodiment, we are interested in the following forms of one-way functions:
Encryption using an unknown key
Random number sequences
Hash Functions
Message Authentication Codes Encryption Using an Unknown Key When a message is encrypted using an unknown key K, the encryption function E is effectively one-way. Without the key, it is computationally infeasible to obtain M from $E_K[M]$ without K.

An encryption function is only one-way for as long as the key remains hidden. An encryption algorithm does not create collisions, since E creates $E_K[M]$ such that it is possible to reconstruct M using function D. Consequently F[X] contains at least as many bits as X (no information is lost) if the one-way function F is E. Symmetric encryption algorithms (see above) have the advantage over Asymmetric algorithms for producing one-way functions based on encryption for the following reasons:
The key for a given strength encryption algorithm is shorter for a symmetric algorithm than an asymmetric algorithm
Symmetric algorithms are faster to compute and require less software/silicon The selection of a good key depends on the encryption algorithm chosen. Certain keys are not strong for particular encryption algorithms, so any key needs to be tested for strength. The more tests that need to be performed for key selection, the less likely the key will remain hidden.

Random Number Sequences

Consider a random number sequence $R_0, R_1, \ldots, R_i, R_{i+1}$. We define the one-way function F such that F[X] returns the $X^{th}$ random number in the random sequence. However we must ensure that F[X] is repeatable for a given X on different implementations. The random number sequence therefore cannot be truly random. Instead, it must be pseudo-random, with the generator making use of a specific seed.

There are a large number of issues concerned with defining good random number generators. Knuth, describes what makes a generator "good" (including statistical tests), and the general problems associated with constructing them. The majority of random number generators produce the $i^{th}$ random number from the $i-1^{th}$ state—the only way to determine the $i^{th}$ number is to iterate from the $0^{th}$ number to the $i^{th}$. If i is large, it may not be practical to wait for i iterations. However there is a type of random number generator that does allow random access. Blum, Blum and Shub define the ideal generator as follows: " . . . we would like a pseudo-random sequence generator to quickly produce, from short seeds, long sequences (of bits) that appear in every way to be generated by successive flips of a fair coin". They defined the $x^2$ mod n generator, more commonly referred to as the BBS generator. They showed that given certain assumptions upon which modern cryptography relies, a BBS generator passes extremely stringent statistical tests.

The BBS generator relies on selecting n which is a Blum integer (n=pq where p and q are large prime numbers, p≠q, p mod 4=3, and q mod 4=3). The initial state of the generator is given by $x_0$ where $x_0 = x^2$ mod n, and x is a random integer relatively prime to n. The $i^{th}$ pseudo-random bit is the least significant bit of $x_i$ where $x_i = x_{i-1}^2$ mod n. As an extra property, knowledge of p and q allows a direct calculation of the $i^{th}$ number in the sequence as follows: $x_i = x_0^y$ mod n, where y=$2^i$ mod ((p−1)(q−1))

Without knowledge of p and q, the generator must iterate (the security of calculation relies on the difficulty of factoring large numbers). When first defined, the primary problem with the BBS generator was the amount of work required for a single output bit. The algorithm was considered too slow for most applications. However the advent of Montgomery reduction arithmetic has given rise to more practical implementations. In addition, Vazirani and Vazirani have shown that depending on the size of n, more bits can safely be taken from $x_i$ without compromising the security of the generator. Assuming we only take 1 bit per $x_i$, N bits (and hence N iterations of the bit generator function) are needed in order to generate an N-bit random number. To the outside observer, given a particular set of bits, there is no way to determine the next bit other than a 50/50 probability. If the x, p and q are hidden, they act as a key, and it is computationally unfeasible to take an output bit stream and compute x, p, and q. It is also computationally unfeasible to determine the value of i used to generate a given set of pseudo-random bits. This last feature makes the generator one-way. Different values of i can produce identical bit sequences of a given length (e.g. 32 bits of random bits). Even if x, p and q are known, for a given F[i], i can only be derived as a set of possibilities, not as a certain value (of course if the domain of i is known, then the set of possibilities is reduced further). However, there are problems in selecting a good p and q, and a good seed x. In particular, Ritter describes a problem in selecting x. The nature of the problem is that a BBS generator does not create a single cycle of known length. Instead, it creates cycles of various lengths, including degenerate (zero-length) cycles. Thus a BBS generator cannot be initialized with a random state—it might be on a short cycle.

Hash Functions

Special one-way functions, known as Hash functions map arbitrary length messages to fixed-length hash values. Hash functions are referred to as H[M]. Since the input is arbitrary length, a hash function has a compression component in order to produce a fixed length output. Hash functions also have an obfuscation component in order to make it difficult to find collisions and to determine information about M from H[M]. Because collisions do exist, most applications require that the hash algorithm is preimage resistant, in that for a given $X_1$ it is difficult to find $X_2$ such that $H[X_1]=H[X_2]$. In addition, most applications also require the hash algorithm to be collision resistant (i.e. it should be hard to find two messages $X_1$ and $X_2$ such that $H[X_1]=H[X_2]$). It is an open problem whether a collision-resistant hash function, in the idealist sense, can exist at all. The primary application for hash functions is in the reduction of an input message into a digital "fingerprint" before the application of a digital signature algorithm. One problem of collisions with digital signatures can be seen in the following example.

A has a long message $M_1$ that says "I owe B $10,". A signs $H[M_1]$ using his private key. B, being greedy, then searches for a collision message $M_2$ where $H[M_2]=H[M_1]$ but where $M_2$ is favorable to B, for example "I owe B $1 million". Clearly it is in A's interest to ensure that it is difficult to find such an $M_2$.

Examples of collision resistant one-way hash functions are SHA-1, MD5 and RIPEMD-160, all derived from MD4.

MD4

Ron Rivest introduced MD4 in 1990. It is mentioned here because all other one-way hash functions are derived in some way from MD4. MD4 is now considered completely broken in that collisions can be calculated instead of searched for. In the example above, B could trivially generate a substitute message $M_2$ with the same hash value as the original message $M_1$.

MD5

Ron Rivest introduced MD5 in 1991 as a more secure MD4. Like MD4, MD5 produces a 128-bit hash value. Dobbertin describes the status of MD5 after recent attacks. He describes how pseudo-collisions have been found in MD5, indicating a weakness in the compression function, and more recently, collisions have been found. This means that MD5 should not be used for compression in digital signature schemes where the existence of collisions may have dire consequences. However MD5 can still be used as a one-way function. In addition, the HMAC-MD5 construct is not affected by these recent attacks.

SHA-1

SHA-1 is very similar to MD5, but has a 160-bit hash value (MD5 only has 128 bits of hash value). SHA-1 was designed and introduced by the NIST and NSA for use in the Digital Signature Standard (DSS). The original published description was called SHA, but very soon afterwards, was revised to become SHA-1, supposedly to correct a security flaw in SHA (although the NSA has not released the mathematical reasoning behind the change). There are no known cryptographic attacks against SHA-1. It is also more resistant to brute-force attacks than MD4 or MD5 simply because of the longer hash result. The US Government owns the SHA-1 and DSA algorithms (a digital signature authentication algorithm defined as part of DSS) and has at least one relevant patent (U.S. Pat. No. 5,231,688 granted in 1993).

RIPEMD-160

RIPEMD-160 is a hash function derived from its predecessor RIPEMD (developed for the European Community's RIPE project in 1992). As its name suggests, RIPEMD-160 produces a 160-bit hash result. Tuned for software implementations on 32-bit architectures, RIPEMD-160 is intended to provide a high level of security for 10 years or more. Although there have been no successful attacks on RIPEMD-160, it is comparatively new and has not been extensively cryptanalyzed. The original RIPEMD algorithm was specifically designed to resist known cryptographic attacks on MD4. The recent attacks on MD5 showed similar weaknesses in the RIPEMD 128-bit hash function. Although the attacks showed only theoretical weaknesses, Dobbertin, Preneel and Bosselaers further strengthened RIPEMD into a new algorithm RIPEMD-160.

Message Authentication Codes

The problem of message authentication can be summed up as follows:

How can A be sure that a message supposedly from B is in fact from B?

Message authentication is different from entity authentication. With entity authentication, one entity (the claimant) proves its identity to another (the verifier). With message authentication, we are concerned with making sure that a given message is from who we think it is from i.e. it has not been tampered en route from the source to its destination. A one-way hash function is not sufficient protection for a message. Hash functions such as MD5 rely on generating a hash value that is representative of the original input, and the original input cannot be derived from the hash value. A simple attack by E, who is in-between A and B, is to intercept the message from B, and substitute his own. Even if A also sends a hash of the original message, E can simply substitute the hash of his new message. Using a one-way hash function alone, A has no way of knowing that B's message has been changed. One solution to the problem of message authentication is the Message Authentication Code, or MAC. When B sends message M, it also sends MAC[M] so that the receiver will know that M is actually from B. For this to be possible, only B must be able to produce a MAC of M, and in addition, A should be able to verify M against MAC[M]. Notice that this is different from encryption of M-MACs are useful when M does not have to be secret. The simplest method of constructing a MAC from a hash function is to encrypt the hash value with a symmetric algorithm:

Hash the input message H[M]
Encrypt the hash $E_K[H[M]]$

This is more secure than first encrypting the message and then hashing the encrypted message. Any symmetric or asymmetric cryptographic function can be used. However, there are advantages to using a key-dependant one-way hash function instead of techniques that use encryption (such as that shown above):

Speed, because one-way hash functions in general work much faster than encryption;
Message size, because $E_K[H[M]]$ is at least the same size as M, while H[M] is a fixed size (usually considerably smaller than M);
Hardware/software requirements—keyed one-way hash functions are typically far less complexity than their encryption-based counterparts; and
One-way hash function implementations are not considered to be encryption or decryption devices and therefore are not subject to US export controls.

It should be noted that hash functions were never originally designed to contain a key or to support message authentication. As a result, some ad hoc methods of using hash functions to perform message authentication, including various functions that concatenate messages with secret prefixes, suffixes, or both have been proposed. Most of these ad hoc methods have been successfully attacked by sophisticated means. Additional MACs have been suggested based on XOR schemes and Toeplitz matricies (including the special case of LFSR-based constructions).

HMAC

The HMAC construction in particular is gaining acceptance as a solution for Internet message authentication security protocols. The HMAC construction acts as a wrapper, using the underlying hash function in a black-box way. Replacement of the hash function is straightforward if desired due to security or performance reasons. However, the major advantage of the HMAC construct is that it can be proven secure provided the underlying hash function has some reasonable cryptographic strengths—that is, HMAC's strengths are directly connected to the strength of the hash function. Since the HMAC construct is a wrapper, any iterative hash function can be used in an HMAC. Examples include HMAC-MD5, HMAC-SHA1, HMAC-RIPEMD160 etc. Given the following definitions:

H=the hash function (e.g. MD5 or SHA-1)
n=number of bits output from H (e.g. 160 for SHA-1, 128 bits for MD5)
M=the data to which the MAC function is to be applied
K=the secret key shared by the two parties
ipad=0x36 repeated 64 times
opad=0x5C repeated 64 times The HMAC algorithm is as follows:
1. Extend K to 64 bytes by appending 0x00 bytes to the end of K
2. XOR the 64 byte string created in (1) with ipad
3. Append data stream M to the 64 byte string created in (2)
4. Apply H to the stream generated in (3)
5. XOR the 64 byte string created in (1) with opad
6. Append the H result from (4) to the 64 byte string resulting from (5)
7. Apply H to the output of (6) and output the result
Thus:

$$HMAC[M]=H[(K\oplus opad)|H[(K\oplus ipad)|M]]$$

The recommended key length is at least n bits, although it should not be longer than 64 bytes (the length of the hashing block). A key longer than n bits does not add to the security of the function. HMAC optionally allows truncation of the final output e.g. truncation to 128 bits from 160 bits. The HMAC designers' Request for Comments was issued in 1997, one year after the algorithm was first introduced. The designers claimed that the strongest known attack against HMAC is based on the frequency of collisions for the hash function H and is totally impractical for minimally reasonable hash functions. More recently, HMAC protocols with replay prevention components have been defined in order to prevent the capture and replay of any M, HMAC[M] combination within a given time period.

Random Numbers and Time Varying Messages

The use of a random number generator as a one-way function has already been examined. However, random number generator theory is very much intertwined with cryptography, security, and authentication. There are a large number of issues concerned with defining good random number generators. Knuth, describes what makes a generator good (including statistical tests), and the general problems associated with constructing them. One of the uses for random numbers is to ensure that messages vary over time. Consider a system where A encrypts commands and sends them to B. If the encryption algorithm produces the same output for a given input, an attacker could simply record the messages and play them back to fool B. There is no need for the attacker to crack the encryption mechanism other than to know which message to play to B (while pretending to be A). Consequently messages often include a random number and a time stamp to ensure that the message (and hence its encrypted counterpart) varies each time. Random number generators are also often used to generate keys. It is therefore best to say at the moment, that all generators are insecure for this purpose. For example, the Berlekamp-Massey algorithm, is a classic attack on an LFSR random number generator. If the LFSR is of length n, then only 2n bits of the sequence suffice to determine the LFSR, compromising the key generator. If, however, the only role of the random number generator is to make sure that messages vary over time, the security of the generator and seed is not as important as it is for session key generation. If however, the random number seed generator is compromised, and an attacker is able to calculate future "random" numbers, it can leave some protocols open to attack. Any new protocol should be examined with respect to this situation. The actual type of random number generator required will depend upon the implementation and the purposes for which the generator is used. Generators include Blum, Blum, and Shub, stream ciphers such as RC4 by Ron Rivest, hash functions such as SHA-1 and RIPEMD-160, and traditional generators such as LFSRs (Linear Feedback Shift Registers) and their more recent counterpart FCSRs (Feedback with Carry Shift Registers).

Attacks

This section describes the various types of attacks that can be undertaken to break an authentication cryptosystem such as the authentication chip. The attacks are grouped into physical and logical attacks. Physical attacks describe methods for breaking a physical implementation of a cryptosystem (for example, breaking open a chip to retrieve the key), while logical attacks involve attacks on the cryptosystem that are implementation independent. Logical types of attack work on the protocols or algorithms, and attempt to do one of three things:

Bypass the authentication process altogether

Obtain the secret key by force or deduction, so that any question can be answered Find enough about the nature of the authenticating questions and answers in order to, without the key, give the right answer to each question.

The attack styles and the forms they take are detailed below. Regardless of the algorithms and protocol used by a security chip, the circuitry of the authentication part of the chip can come under physical attack. Physical attack comes in four main ways, although the form of the attack can vary:

Bypassing the Authentication Chip altogether

Physical examination of chip while in operation (destructive and non-destructive)

Physical decomposition of chip

Physical alteration of chip

The attack styles and the forms they take are detailed below. This section does not suggest solutions to these attacks. It merely describes each attack type. The examination is restricted to the context of an Authentication chip (as opposed to some other kind of system, such as Internet authentication) attached to some System.

Logical Attacks

These attacks are those which do not depend on the physical implementation of the cryptosystem. They work against the protocols and the security of the algorithms and random number generators.

Ciphertext Only Attack

This is where an attacker has one or more encrypted messages, all encrypted using the same algorithm. The aim of the attacker is to obtain the plaintext messages from the encrypted messages. Ideally, the key can be recovered so that all messages in the future can also be recovered.

Known Plaintext Attack

This is where an attacker has both the plaintext and the encrypted form of the plaintext. In the case of an Authentication Chip, a known-plaintext attack is one where the attacker can see the data flow between the System and the Authentication Chip. The inputs and outputs are observed (not chosen by the attacker), and can be analyzed for weaknesses (such as birthday attacks or by a search for differentially interesting input/output pairs). A known plaintext attack is a weaker type of attack than the chosen plaintext attack, since the attacker can only observe the data flow. A known plaintext attack can be carried out by connecting a logic analyzer to the connection between the System and the Authentication Chip.

Chosen Plaintext Attacks

A chosen plaintext attack describes one where a cryptanalyst has the ability to send any chosen message to the cryptosystem, and observe the response. If the cryptanalyst knows the algorithm, there may be a relationship between inputs and outputs that can be exploited by feeding a specific output to the input of another function. On a system using an embedded Authentication Chip, it is generally very difficult to prevent chosen plaintext attacks since the cryptanalyst can logically pretend he/she is the System, and thus send any chosen bit-pattern streams to the Authentication Chip.

Adaptive Chosen Plaintext Attacks

This type of attack is similar to the chosen plaintext attacks except that the attacker has the added ability to modify subsequent chosen plaintexts based upon the results of previous experiments. This is certainly the case with any System/Authentication Chip scenario described when utilized for consumables such as photocopiers and toner cartridges, especially since both Systems and Consumables are made available to the public.

Brute Force Attack

A guaranteed way to break any key-based cryptosystem algorithm is simply to try every key.

Eventually the right one will be found. This is known as a Brute Force Attack. However, the more key possibilities there are, the more keys must be tried, and hence the longer it takes (on average) to find the right one. If there are N keys, it will take a maximum of N tries. If the key is N bits long, it will take a maximum of $2^N$ tries, with a 50% chance of finding the key after only half the attempts ($2^{N-1}$). The longer N becomes, the longer it will take to find the key, and hence the more secure the key is. Of course, an attack may guess the key on the first try, but this is more unlikely the longer the key is. Consider a key length of 56 bits. In the worst case, all 256 tests ($7.2 \times 10^{16}$ tests) must be made to find the key. In 1977, Diffie and Hellman described a specialized machine for cracking DES, consisting of one million processors, each capable of running one million tests per second. Such a machine would take 20 hours to break any DES code. Consider a key length of 128 bits. In the worst case, all $2^{128}$ tests ($3.4 \times 10^{38}$ tests) must be made to find the key. This would take ten billion years on an array of a trillion processors each running 1 billion tests per second. With a long enough key length, a Brute Force Attack takes too long to be worth the attacker's efforts.

Guessing Attack

This type of attack is where an attacker attempts to simply "guess" the key. As an attack it is identical to the Brute force attack, where the odds of success depend on the length of the key.

Quantum Computer Attack

To break an n-bit key, a quantum computer (NMR, Optical, or Caged Atom) containing n qubits embedded in an appropriate algorithm must be built. The quantum computer effectively exists in $2^n$ simultaneous coherent states. The trick is to extract the right coherent state without causing any decoherence. To date this has been achieved with a 2 qubit system (which exists in 4 coherent states). It is thought possible to extend this to 6 qubits (with 64 simultaneous coherent states) within a few years.

Unfortunately, every additional qubit halves the relative strength of the signal representing the key. This rapidly becomes a serious impediment to key retrieval, especially with the long keys used in cryptographically secure systems. As a result, attacks on a cryptographically secure key (e.g. 160 bits) using a Quantum Computer are likely not to be feasible and it is extremely unlikely that quantum computers will have achieved more than 50 or so qubits within the commercial lifetime of the Authentication Chips. Even using a 50 qubit quantum computer, $2^{110}$ tests are required to crack a 160 bit key.

Purposeful Error Attack

With certain algorithms, attackers can gather valuable information from the results of a bad input. This can range from the error message text to the time taken for the error to be generated. A simple example is that of a userid/password scheme. If the error message usually says "Bad userid", then when an attacker gets a message saying "Bad password" instead, then they know that the userid is correct. If the message always says "Bad userid/password" then much less information is given to the attacker. A more complex example is that of the recent published method of cracking encryption codes from secure web sites. The attack involves sending particular messages to a server and observing the error message responses. The responses give enough information to learn the keys—even the lack of a response gives some information. An example of algorithmic time can be seen with an algorithm that returns an error as soon as an erroneous bit is detected in the input message. Depending on hardware implementation, it may be a simple method for the attacker to time the response and alter each bit one by one depending on the time taken for the error response, and thus obtain the key. Certainly in a chip implementation the time taken can be observed with far greater accuracy than over the Internet.

Birthday Attack

This attack is named after the famous "birthday paradox" (which is not actually a paradox at all). The odds of one person sharing a birthday with another, is 1 in 365 (not counting leap years). Therefore there must be 183 people in a room for the odds to be more than 50% that one of them shares your birthday. However, there only needs to be 23 people in a room for there to be more than a 50% chance that any two share a birthday. This is because 23 people yields 253 different pairs. Birthday attacks are common attacks against hashing algorithms, especially those algorithms that combine hashing with digital signatures. If a message has been generated and already signed, an attacker must search for a collision message that hashes to the same value (analogous to finding one person who shares your birthday). However, if the attacker can generate the message, the Birthday Attack comes into play. The attacker searches for two messages that share the same hash value (analogous to any two people sharing a birthday), only one message is acceptable to the person signing it, and the other is beneficial for the attacker.

Once the person has signed the original message the attacker simply claims now that the person signed the alternative message—mathematically there is no way to tell which message was the original, since they both hash to the same value. Assuming a Brute Force Attack is the only way to determine a match, the weakening of an n-bit key by the birthday attack is $2^{n/2}$. A key length of 128 bits that is susceptible to the birthday attack has an effective length of only 64 bits.

Chaining Attack

These are attacks made against the chaining nature of hash functions. They focus on the compression function of a hash function. The idea is based on the fact that a hash function generally takes arbitrary length input and produces a constant length output by processing the input n bits at a time. The output from one block is used as the chaining variable set into the next block. Rather than finding a collision against an entire input, the idea is that given an input chaining variable set, to find a substitute block that will result in the same output chaining variables as the proper message. The number of choices for a particular block is based on the length of the block. If the chaining variable is c bits, the hashing function behaves like a random mapping, and the block length is b bits, the number of such b-bit blocks is approximately 2b/2c. The challenge for finding a substitution block is that such blocks are a sparse subset of all possible blocks. For SHA-1, the number of 512 bit blocks is approximately $2^{512}/2^{160}$, or $2^{352}$. The chance of finding a block by brute force search is about 1 in 2160.

Substitution with a Complete Lookup Table

If the number of potential messages sent to the chip is small, then there is no need for a clone manufacturer to crack the key. Instead, the clone manufacturer could incorporate a ROM in their chip that had a record of all of the responses from a genuine chip to the codes sent by the system. The larger the key, and the larger the response, the more space is required for such a lookup table.

Substitution with a Sparse Lookup Table

If the messages sent to the chip are somehow predictable, rather than effectively random, then the clone manufacturer need not provide a complete lookup table. For example:

If the message is simply a serial number, the clone manufacturer need simply provide a lookup table that contains values for past and predicted future serial numbers. There are unlikely to be more than $10^9$ of these.

If the test code is simply the date, then the clone manufacturer can produce a lookup table using the date as the address.

If the test code is a pseudo-random number using either the serial number or the date as a seed, then the clone manufacturer just needs to crack the pseudo-random number generator in the System. This is probably not difficult, as they have access to the object code of the System. The clone manufacturer would then produce a content addressable memory (or other sparse array lookup) using these codes to access stored authentication codes.

Differential Cryptanalysis

Differential cryptanalysis describes an attack where pairs of input streams are generated with known differences, and the differences in the encoded streams are analyzed. Existing differential attacks are heavily dependent on the structure of S boxes, as used in DES and other similar algorithms. Although other algorithms such as HMAC-SHA1 have no S boxes, an attacker can undertake a differential-like attack by undertaking statistical analysis of:

Minimal-difference inputs, and their corresponding outputs

Minimal-difference outputs, and their corresponding inputs

Most algorithms were strengthened against differential cryptanalysis once the process was described. This is covered in the specific sections devoted to each cryptographic algorithm. However some recent algorithms developed in secret have been broken because the developers had not considered certain styles of differential attacks and did not subject their algorithms to public scrutiny.

Message Substitution Attacks

In certain protocols, a man-in-the-middle can substitute part or all of a message. This is where a real Authentication Chip is plugged into a reusable clone chip within the consumable. The clone chip intercepts all messages between the System and the Authentication Chip, and can perform a number of substitution attacks. Consider a message containing a header followed by content. An attacker may not be able to generate a valid header, but may be able to substitute their own content, especially if the valid response is something along the lines of "Yes, I received your message". Even if the return message is "Yes, I received the following message . . . ", the attacker may be able to substitute the original message before sending the acknowledgement back to the original sender. Message Authentication Codes were developed to combat most message substitution attacks.

Reverse Engineering the Key Generator

If a pseudo-random number generator is used to generate keys, there is the potential for a clone manufacture to obtain the generator program or to deduce the random seed used. This was the way in which the Netscape security program was initially broken.

Bypassing Authentication Altogether

It may be that there are problems in the authentication protocols that can allow a bypass of the authentication process altogether. With these kinds of attacks the key is completely irrelevant, and the attacker has no need to recover it or deduce it. Consider an example of a system that Authenticates at power-up, but does not authenticate at any other time. A reusable consumable with a clone Authentication Chip may make use of a real Authentication Chip. The clone authentication chip uses the real chip for the authentication call, and then simulates the real Authentication Chip's state data after that. Another example of bypassing authentication is if the System authenticates only after the consumable has been used. A clone Authentication Chip can accomplish a simple authentication bypass by simulating a loss of connection after the use of the consumable but before the authentication protocol has completed (or even started). One infamous attack known as the "Kentucky Fried Chip" hack involved replacing a microcontroller chip for a satellite TV system. When a subscriber stopped paying the subscription fee, the system would send out a "disable" message. However the new microcontroller would simply detect this message and not pass it on to the consumer's satellite TV system.

Garrote/Bribe Attack

If people know the key, there is the possibility that they could tell someone else. The telling may be due to coercion (bribe, garrote etc), revenge (e.g. a disgruntled employee), or simply for principle. These attacks are usually cheaper and easier than other efforts at deducing the key. As an example, a number of people claiming to be involved with the development of the Divx standard have recently (May/June 1998) been making noises on a variety of DVD newsgroups to the effect they would like to help develop Divx specific cracking devices—out of principle.

Physical Attacks

The following attacks assume implementation of an authentication mechanism in a silicon chip that the attacker has physical access to. The first attack, Reading ROM, describes an attack when keys are stored in ROM, while the remaining attacks assume that a secret key is stored in Flash memory.

Reading ROM

If a key is stored in ROM it can be read directly. A ROM can thus be safely used to hold a public key (for use in asymmetric cryptography), but not to hold a private key. In symmetric cryptography, a ROM is completely insecure. Using a copyright text (such as a haiku) as the key is not sufficient, because we are assuming that the cloning of the chip is occurring in a country where intellectual property is not respected.

Reverse Engineering of Chip

Reverse engineering of the chip is where an attacker opens the chip and analyzes the circuitry. Once the circuitry has been analyzed the inner workings of the chip's algorithm can be recovered. Lucent Technologies have developed an active method known as TOBIC (Two photon OBIC, where OBIC stands for Optical Beam Induced Current), to image circuits. Developed primarily for static RAM analysis, the process involves removing any back materials, polishing the back surface to a mirror finish, and then focusing light on the surface. The excitation wavelength is specifically chosen not to induce a current in the IC. A Kerckhoffs in the nineteenth century made a fundamental assumption about cryptanalysis: if the algorithm's inner workings are the sole secret of the scheme, the scheme is as good as broken. He stipulated that the secrecy must reside entirely in the key. As a result, the best way to protect against reverse engineering of the chip is to make the inner workings irrelevant.

Usurping the Authentication Process

It must be assumed that any clone manufacturer has access to both the System and consumable designs. If the same channel is used for communication between the System and a trusted System Authentication Chip, and a non-trusted consumable Authentication Chip, it may be possible for the non-trusted chip to interrogate a trusted Authentication Chip in order to obtain the "correct answer". If this is so, a clone manufacturer would not have to determine the key. They would only have to trick the System into using the responses from the System Authentication Chip. The alternative method of usurping the authentication process follows the same method as the logical attack "Bypassing the Authentication Process", involving simulated loss of contact with the System whenever authentication processes take place, simulating power-down etc.

Modification of System

This kind of attack is where the System itself is modified to accept clone consumables. The attack may be a change of System ROM, a rewiring of the consumable, or, taken to the extreme case, a completely clone System. This kind of attack requires each individual System to be modified, and would most likely require the owner's consent. There would usually have to be a clear advantage for the consumer to undertake such a modification, since it would typically void warranty and would most likely be costly. An example of such a modification with a clear advantage to the consumer is a software patch to change fixed-region DVD players into region-free DVD players.

Direct Viewing of Chip Operation by Conventional Probing

If chip operation could be directly viewed using an STM or an electron beam, the keys could be recorded as they are read from the internal non-volatile memory and loaded into work registers. These forms of conventional probing require direct access to the top or front sides of the IC while it is powered.

Direct Viewing of the Non-Volatile Memory

If the chip were sliced so that the floating gates of the Flash memory were exposed, without discharging them, then the key could probably be viewed directly using an STM or SKM (Scanning Kelvin Microscope). However, slicing the chip to this level without discharging the gates is probably impossible. Using wet etching, plasma etching, ion milling (focused ion beam etching), or chemical mechanical polishing will almost certainly discharge the small charges present on the floating gates.

Viewing the Light Bursts Caused by State Changes

Whenever a gate changes state, a small amount of infrared energy is emitted. Since silicon is transparent to infrared, these changes can be observed by looking at the circuitry from the underside of a chip. While the emission process is weak, it is bright enough to be detected by highly sensitive equipment developed for use in astronomy. The technique, developed by IBM, is called PICA (Picosecond Imaging Circuit Analyzer). If the state of a register is known at time t, then watching that register change over time will reveal the exact value at time t+n, and if the data is part of the key, then that part is compromised.

Monitoring EMI

Whenever electronic circuitry operates, faint electromagnetic signals are given off. Relatively inexpensive equipment (a few thousand dollars) can monitor these signals. This could give enough information to allow an attacker to deduce the keys.

Viewing $I_{dd}$ Fluctuations

Even if keys cannot be viewed, there is a fluctuation in current whenever registers change state. If there is a high enough signal to noise ratio, an attacker can monitor the difference in $I_{dd}$ that may occur when programming over either a high or a low bit. The change in $I_{dd}$ can reveal information about the key. Attacks such as these have already been used to break smart cards.

Differential Fault Analysis

This attack assumes introduction of a bit error by ionization, microwave radiation, or environmental stress. In most cases such an error is more likely to adversely affect the Chip (eg cause the program code to crash) rather than cause beneficial changes which would reveal the key. Targeted faults such as ROM overwrite, gate destruction etc are far more likely to produce useful results.

Clock Glitch Attacks

Chips are typically designed to properly operate within a certain clock speed range. Some attackers attempt to introduce faults in logic by running the chip at extremely high clock speeds or introduce a clock glitch at a particular time for a particular duration. The idea is to create race conditions where the circuitry does not function properly. An example could be an AND gate that (because of race conditions) gates through $Input_1$ all the time instead of the AND of $Input_1$ and $Input_2$. If an attacker knows the internal structure of the chip, they can attempt to introduce race conditions at the correct moment in the algorithm execution, thereby revealing information about the key (or in the worst case, the key itself).

Power Supply Attacks

Instead of creating a glitch in the clock signal, attackers can also produce glitches in the power supply where the power is increased or decreased to be outside the working operating voltage range. The net effect is the same as a clock glitch—introduction of error in the execution of a particular instruction. The idea is to stop the CPU from XORing the key, or from shifting the data one bit-position etc. Specific instructions are targeted so that information about the key is revealed.

Overwriting ROM

Single bits in a ROM can be overwritten using a laser cutter microscope, to either 1 or 0 depending on the sense of the logic. With a given opcode/operand set, it may be a simple matter for an attacker to change a conditional jump to a non-conditional jump, or perhaps change the destination of a register transfer. If the target instruction is chosen carefully, it may result in the key being revealed.

Modifying EEPROM/Flash

EEPROM/Flash attacks are similar to ROM attacks except that the laser cutter microscope technique can be used to both set and reset individual bits. This gives much greater scope in terms of modification of algorithms.

Gate Destruction

Anderson and Kuhn described the rump session of the 1997 workshop on Fast Software Encryption, where Biham and Shamir presented an attack on DES. The attack was to use a laser cutter to destroy an individual gate in the hardware implementation of a known block cipher (DES). The net effect of the attack was to force a particular bit of a register to be "stuck". Biham and Shamir described the effect of forcing a particular register to be affected in this way—the least significant bit of the output from the round function is set to 0. Comparing the 6 least significant bits of the left half and the right half can recover several bits of the key. Damaging a number of chips in this way can reveal enough information about the key to make complete key recovery easy. An encryption chip modified in this way will have the property that encryption and decryption will no longer be inverses.

Overwrite Attacks

Instead of trying to read the Flash memory, an attacker may simply set a single bit by use of a laser cutter microscope. Although the attacker doesn't know the previous value, they know the new value. If the chip still works, the bit's original state must be the same as the new state. If the chip doesn't work any longer, the bit's original state must be the logical NOT of the current state. An attacker can perform this attack on each bit of the key and obtain the n-bit key using at most n chips (if the new bit matched the old bit, a new chip is not required for determining the next bit).

Test Circuitry Attack

Most chips contain test circuitry specifically designed to check for manufacturing defects. This includes BIST (Built In Self Test) and scan paths. Quite often the scan paths and test circuitry includes access and readout mechanisms for all the embedded latches. In some cases the test circuitry could potentially be used to give information about the contents of particular registers. Test circuitry is often disabled once the chip has passed all manufacturing tests, in some cases by blowing a specific connection within the chip. A determined attacker, however, can reconnect the test circuitry and hence enable it.

Memory Remanence

Values remain in RAM long after the power has been removed, although they do not remain long enough to be considered non-volatile. An attacker can remove power once sensitive information has been moved into RAM (for example working registers), and then attempt to read the value from RAM. This attack is most useful against security systems that have regular RAM chips. A classic example is where a security system was designed with an automatic power-shut-off that is triggered when the computer case is opened. The attacker was able to simply open the case, remove the RAM chips, and retrieve the key because of memory remanence.

Chip Theft Attack

If there are a number of stages in the lifetime of an Authentication Chip, each of these stages must be examined in terms of ramifications for security should chips be stolen. For example, if information is programmed into the chip in stages, theft of a chip between stages may allow an attacker to have access to key information or reduced efforts for attack. Similarly, if a chip is stolen directly after manufacture but before programming, does it give an attacker any logical or physical advantage?

Requirements

Existing solutions to the problem of authenticating consumables have typically relied on physical patents on packaging. However this does not stop home refill operations or clone manufacture in countries with weak industrial property protection. Consequently a much higher level of protection is required. The authentication mechanism is therefore built into an Authentication chip that allows a system to authenticate a consumable securely and easily. Limiting ourselves to the system authenticating consumables (we don't consider the consumable authenticating the system), two levels of protection can be considered:

Presence Only Authentication—This is where only the presence of an Authentication Chip is tested. The Authentication Chip can be reused in another consumable without being reprogrammed.

Consumable Lifetime Authentication—This is where not only is the presence of the Authentication Chip tested for, but also the Authentication chip must only last the lifetime of the consumable. For the chip to be reused it must be completely erased and reprogrammed.

The two levels of protection address different requirements. We are primarily concerned with Consumable Lifetime Authentication in order to prevent cloned versions of high volume consumables. In this case, each chip should hold secure state information about the consumable being authenticated. It should be noted that a Consumable Lifetime Authentication Chip could be used in any situation requiring a Presence Only Authentication Chip. The requirements for authentication, data storage integrity and manufacture should be considered separately. The following sections summarize requirements of each.

Authentication

The authentication requirements for both Presence Only Authentication and Consumable Lifetime Authentication are restricted to case of a system authenticating a consumable. For Presence Only Authentication, we must be assured that an Authentication Chip is physically present. For Consumable Lifetime Authentication we also need to be assured that state data actually came from the Authentication Chip, and that it has not been altered en route. These issues cannot be separated—data that has been altered has a new source, and if the source cannot be determined, the question of alteration cannot be settled. It is not enough to provide an authentication method that is secret, relying on a home-brew security method that has not been scrutinized by security experts. The primary requirement therefore is to provide authentication by means that have withstood the scrutiny of experts. The authentication scheme used by the Authentication chip should be resistant to defeat by logical means. Logical types of attack are extensive, and attempt to do one of three things:

Bypass the authentication process altogether

Obtain the secret key by force or deduction, so that any question can be answered Find enough about the nature of the authenticating questions and answers in order to, without the key, give the right answer to each question.

Data Storage Integrity

Although Authentication protocols take care of ensuring data integrity in communicated messages, data storage integrity is also required. Two kinds of data must be stored within the Authentication Chip:

Authentication data, such as secret keys

Consumable state data, such as serial numbers, and media remaining etc.

The access requirements of these two data types differ greatly. The Authentication chip therefore requires a storage/access control mechanism that allows for the integrity requirements of each type.

Authentication Data

Authentication data must remain confidential. It needs to be stored in the chip during a manufacturing/programming stage of the chip's life, but from then on must not be permitted to leave the chip. It must be resistant to being read from non-volatile memory. The authentication scheme is responsible for ensuring the key cannot be obtained by deduction, and the manufacturing process is responsible for ensuring that the key cannot be obtained by physical means. The size of the authentication data memory area must be large enough to hold the necessary keys and secret information as mandated by the authentication protocols.

Consumable State Data

Each Authentication chip needs to be able to also store 256 bits (32 bytes) of consumable state data. Consumable state data can be divided into the following types. Depending on the application, there will be different numbers of each of these types of data items. A maximum number of 32 bits for a single data item is to be considered.

Read Only

ReadWrite

Decrement Only

Read Only data needs to be stored in the chip during a manufacturing/programming stage of the chip's life, but from then on should not be allowed to change. Examples of Read Only data items are consumable batch numbers and serial numbers.

ReadWrite data is changeable state information, for example, the last time the particular consumable was used. ReadWrite data items can be read and written an unlimited number of times during the lifetime of the consumable. They can be used to store any state information about the consumable. The only requirement for this data is that it needs to be kept in non-volatile memory. Since an attacker can obtain access to a system (which can write to ReadWrite data), any attacker can potentially change data fields of this type. This data type should not be used for secret information, and must be considered insecure.

Decrement Only data is used to count down the availability of consumable resources. A photocopier's toner cartridge, for example, may store the amount of toner remaining as a Decrement Only data item. An ink cartridge for a color printer may store the amount of each ink color as a Decrement Only data item, requiring 3 (one for each of Cyan, Magenta, and Yellow), or even as many as 5 or 6 Decrement Only data items. The requirement for this kind of data item is that once programmed with an initial value at the manufacturing/programming stage, it can only reduce in value. Once it reaches the minimum value, it cannot decrement any further. The Decrement Only data item is only required by Consumable Lifetime Authentication.

Manufacture

The Authentication chip ideally must have a low manufacturing cost in order to be included as the authentication mechanism for low cost consumables. The Authentication chip should use a standard manufacturing process, such as Flash. This is necessary to:

Allow a great range of manufacturing location options

Use well-defined and well-behaved technology

Reduce cost

Regardless of the authentication scheme used, the circuitry of the authentication part of the chip must be resistant to physical attack. Physical attack comes in four main ways, although the form of the attack can vary:

Bypassing the Authentication Chip altogether

Physical examination of chip while in operation (destructive and non-destructive)

Physical decomposition of chip

Physical alteration of chip

Ideally, the chip should be exportable from the U.S., so it should not be possible to use an Authentication chip as a secure encryption device. This is low priority requirement since there are many companies in other countries able to manufacture the Authentication chips. In any case, the export restrictions from the U.S. may change.

Authentication

Existing solutions to the problem of authenticating consumables have typically relied on physical patents on packaging. However this does not stop home refill operations or clone manufacture in countries with weak industrial property protection. Consequently a much higher level of protection is required. It is not enough to provide an authentication method that is secret, relying on a home-brew security method that has not been scrutinized by security experts. Security systems such as Netscape's original proprietary system and the GSM Fraud Prevention Network used by cellular phones are examples where design secrecy caused the vulnerability of the security. Both security systems were broken by conventional means that would have been detected if the companies had followed an open design process. The solution is to provide authentication by means that have withstood the scrutiny of experts. A number of protocols that can be used for consumables authentication. We only use security methods that are publicly described, using known behaviors in this new way. For all protocols, the security of the scheme relies on a secret key, not a secret algorithm. All the protocols rely on a time-variant challenge (i.e. the challenge is different each time), where the response depends on the challenge and the secret. The challenge involves a random number so that any observer will not be able to gather useful information about a subsequent identification. Two protocols are presented for each of Presence Only Authentication and Consumable Lifetime Authentication. Although the protocols differ in the number of Authentication Chips required for the authentication process, in all cases the System authenticates the consumable. Certain protocols will work with either one or two chips, while other protocols only work with two chips. Whether one chip or two Authentication Chips are used the System is still responsible for making the authentication decision.

Single Chip Authentication

When only one Authentication chip is used for the authentication protocol, a single chip 10 (referred to as ChipA) is responsible for proving to a system 11 (referred to as System) that it is authentic. At the start of the protocol, System 11 is unsure of ChipA's authenticity. System 11 undertakes a challenge-response protocol with ChipA 10, and thus determines ChipA's authenticity. In all protocols the authenticity of the consumable 12 is directly based on the authenticity of the chip, i.e. if ChipA 10 is considered authentic, then the consumable 12, in which chip 10 is placed, is considered authentic. The data flow can be seen in FIG. 1, and involves a challenge 13 issued from the system, and a response 14 returned by the chip 10.

In single chip authentication protocols, System 11 can be software, hardware or a combination of both. It is important to note that System 11 is considered insecure—it can be easily reverse engineered by an attacker, either by examining the ROM or by examining circuitry. System is not specially engineered to be secure in itself.

Double Chip Authentication

In other protocols, two Authentication Chips are required. A single chip 20 (referred to as ChipA) is responsible for proving to a system 21 (referred to as System) that it is authentic.

ChipA 20 is associated with the consumable 22. As part of the authentication process, System 21 makes use of a trusted Authentication Chip 23 (referred to as ChipT).

Figure 2:
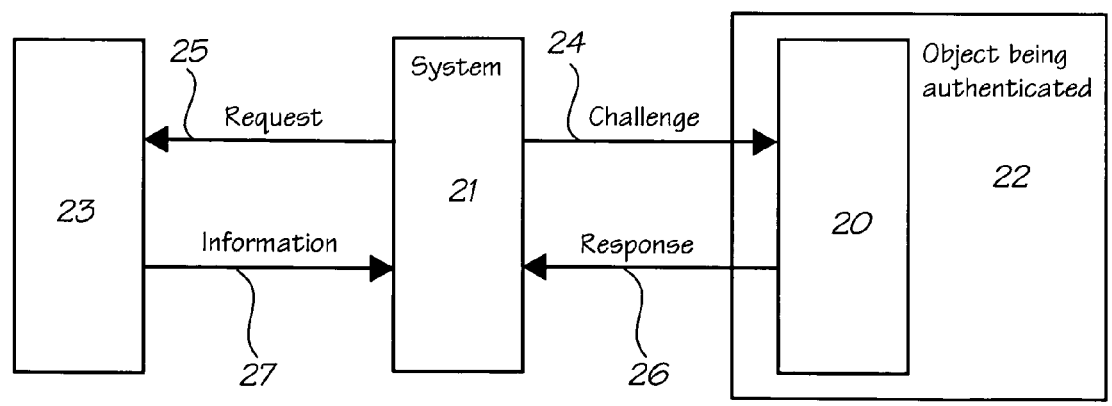
FIG. 2 illustrates a dual authentication chip data protocol.

In double chip authentication protocols, System 21 can be software, hardware or a combination of both. However ChipT 23 must be a physical Authentication Chip. In some protocols ChipT 23 and ChipA 20 have the same internal structure, while in others ChipT 23 and ChipA 20 have different internal structures. The data flow can be seen in FIG. 2, and can be seen to involve a challenge 24 from system 21 to chipA 20 and a request 25 from system 21 to chipT 23, and a response 26 from chipA 20 to system 21 and information 27 from chipT 23 to system 21.

Presence Only Authentication (Insecure State Data)

For this level of consumable authentication we are only concerned about validating the presence of the Authentication chip. Although the Authentication Chip can contain state information, the transmission of that state information would not be considered secure. Two protocols are presented. Protocol 1 requires 2 Authentication Chips, while Protocol 2 can be implemented using either 1 or 2 Authentication Chips.

Protocol 1

Protocol 1 is a double chip protocol (two Authentication Chips are required). Each Authentication Chip contains the following values:

K Key for $F_K[X]$. Must be secret.

R Current random number. Does not have to be secret, but must be seeded with a different initial value for each chip instance. Changes with each invocation of the Random function.

Each Authentication Chip contains the following logical functions:

Random[ ] Returns R, and advances R to next in sequence.

F[X] Returns $F_K[X]$, the result of applying a one-way function F to X based upon the secret key K.

The protocol is as follows:

1. System 21 requests 30 Random[ ] from ChipT 23;
2. ChipT 23 returns 31 R to System 21;
3. System 21 requests 32 F[R] from both ChipT 23 and ChipA 20;
4. ChipT 23 returns 34 $F_{KT}[R]$ to System 21;
5. ChipA 20 returns 35 $F_{KA}[R]$ to System 21;
6. System compares $F_{KT}[R]$ with $F_{KA}[R]$. If they are equal, then ChipA is considered valid. If not, then ChipA is considered invalid.

Figure 3:
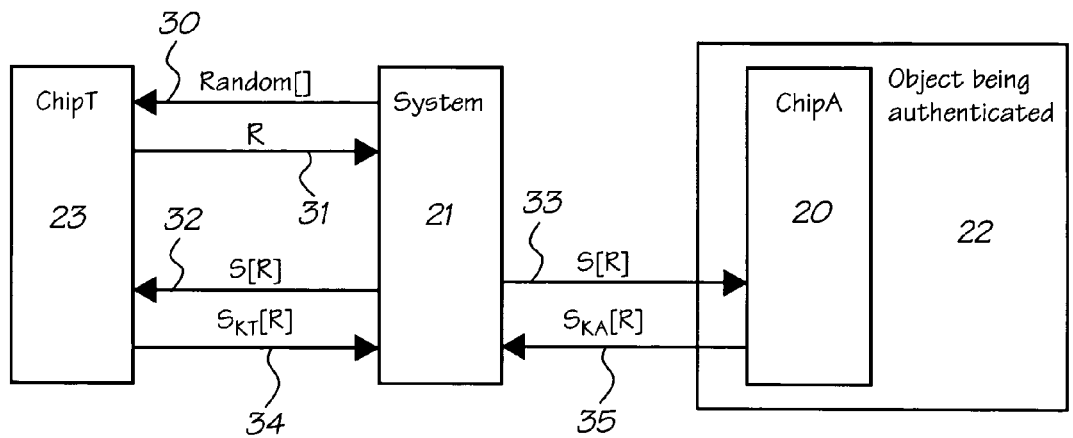
FIG. 3 illustrates a first presence only protocol.

The data flow can be seen in FIG. 3.

The System 21 does not have to comprehend $F_K[R]$ messages. It must merely check that the responses from ChipA and ChipT are the same. The System 21 therefore does not require the key. The security of Protocol 1 lies in two places:

The security of F[X]. Only Authentication chips contain the secret key, so anything that can produce an F[X] from an X that matches the F[X] generated by a trusted Authentication chip (ChipT) must be authentic.

The domain of R generated by all Authentication chips must be large and non-deterministic. If the domain of R generated by all Authentication chips is small, then there is no need for a clone manufacturer to crack the key. Instead, the clone manufacturer could incorporate a ROM in their chip that had a record of all of the responses from a genuine chip to the codes sent by the system. The Random function does not strictly have to be in the Authentication Chip, since System can potentially generate the same random number sequence. However it simplifies the design of System and ensures the security of the random number generator will be the same for all implementations that use the Authentication Chip, reducing possible error in system implementation.

Protocol 1 has several advantages:

K is not revealed during the authentication process

Given X, a clone chip cannot generate $F_K[X]$ without K or access to a real Authentication Chip.

System is easy to design, especially in low cost systems such as ink-jet printers, as no encryption or decryption is required by System itself.

A wide range of keyed one-way functions exists, including symmetric cryptography, random number sequences, and message authentication codes.

One-way functions require fewer gates and are easier to verify than asymmetric algorithms).

Secure key size for a keyed one-way function does not have to be as large as for an asymmetric (public key) algorithm. A minimum of 128 bits can provide appropriate security if F[X] is a symmetric cryptographic function.

However there are problems with this protocol:

It is susceptible to chosen text attack. An attacker can plug the chip into their own system, generate chosen Rs, and observe the output. In order to find the key, an attacker can also search for an R that will generate a specific F[M] since multiple Authentication chips can be tested in parallel.

Depending on the one-way function chosen, key generation can be complicated. The method of selecting a good key depends on the algorithm being used. Certain keys are weak for a given algorithm.

The choice of the keyed one-way functions itself is non-trivial. Some require licensing due to patent protection.

A man-in-the middle could take action on a plaintext message M before passing it on to ChipA—it would be preferable if the man-in-the-middle did not see M until after ChipA had seen it. It would be even more preferable if a man-in-the-middle didn't see M at all.

If F is symmetric encryption, because of the key size needed for adequate security, the chips could not be exported from the USA since they could be used as strong encryption devices.

If Protocol 1 is implemented with F as an asymmetric encryption algorithm, there is no advantage over the symmetric case—the keys needs to be longer and the encryption algorithm is more expensive in silicon. Protocol 1 must be implemented with 2 Authentication Chips in order to keep the key secure. This means that each System requires an Authentication Chip and each consumable requires an Authentication Chip.

Protocol 2

In some cases, System may contain a large amount of processing power. Alternatively, for instances of systems that are manufactured in large quantities, integration of ChipT into System may be desirable. Use of an asymmetrical encryption algorithm allows the ChipT portion of System to be insecure. Protocol 2 therefore, uses asymmetric cryptography. For this protocol, each chip contains the following values:

K Key for $E_K[X]$ and $D_K[X]$. Must be secret in ChipA. Does not have to be secret in ChipT.

R Current random number. Does not have to be secret, but must be seeded with a different initial value for each chip instance. Changes with each invocation of the Random function.

The following functions are defined:

E[X] ChipT only. Returns $E_K[X]$ where E is asymmetric encrypt function E.

D[X] ChipA only. Returns $D_K[X]$ where D is asymmetric decrypt function D.

Random[ ] ChipT only. Returns R|$E_K[R]$, where R is random number based on seed S. Advances R to next in random number sequence.

The public key $K_T$ is in ChipT 23, while the secret key $K_A$ is in ChipA 20. Having $K_T$ in ChipT 23 has the advantage that ChipT can be implemented in software or hardware (with the proviso that the seed for R is different for each chip or system). Protocol 2 therefore can be implemented as a Single Chip Protocol or as a Double Chip Protocol. The protocol for authentication is as follows:

1. System 21 calls 40 ChipT's Random function;
2. ChipT 23 returns 41 R|$E_{KT}[R]$ to System 21;
3. System 21 calls 42 ChipA's D function, passing in $E_{KT}[R]$;
4. ChipA 20 returns 43 R, obtained by $DKA[E_{KT}[R]]$;
5. System 21 compares R from ChipA 20 to the original R generated by ChipT 23. If they are equal, then ChipA 20 is considered valid. If not, ChipA 20 is invalid.

Figure 4:
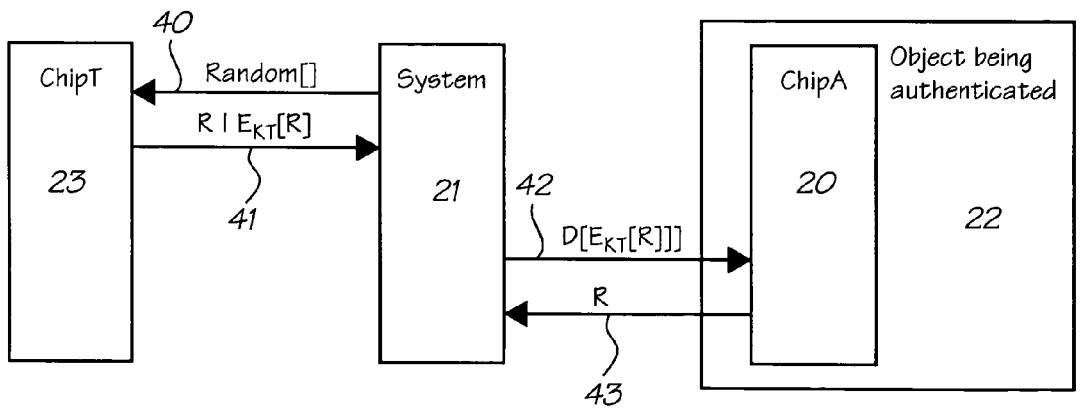
FIG. 4 illustrates a second presence only protocol.

The data flow can be seen in FIG. 4.

Protocol 2 has the following advantages:

$K_A$ (the secret key) is not revealed during the authentication process

Given $E_{KT}[X]$, a clone chip cannot generate X without $K_A$ or access to a real ChipA.

Since $K_T \neq K_A$, ChipT can be implemented completely in software or in insecure hardware or as part of System. Only ChipA (in the consumable) is required to be a secure Authentication Chip.

If ChipT is a physical chip, System is easy to design.

There are a number of well-documented and cryptanalyzed asymmetric algorithms to chose from for implementation, including patent-free and license-free solutions.

However, Protocol 2 has a number of its own problems:

For satisfactory security, each key needs to be 2048 bits (compared to minimum 128 bits for symmetric cryptography in Protocol 1). The associated intermediate memory used by the encryption and decryption algorithms is correspondingly larger.

Key generation is non-trivial. Random numbers are not good keys.

If ChipT is implemented as a core, there may be difficulties in linking it into a given System ASIC.

If ChipT is implemented as software, not only is the implementation of System open to programming error and non-rigorous testing, but the integrity of the compiler and mathematics primitives must be rigorously checked for each implementation of System. This is more complicated and costly than simply using a well-tested chip.

Although many symmetric algorithms are specifically strengthened to be resistant to differential cryptanalysis (which is based on chosen text attacks), the private key $K_A$ is susceptible to a chosen text attack If ChipA and ChipT are instances of the same Authentication Chip, each chip must contain both asymmetric encrypt and decrypt functionality. Consequently each chip is larger, more complex, and more expensive than the chip required for Protocol 1.

If the Authentication Chip is broken into 2 chips to save cost and reduce complexity of design/test, two chips still need to be manufactured, reducing the economies of scale. This is offset by the relative numbers of systems to consumables, but must still be taken into account.

Protocol 2 Authentication Chips could not be exported from the USA, since they would be considered strong encryption devices.

Even if the process of choosing a key for Protocol 2 was straightforward, Protocol 2 is impractical at the present time due to the high cost of silicon implementation (both key size and functional implementation). Therefore Protocol 1 is the protocol of choice for Presence Only Authentication.

Clone Consumable Using Real Authentication Chip

Protocols 1 and 2 only check that ChipA is a real Authentication Chip. They do not check to see if the consumable itself is valid. The fundamental assumption for authentication is that if ChipA is valid, the consumable is valid. It is therefore possible for a clone manufacturer to insert a real Authentication Chip into a clone consumable. There are two cases to consider:

In cases where state data is not written to the Authentication Chip, the chip is completely reusable. Clone manufacturers could therefore recycle a valid consumable into a clone consumable. This may be made more difficult by melding the Authentication Chip into the consumable's physical packaging, but it would not stop refill operators.

In cases where state data is written to the Authentication Chip, the chip may be new, partially used up, or completely used up. However this does not stop a clone manufacturer from using the Piggyback attack, where the clone manufacturer builds a chip that has a real Authentication Chip as a piggyback. The Attacker's chip (ChipE) is therefore a man-in-the-middle. At power up, ChipE reads all the memory state values from the real Authentication chip into its own memory. ChipE then examines requests from System, and takes different actions depending on the request. Authentication requests can be passed directly to the real Authentication chip, while read/write requests can be simulated by a memory that resembles real Authentication Chip behavior. In this way the Authentication chip will always appear fresh at power-up. ChipE can do this because the data access is not authenticated.

In order to fool System into thinking its data accesses were successful, ChipE still requires a real Authentication Chip, and in the second case, a clone chip is required in addition to a real Authentication Chip. Consequently Protocols 1 and 2 can be useful in situations where it is not cost effective for a clone manufacturer to embed a real Authentication chip into the consumable. If the consumable cannot be recycled or refilled easily, it may be protection enough to use Protocols 1 or 2. For a clone operation to be successful each clone consumable must include a valid Authentication Chip. The chips would have to be stolen en masse, or taken from old consumables. The quantity of these reclaimed chips (as well as the effort in reclaiming them) should not be enough to base a business on, so the added protection of secure data transfer (see Protocols 3 and 4) may not be useful.

Longevity of Key

A general problem of these two protocols is that once the authentication key is chosen, it cannot easily be changed. In some instances a key-compromise is not a problem, while for others a key compromise is disastrous. For example, in a car/car-key System/Consumable scenario, the customer has only one set of car/car-keys. Each car has a different authentication key. Consequently the loss of a car-key only compromises the individual car. If the owner considers this a problem, they must get a new lock on the car by replacing the System chip inside the car's electronics. The owner's keys must be reprogrammed/replaced to work with the new car System Authentication Chip. By contrast, a compromise of a key for a high volume consumable market (for example ink cartridges in printers) would allow a clone ink cartridge manufacturer to make their own Authentication Chips. The only solution for existing systems is to update the System Authentication Chips, which is a costly and logistically difficult exercise. In any case, consumers' Systems already work—they have no incentive to hobble their existing equipment.

Consumable Lifetime Authentication

In this level of consumable authentication we are concerned with validating the existence of the Authentication Chip, as well as ensuring that the Authentication Chip lasts only as long as the consumable. In addition to validating that an Authentication Chip is present, writes and reads of the Authentication Chip's memory space must be authenticated as well. In this section we assume that the Authentication Chip's data storage integrity is secure—certain parts of memory are Read Only, others are Read/Write, while others are Decrement Only (see the chapter entitled Data Storage Integrity for more information). Two protocols are presented. Protocol 3 requires 2 Authentication Chips, while Protocol 4 can be implemented using either 1 or 2 Authentication Chips.

Protocol 3

This protocol is a double chip protocol (two Authentication Chips are required). For this protocol, each Authentication Chip contains the following values:

$K_1$ Key for calculating $F_{K1}[X]$. Must be secret.

$K_2$ Key for calculating $F_{K2}[X]$. Must be secret.

R Current random number. Does not have to be secret, but must be seeded with a different initial value for each chip instance. Changes with each successful authentication as defined by the Test function.

M Memory vector of Authentication chip. Part of this space should be different for each chip (does not have to be a random number).

Each Authentication Chip contains the following logical functions:

F[X] Internal function only. Returns $F_K[X]$, the result of applying a one-way function F to X based upon either key $K_1$ or key $K_2$.

Random[ ] Returns R|$F_{K1}[R]$.

Test[X, Y] Returns 1 and advances R if $F_{K2}[R|X]$=Y. Otherwise returns 0. The time taken to return 0 must be identical for all bad inputs.

Read[X, Y] Returns M|$F_{K2}[X|M]$ if $F_{K1}[X]$=Y. Otherwise returns 0. The time taken to return 0 must be identical for all bad inputs.

Write[X] Writes X over those parts of M that can legitimately be written over.

To authenticate ChipA 20 and read ChipA's memory M:
1. System 21 calls 50 ChipT's Random function;
2. ChipT 23 produces R|$F_K$[R] and returns 51 these to System;
3. System 21 calls 52 ChipA's Read function, passing in R, $F_K$[R];
4. ChipA 20 returns 53 M and $F_K$[R|M];
5. System 21 calls 54 ChipT's Test function, passing in M and $F_K$[R|M];
6. System 21 checks response 55 from ChipT 23. If the response is 1, then ChipA 20 is considered authentic. If 0, ChipA 20 is considered invalid.

To authenticate a write of $M_{new}$ to ChipA's memory M:
1. System calls ChipA's Write function, passing in $M_{new}$;
2. The authentication procedure for a Read is carried out;
3. If ChipA is authentic and $M_{new}$=M, the write succeeded. Otherwise it failed.

Figure 5:
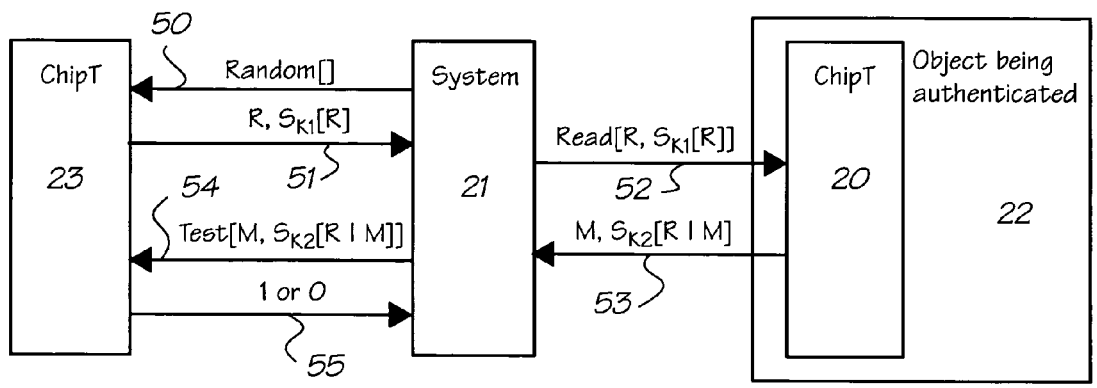
FIG. 5 illustrates a third data protocol.

The data flow for read authentication is shown in FIG. 5.

The first thing to note about Protocol 3 is that $F_K$[X] cannot be called directly. Instead $F_K$[X] is called indirectly by Random, Test and Read:

Random[ ] calls $F_{K1}$[X] X is not chosen by the caller. It is chosen by the Random function. An attacker must perform a brute force search using multiple calls to Random, Read, and Test to obtain a desired X, $F_{K1}$[X] pair.

Test[X, Y] calls $F_{K2}$[R|X] Does not return result directly, but compares the result to Y and then returns 1 or 0. Any attempt to deduce $K_2$ by calling Test multiple times trying different values of $F_{K2}$[R|X] for a given X is reduced to a brute force search where R cannot even be chosen by the attacker.

Read[X,Y] calls $F_{K1}$[X] X and $F_{K1}$[X] must be supplied by caller, so the caller must already know the X, $F_{K1}$[X] pair. Since the call returns 0 if Y≠$F_{K1}$[X], a caller can use the Read function for a brute force attack on $K_1$.

Read[X, Y] calls $F_{K2}$[X|M], X is supplied by caller, however X can only be those values already given out by the Random function (since X and Y are validated via $K_1$). Thus a chosen text attack must first collect pairs from Random (effectively a brute force attack). In addition, only part of M can be used in a chosen text attack since some of M is constant (read-only) and the decrement-only part of M can only be used once per consumable. In the next consumable the read-only part of M will be different.

Having $F_K$[X] being called indirectly prevents chosen text attacks on the Authentication Chip. Since an attacker can only obtain a chosen R, $F_{K1}$[R] pair by calling Random, Read, and Test multiple times until the desired R appears, a brute force attack on $K_1$ is required in order to perform a limited chosen text attack on $K_2$. Any attempt at a chosen text attack on $K_2$ would be limited since the text cannot be completely chosen: parts of M are read-only, yet different for each Authentication Chip. The second thing to note is that two keys are used. Given the small size of M, two different keys $K_1$ and $K_2$ are used in order to ensure there is no correlation between F[R] and F[R|M]. $K_1$ is therefore used to help protect $K_2$ against differential attacks. It is not enough to use a single longer key since M is only 256 bits, and only part of M changes during the lifetime of the consumable. Otherwise it is potentially possible that an attacker via some as-yet undiscovered technique, could determine the effect of the limited changes in M to particular bit combinations in R and thus calculate $F_{K2}$[X|M] based on $F_{K1}$[X]. As an added precaution, the Random and Test functions in ChipA should be disabled so that in order to generate R, $F_K$[R] pairs, an attacker must use instances of ChipT, each of which is more expensive than ChipA (since a system must be obtained for each ChipT). Similarly, there should be a minimum delay between calls to Random, Read and Test so that an attacker cannot call these functions at high speed. Thus each chip can only give a specific number of X, $F_K$[X] pairs away in a certain time period. The only specific timing requirement of Protocol 3 is that the return value of 0 (indicating a bad input) must be produced in the same amount of time regardless of where the error is in the input. Attackers can therefore not learn anything about what was bad about the input value. This is true for both RD and TST functions.

Another thing to note about Protocol 3 is that Reading data from ChipA also requires authentication of ChipA. The System can be sure that the contents of memory (M) is what ChipA claims it to be if $F_{K2}$[R|M] is returned correctly. A clone chip may pretend that M is a certain value (for example it may pretend that the consumable is full), but it cannot return $F_{K2}$[R|M] for any R passed in by System. Thus the effective signature $F_{K2}$[R|M] assures System that not only did an authentic ChipA send M, but also that M was not altered in between ChipA and System. Finally, the Write function as defined does not authenticate the Write. To authenticate a write, the System must perform a Read after each Write. There are some basic advantages with Protocol 3:

- $K_1$ and $K_2$ are not revealed during the authentication process
- Given X, a clone chip cannot generate $F_{K2}$[X|M] without the key or access to a real Authentication Chip.
- System is easy to design, especially in low cost systems such as ink-jet printers, as no encryption or decryption is required by System itself.
- A wide range of key based one-way functions exists, including symmetric cryptography, random number sequences, and message authentication codes.
- Keyed one-way functions require fewer gates and are easier to verify than asymmetric algorithms).
- Secure key size for a keyed one-way function does not have to be as large as for an asymmetric (public key) algorithm. A minimum of 128 bits can provide appropriate security if F[X] is a symmetric cryptographic function.

Consequently, with Protocol 3, the only way to authenticate ChipA is to read the contents of ChipA's memory. The security of this protocol depends on the underlying $F_K$[X] scheme and the domain of R over the set of all Systems. Although $F_K$[X] can be any keyed one-way function, there is no advantage to implement it as asymmetric encryption. The keys need to be longer and the encryption algorithm is more expensive in silicon. This leads to a second protocol for use with asymmetric algorithms—Protocol 4. Protocol 3 must be implemented with 2 Authentication Chips in order to keep the keys secure. This means that each System requires an Authentication Chip and each consumable requires an Authentication Chip Protocol 4

In some cases, System may contain a large amount of processing power. Alternatively, for instances of systems that are manufactured in large quantities, integration of ChipT into System may be desirable. Use of an asymmetrical encryption algorithm can allow the ChipT portion of System to be insecure. Protocol 4 therefore, uses asymmetric cryptography. For this protocol, each chip contains the following values:

K Key for $E_K$[X] and $D_K$[X]. Must be secret in ChipA. Does not have to be secret in ChipT.

R Current random number. Does not have to be secret, but must be seeded with a different initial value for each chip instance. Changes with each successful authentication as defined by the Test function.

M Memory vector of Authentication chip. Part of this space should be different for each chip, (does not have to be a random number).

There is no point in verifying anything in the Read function, since anyone can encrypt using a public key. Consequently the following functions are defined:

E[X] Internal function only. Returns $E_K[X]$ where E is asymmetric encrypt function E.

D[X] Internal function only. Returns $D_K[X]$ where D is asymmetric decrypt function D.

Random [ ] ChipT only. Returns $E_K[R]$.

Test[X, Y] Returns 1 and advances R if $D_K[R|X]$=Y. Otherwise returns 0. The time taken to return 0 must be identical for all bad inputs.

Read[X] Returns M|$E_K[R|M]$ where R=$D_K[X]$ (does not test input).

Write[X] Writes X over those parts of M that can legitimately be written over.

The public key $K_T$ is in ChipT, while the secret key $K_A$ is in ChipA. Having $K_T$ in ChipT has the advantage that ChipT can be implemented in software or hardware (with the proviso that R is seeded with a different random number for each system).

To authenticate ChipA 20 and read ChipA's memory M:
1. System 21 calls 60 ChipT's Random function;
2. ChipT 23 produces and returns 61 $E_{KT}[R]$ to System;
3. System 21 calls 62 ChipA's Read function, passing in $E_{KT}[R]$;
4. ChipA 20 returns 63 M|$E_{KA}[R|M]$, first obtaining R by DKA[$E_{KT}[R]$];
5. System 21 calls 64 ChipT's Test function, passing in M and $E_{KA}[R|M]$;
6. ChipT 23 calculates $D_{KT}[E_{KA}[R|M]]$ and compares it to R|M.
7. System 21 checks response 65 from ChipT. If the response 65 is 1, then ChipA 20 is considered authentic. If 0, ChipA 20 is considered invalid.

To authenticate a write of $M_{new}$ to ChipA's memory M:
1. System calls ChipA's Write function, passing in $M_{new}$;
2. The authentication procedure for a Read is carried out;
3. If ChipA is authentic and $M_{new}$=M, the write succeeded. Otherwise it failed.

Figure 6:
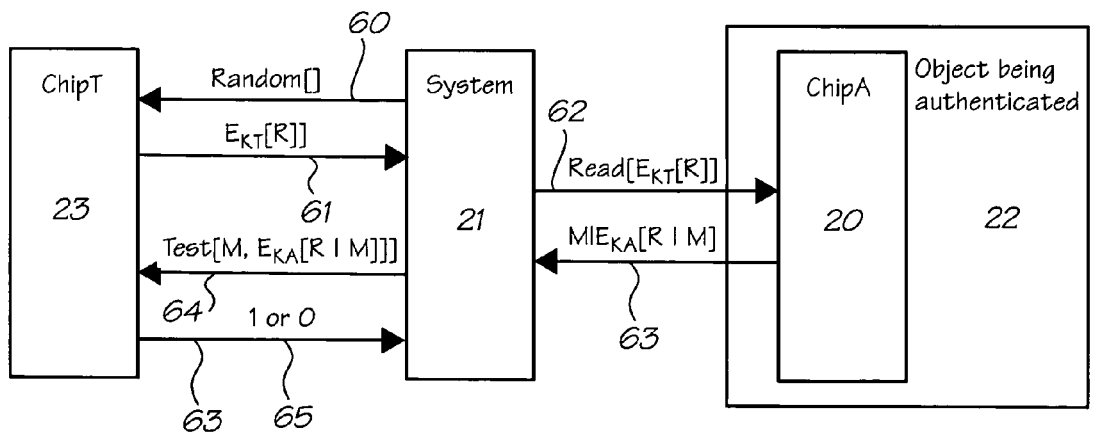
FIG. 6 illustrates a fourth data protocol.

The data flow for read authentication is shown in FIG. 6.

Only a valid ChipA would know the value of R, since R is not passed into the Authenticate function (it is passed in as an encrypted value). R must be obtained by decrypting E[R], which can only be done using the secret key $K_A$. Once obtained, R must be appended to M and then the result re-encoded. ChipT can then verify that the decoded form of $E_{KA}[R|M]$=R 1 M and hence ChipA is valid. Since $K_T \neq K_A$, $E_{KT}[R] \# E_{KA}[R]$. Protocol 4 has the following advantages:

$K_A$ (the secret key) is not revealed during the authentication process

Given $E_{KT}[X]$, a clone chip cannot generate X without $K_A$ or access to a real ChipA.

Since $K_T \neq K_A$, ChipT can be implemented completely in software or in insecure hardware or as part of System. Only ChipA is required to be a secure Authentication Chip.

Since ChipT and ChipA contain different keys, intense testing of ChipT will reveal nothing about $K_A$.

If ChipT is a physical chip, System is easy to design.

There are a number of well-documented and cryptanalyzed asymmetric algorithms to chose from for implementation, including patent-free and license-free solutions.

Even if System could be rewired so that ChipA requests were directed to ChipT, ChipT could never answer for ChipA since $K_T \neq K_A$. The attack would have to be directed at the System ROM itself to bypass the Authentication protocol.

However, Protocol 4 has a number of disadvantages:

All Authentication Chips need to contain both asymmetric encrypt and decrypt functionality. Consequently each chip is larger, more complex, and more expensive than the chip required for Protocol 3.

For satisfactory security, each key needs to be 2048 bits (compared to a minimum of 128 bits for symmetric cryptography in Protocol 1). The associated intermediate memory used by the encryption and decryption algorithms is correspondingly larger.

Key generation is non-trivial. Random numbers are not good keys.

If ChipT is implemented as a core, there may be difficulties in linking it into a given System ASIC.

If ChipT is implemented as software, not only is the implementation of System open to programming error and non-rigorous testing, but the integrity of the compiler and mathematics primitives must be rigorously checked for each implementation of System. This is more complicated and costly than simply using a well-tested chip.

Although many symmetric algorithms are specifically strengthened to be resistant to differential cryptanalysis (which is based on chosen text attacks), the private key $K_A$ is susceptible to a chosen text attack Protocol 4 Authentication Chips could not be exported from the USA, since they would be considered strong encryption devices.

As with Protocol 3, the only specific timing requirement of Protocol 4 is that the return value of 0 (indicating a bad input) must be produced in the same amount of time regardless of where the error is in the input. Attackers can therefore not learn anything about what was bad about the input value. This is true for both RD and TST functions.

Variation on Call to TST

If there are two Authentication Chips used, it is theoretically possible for a clone manufacturer to replace the System Authentication Chip with one that returns 1 (success) for each call to TST. The System can test for this by calling TST a number of times—N times with a wrong hash value, and expect the result to be 0. The final time that TST is called, the true returned value from ChipA is passed, and the return value is trusted. The question then arises of how many times to call TST. The number of calls must be random, so that a clone chip manufacturer cannot know the number ahead of time. If System has a clock, bits from the clock can be used to determine how many false calls to TST should be made. Otherwise the returned value from ChipA can be used. In the latter case, an attacker could still rewire the System to permit a clone ChipT to view the returned value from ChipA, and thus know which hash value is the correct one. The worst case of course, is that the System can be completely replaced by a clone System that does not require authenticated consumables—this is the limit case of rewiring and changing the System. For this reason, the variation on calls to TST is optional, depending on the System, the Consumable, and how likely modifications are to be made. Adding such logic to System (for example in the case of a small desktop printer) may be considered not worthwhile, as the System is made more complicated. By contrast, adding such logic to a camera may be considered worthwhile.

Clone Consumable Using Real Authentication Chip

It is important to decrement the amount of consumable remaining before use that consumable portion. If the consumable is used first, a clone consumable could fake a loss of contact during a write to the special known address and then appear as a fresh new consumable. It is important to note that this attack still requires a real Authentication Chip in each consumable.

Longevity of Key

A general problem of these two protocols is that once the authentication keys are chosen, it cannot easily be changed. In some instances a key-compromise is not a problem, while for others a key compromise is disastrous.

Choosing a Protocol

Even if the choice of keys for Protocols 2 and 4 was straightforward, both protocols are impractical at the present time due to the high cost of silicon implementation (both due to key size and functional implementation). Therefore Protocols 1 and 3 are the two protocols of choice. However, Protocols 1 and 3 contain much of the same components:

both require read and write access;
both require implementation of a keyed one-way function; and
both require random number generation functionality.

Protocol 3 requires an additional key ($K_2$), as well as some minimal state machine changes:

a state machine alteration to enable $F_{K1}[X]$ to be called during Random;
a Test function which calls $F_{K2}[X]$
a state machine alteration to the Read function to call $F_{K1}[X]$ and $F_{K2}[X]$ Protocol 3 only requires minimal changes over Protocol 1. It is more secure and can be used in all places where Presence Only Authentication is required (Protocol 1). It is therefore the protocol of choice. Given that Protocols 1 and 3 both make use of keyed one-way functions, the choice of one-way function is examined in more detail here. The following table outlines the attributes of the applicable choices. The attributes are worded so that the attribute is seen as an advantage.

choice is therefore between HMAC-SHA1 and HMAC-RIPEMD160. RIPEMD-160 is relatively new, and has not been as extensively cryptanalyzed as SHA1. However, SHA-1 was designed by the NSA, so this may be seen by some as a negative attribute.

Given that there is not much between the two, SHA-1 will be used for the HMAC construct.

Choosing a Random Number Generator

Each of the protocols described (1-4) requires a random number generator. The generator must be "good" in the sense that the random numbers generated over the life of all Systems cannot be predicted. If the random numbers were the same for each System, an attacker could easily record the correct responses from a real Authentication Chip, and place the responses into a ROM lookup for a clone chip. With such an attack there is no need to obtain $K_1$ or $K_2$. Therefore the random numbers from each System must be different enough to be unpredictable, or non-deterministic. As such, the initial value for R (the random seed) should be programmed with a physically generated random number gathered from a physically random phenomenon, one where there is no information about whether a particular bit will be 1 or 0. The seed for R must NOT be generated with a computer-run random number generator. Otherwise the generator algorithm and seed may be compromised enabling an attacker to generate and therefore know the set of all R values in all Systems.

Having a different R seed in each Authentication Chip means that the first R will be both random and unpredictable across all chips. The question therefore arises of how to generate subsequent R values in each chip.

The base case is not to change R at all. Consequently R and $F_{K1}[R]$ will be the same for each call to Random[ ]. If they are the same, then $F_{K1}[R]$ can be a constant rather than calculated. An attacker could then use a single valid Authentication Chip to generate a valid lookup table, and then use that lookup table in a clone chip programmed especially for that System. A constant R is not secure.

The simplest conceptual method of changing R is to increment it by 1. Since R is random to begin with, the values across differing systems are still likely to be random. However given an initial R, all subsequent R values can be deter-

|  | Triple DES | Blowfish | RC5 | IDEA | Random Sequences | HMAC-MD5 | HMAC-SHA1 | HMAC-RIPEMD 160 |
|---|---|---|---|---|---|---|---|---|
| Free of patents | • | • |  |  | • | • | • | • |
| Random key generation |  |  |  |  |  | • | • | • |
| Can be exported from the USA |  |  |  |  | • | • | • | • |
| Fast |  | • |  |  |  | • | • | • |
| Preferred Key Size (bits) for use in this application | 168 | 128 | 128 | 128 | 512 | 128 | 160 | 160 |
| Block size (bits) | 64 | 64 | 64 | 64 | 256 | 512 | 512 | 512 |
| Cryptanalysis Attack-Free (apart from weak keys) | • | • |  |  | • |  | • | • |
| Output size given input size N | $\geq N$ | $\geq N$ | $\geq N$ | $\geq N$ | 128 | 128 | 160 | 160 |
| Low storage requirements |  |  |  |  | • | • | • | • |
| Low silicon complexity |  |  |  |  | • | • | • | • |
| NSA designed |  |  |  |  |  |  | • |  |

An examination of the table shows that the choice is effectively between the 3 HMAC constructs and the Random Sequence. The problem of key size and key generation eliminates the Random Sequence. Given that a number of attacks have already been carried out on MD5 and since the hash result is only 128 bits, HMAC-MD5 is also eliminated. The mined directly (there is no need to iterate 10,000 times—R will take on values from $R_0$ to $R_0+10000$). An incrementing R is immune to the earlier attack on a constant R. Since R is always different, there is no way to construct a lookup table for the particular System without wasting as many real Authentication Chips as the clone chip will replace.

Rather than increment using an adder, another way of changing R is to implement it as an LFSR (Linear Feedback Shift Register). This has the advantage of less silicon than an adder, but the advantage of an attacker not being able to directly determine the range of R for a particular System, since an LFSR value-domain is determined by sequential access. To determine which values an given initial R will generate, an attacker must iterate through the possibilities and enumerate them. The advantages of a changing R are also evident in the LFSR solution. Since R is always different, there is no way to construct a lookup table for the particular System without using-up as many real Authentication Chips as the clone chip will replace (and only for that System). There is therefore no advantage in having a more complex function to change R. Regardless of the function, it will always be possible for an attacker to iterate through the lifetime set of values in a simulation. The primary security lies in the initial randomness of R. Using an LFSR to change R (apart from using less silicon than an adder) simply has the advantage of not being restricted to a consecutive numeric range (i.e. knowing R, $R_N$ cannot be directly calculated; an attacker must iterate through the LFSR N times).

Figure 7:
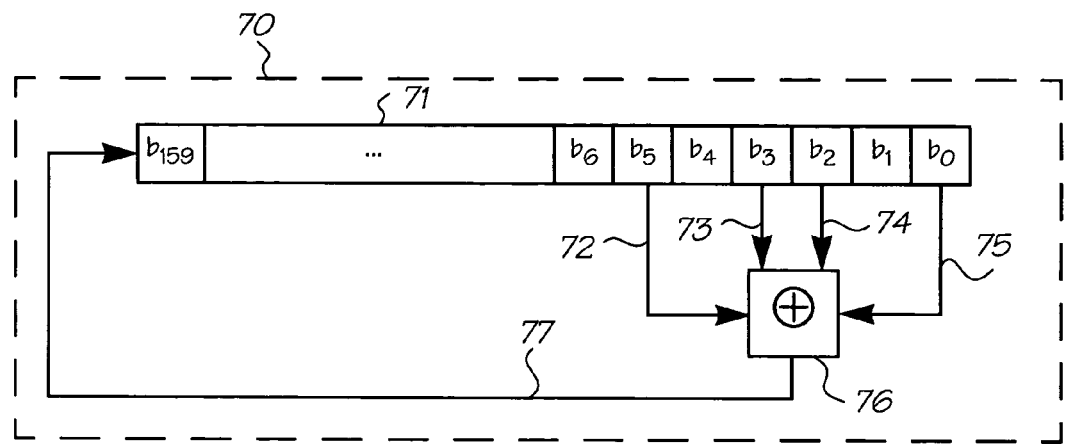
FIG. 7 is a schematic block diagram of a maximal period LFSR.

The Random number generator 70 within the Authentication Chip is therefore an LFSR 71 with 160 bits and four taps 72, 73, 74 and 75, which feed an exclusive-OR gate 76, which in turn feeds back 77 to $bit_{159}$. Tap selection of the 160 bits for a maximal-period LFSR (i.e. the LFSR will cycle through all $2^{160}-1$ states, 0 is not a valid state) yields bits 5, 3, 2, and 0, as shown in FIG. 7. The LFSR is sparse, in that not many bits are used for feedback (only 4 out of 160 bits are used). This is a problem for cryptographic applications, but not for this application of non-sequential number generation. The 160-bit seed value for R can be any random number except 0, since an LFSR filled with 0s will produce a never-ending stream of 0s. Since the LFSR described is a maximal period LFSR, all 160 bits can be used directly as R. There is no need to construct a number sequentially from output bits of $b_0$. After each successful call to TST, the random number (R) must be advanced by XORing bits 1, 2, 4, and 159, and shifting the result into the high order bit. The new R and corresponding $F_{K1}[R]$ can be retrieved on the next call to Random.

Holding Out Against Logical Attacks

Protocol 3 is the authentication scheme used by the Authentication Chip. As such, it should be resistant to defeat by logical means. While the effect of various types of attacks on Protocol 3 have been mentioned in discussion, this section details each type of attack in turn with reference to Protocol 3.

Brute Force Attack

A Brute Force attack is guaranteed to break Protocol 3. However the length of the key means that the time for an attacker to perform a brute force attack is too long to be worth the effort. An attacker only needs to break $K_2$ to build a clone Authentication Chip. $K_1$ is merely present to strengthen $K_2$ against other forms of attack. A Brute Force Attack on $K_2$ must therefore break a 160-bit key. An attack against $K_2$ requires a maximum of $2^{160}$ attempts, with a 50% chance of finding the key after only $2^{159}$ attempts. Assuming an array of a trillion processors, each running one million tests per second, $2^{159}$ ($7.3 \times 10^{47}$) tests takes $2.3 \times 10^{23}$ years, which is longer than the lifetime of the universe. There are only 100 million personal computers in the world. Even if these were all connected in an attack (e.g. via the Internet), this number is still 10,000 times smaller than the trillion-processor attack described. Further, if the manufacture of one trillion processors becomes a possibility in the age of nanocomputers, the time taken to obtain the key is longer than the lifetime of the universe.

Guessing the Key Attack

It is theoretically possible that an attacker can simply "guess the key". In fact, given enough time, and trying every possible number, an attacker will obtain the key. This is identical to the Brute Force attack described above, where $2^{159}$ attempts must be made before a 50% chance of success is obtained. The chances of someone simply guessing the key on the first try is $2^{160}$. For comparison, the chance of someone winning the top prize in a U.S. state lottery and being killed by lightning in the same day is only 1 in $2^6$. The chance of someone guessing the Authentication Chip key on the first go is 1 in $2^{160}$, which is comparative to two people choosing exactly the same atoms from a choice of all the atoms in the Earth i.e. extremely unlikely.

Quantum Computer Attack

To break $K_2$, a quantum computer containing 160 qubits embedded in an appropriate algorithm must be built. An attack against a 160-bit key is not feasible. An outside estimate of the possibility of quantum computers is that 50 qubits may be achievable within 50 years. Even using a 50 qubit quantum computer, $2^{110}$ tests are required to crack a 160 bit key. Assuming an array of 1 billion 50 qubit quantum computers, each able to try $2^{50}$ keys in 1 microsecond (beyond the current wildest estimates) finding the key would take an average of 18 billion years.

Cyphertext Only Attack

An attacker can launch a Cyphertext Only attack on $K_1$ by calling monitoring calls to RND and RD, and on $K_2$ by monitoring calls to RD and TST. However, given that all these calls also reveal the plaintext as well as the hashed form of the plaintext, the attack would be transformed into a stronger form of attack—a Known Plaintext attack.

Known Plaintext Attack

It is easy to connect a logic analyzer to the connection between the System and the Authentication Chip, and thereby monitor the flow of data. This flow of data results in known plaintext and the hashed form of the plaintext, which can therefore be used to launch a Known Plaintext attack against both $K_1$ and $K_2$. To launch an attack against $K_1$, multiple calls to RND and TST must be made (with the call to TST being successful, and therefore requiring a call to RD on a valid chip). This is straightforward, requiring the attacker to have both a System Authentication Chip and a Consumable Authentication Chip. For each $K_1$ X, $H_{K1}[X]$ pair revealed, a $K_2$ Y, $H_{K2}[Y]$ pair is also revealed. The attacker must collect these pairs for further analysis. The question arises of how many pairs must be collected for a meaningful attack to be launched with this data. An example of an attack that requires collection of data for statistical analysis is Differential Cryptanalysis. However, there are no known attacks against SHA-1 or HMAC-SHA1, so there is no use for the collected data at this time.

Chosen Plaintext Attacks

Given that the cryptanalyst has the ability to modify subsequent chosen plaintexts based upon the results of previous experiments, $K_2$ is open to a partial form of the Adaptive Chosen Plaintext attack, which is certainly a stronger form of attack than a simple Chosen Plaintext attack. A chosen plaintext attack is not possible against $K_1$, since there is no way for a caller to modify R, which used as input to the RND function (the only function to provide the result of hashing with $K_1$).

Clearing R also has the effect of clearing the keys, so is not useful, and the SSI command calls CLR before storing the new R-value.

Adaptive Chosen Plaintext Attacks

This kind of attack is not possible against $K_1$, since $K_1$ is not susceptible to chosen plaintext attacks. However, a partial form of this attack is possible against $K_2$, especially since both System and consumables are typically available to the attacker (the System may not be available to the attacker in some instances, such as a specific car). The HMAC construct provides security against all forms of chosen plaintext attacks. This is primarily because the HMAC construct has 2 secret input variables (the result of the original hash, and the secret key). Thus finding collisions in the hash function itself when the input variable is secret is even harder than finding collisions in the plain hash function. This is because the former requires direct access to SHA-1 (not permitted in Protocol 3) in order to generate pairs of input/output from SHA-1. The only values that can be collected by an attacker are HMAC[R] and HMAC[R|M]. These are not attacks against the SHA-1 hash function itself, and reduce the attack to a Differential Cryptanalysis attack, examining statistical differences between collected data. Given that there is no Differential Cryptanalysis attack known against SHA-1 or HMAC, Protocol 3 is resistant to the Adaptive Chosen Plaintext attacks.

Purposeful Error Attack

An attacker can only launch a Purposeful Error Attack on the TST and RD functions, since these are the only functions that validate input against the keys. With both the TST and RD functions, a 0 value is produced if an error is found in the input—no further information is given. In addition, the time taken to produce the 0 result is independent of the input, giving the attacker no information about which bit(s) were wrong. A Purposeful Error Attack is therefore fruitless.

Chaining Attack

Any form of chaining attack assumes that the message to be hashed is over several blocks, or the input variables can somehow be set. The HMAC-SHA1 algorithm used by Protocol 3 only ever hashes a single 512-bit block at a time. Consequently chaining attacks are not possible against Protocol 3.

Birthday Attack

The strongest attack known against HMAC is the birthday attack, based on the frequency of collisions for the hash function. However this is totally impractical for minimally reasonable hash functions such as SHA-1. And the birthday attack is only possible when the attacker has control over the message that is signed. Protocol 3 uses hashing as a form of digital signature. The System sends a number that must be incorporated into the response from a valid Authentication Chip. Since the Authentication Chip must respond with H[R|M], but has no control over the input value R, the birthday attack is not possible. This is because the message has effectively already been generated and signed. An attacker must instead search for a collision message that hashes to the same value (analogous to finding one person who shares your birthday). The clone chip must therefore attempt to find a new value $R_2$ such that the hash of $R_2$ and a chosen $M_2$ yields the same hash value as H[R|M]. However the System Authentication Chip does not reveal the correct hash value (the TST function only returns 1 or 0 depending on whether the hash value is correct). Therefore the only way of finding out the correct hash value (in order to find a collision) is to interrogate a real Authentication Chip. But to find the correct value means to update M, and since the decrement-only parts of M are one-way, and the read-only parts of M cannot be changed, a clone consumable would have to update a real consumable before attempting to find a collision. The alternative is a Brute Force attack search on the TST function to find a success (requiring each clone consumable to have access to a System consumable). A Brute Force Search, as described above, takes longer than the lifetime of the universe, in this case, per authentication. Due to the fact that a timely gathering of a hash value implies a real consumable must be decremented, there is no point for a clone consumable to launch this kind of attack.

Substitution with a Complete Lookup Table

The random number seed in each System is 160 bits. The worst case situation for an Authentication Chip is that no state data is changed. Consequently there is a constant value returned as M. However a clone chip must still return $F_{K2}$[R|M], which is a 160 bit value. Assuming a 160-bit lookup of a 160-bit result, this requires $7.3 \times 10^{48}$ bytes, or $6.6 \times 10^{36}$ terabytes, certainly more space than is feasible for the near future. This of course does not even take into account the method of collecting the values for the ROM. A complete lookup table is therefore completely impossible.

Substitution with a Sparse Lookup Table

A sparse lookup table is only feasible if the messages sent to the Authentication Chip are somehow predictable, rather than effectively random. The random number R is seeded with an unknown random number, gathered from a naturally random event. There is no possibility for a clone manufacturer to know what the possible range of R is for all Systems, since each bit has a 50% chance of being a 1 or a 0. Since the range of R in all systems is unknown, it is not possible to build a sparse lookup table that can be used in all systems. The general sparse lookup table is therefore not a possible attack. However, it is possible for a clone manufacturer to know what the range of R is for a given System. This can be accomplished by loading a LFSR with the current result from a call to a specific System Authentication Chip's RND function, and iterating some number of times into the future. If this is done, a special ROM can be built which will only contain the responses for that particular range of R, i.e. a ROM specifically for the consumables of that particular System. But the attacker still needs to place correct information in the ROM. The attacker will therefore need to find a valid Authentication Chip and call it for each of the values in R.

Suppose the clone Authentication Chip reports a full consumable, and then allows a single use before simulating loss of connection and insertion of a new full consumable. The clone consumable would therefore need to contain responses for authentication of a full consumable and authentication of a partially used consumable. The worst case ROM contains entries for full and partially used consumables for R over the lifetime of System. However, a valid Authentication Chip must be used to generate the information, and be partially used in the process. If a given System only produces about n R-values, the sparse lookup-ROM required is 10n bytes multiplied by the number of different values for M. The time taken to build the ROM depends on the amount of time enforced between calls to RD.

After all this, the clone manufacturer must rely on the consumer returning for a refill, since the cost of building the ROM in the fist place consumes a single consumable. The clone manufacturer's business in such a situation is consequently in the refills. The time and cost then, depends on the size of R and the number of different values for M that must be incorporated in the lookup. In addition, a custom clone consumable ROM must be built to match each and every System, and a different valid Authentication Chip must be used for each System (in order to provide the full and partially used data). The use of an Authentication Chip in a System must therefore be examined to determine whether or not this kind of attack is worthwhile for a clone manufacturer. As an example, of a camera system that has about 10,000 prints in its lifetime. Assume it has a single Decrement Only value (number of prints remaining), and a delay of 1 second between calls to RD. In such a system, the sparse table will take about 3 hours to build, and consumes 100K. Remember that the construction of the ROM requires the consumption of a valid Authentication Chip, so any money charged must be worth more than a single consumable and the clone consumable combined. Thus it is not cost effective to perform this function for a single consumable (unless the clone consumable somehow contained the equivalent of multiple authentic consumables). If a clone manufacturer is going to go to the trouble of building a custom ROM for each owner of a System, an easier approach would be to update System to completely ignore the Authentication Chip.

Consequently, this attack is possible as a per-System attack, and a decision must be made about the chance of this occurring for a given System/Consumable combination. The chance will depend on the cost of the consumable and Authentication Chips, the longevity of the consumable, the profit margin on the consumable, the time taken to generate the ROM, the size of the resultant ROM, and whether customers will come back to the clone manufacturer for refills that use the same clone chip etc.

Differential Cryptanalysis

Existing differential attacks are heavily dependent on the structure of S boxes, as used in DES and other similar algorithms. Although other algorithms such as HMAC-SHA1 used in Protocol 3 have no S boxes, an attacker can undertake a differential-like attack by undertaking statistical analysis of:

Minimal-difference inputs, and their corresponding outputs

Minimal-difference outputs, and their corresponding inputs

To launch an attack of this nature, sets of input/output pairs must be collected. The collection from Protocol 3 can be via Known Plaintext, or from a Partially Adaptive Chosen Plaintext attack. Obviously the latter, being chosen, will be more useful. Hashing algorithms in general are designed to be resistant to differential analysis. SHA-1 in particular has been specifically strengthened, especially by the 80 word expansion so that minimal differences in input produce will still produce outputs that vary in a larger number of bit positions (compared to 128 bit hash functions). In addition, the information collected is not a direct SHA-1 input/output set, due to the nature of the HMAC algorithm. The HMAC algorithm hashes a known value with an unknown value (the key), and the result of this hash is then rehashed with a separate unknown value. Since the attacker does not know the secret value, nor the result of the first hash, the inputs and outputs from SHA-1 are not known, making any differential attack extremely difficult. The following is a more detailed discussion of minimally different inputs and outputs from the Authentication Chip.

Minimal Difference Inputs

This is where an attacker takes a set of X, $F_K[X]$ values where the X values are minimally different, and examines the statistical differences between the outputs $F_K[X]$. The attack relies on X values that only differ by a minimal number of bits. The question then arises as to how to obtain minimally different X values in order to compare the $F_K[X]$ values.

$K_1$: With $K_1$, the attacker needs to statistically examine minimally different X, $F_{K1}[X]$ pairs. However the attacker cannot choose any X value and obtain a related $F_{K1}[X]$ value. Since X, $F_{K1}[X]$ pairs can only be generated by calling the RND function on a System Authentication Chip, the attacker must call RND multiple times, recording each observed pair in a table. A search must then be made through the observed values for enough minimally different X values to undertake a statistical analysis of the $F_{K1}[X]$ values.

$K_2$: With $K_2$, the attacker needs to statistically examine minimally different X, $F_{K2}[X]$ pairs. The only way of generating X, $F_{K2}[X]$ pairs is via the RD function, which produces $F_{K2}[X]$ for a given Y, $F_{K1}[Y]$ pair, where X=Y|M. This means that Y and the changeable part of M can be chosen to a limited extent by an attacker. The amount of choice must therefore be limited as much as possible.

The first way of limiting an attacker's choice is to limit Y, since RD requires an input of the format Y, $F_{K1}[Y]$. Although a valid pair can be readily obtained from the RND function, it is a pair of RND's choosing. An attacker can only provide their own Y if they have obtained the appropriate pair from RND, or if they know $K_1$. Obtaining the appropriate pair from RND requires a Brute Force search. Knowing $K_1$ is only logically possible by performing cryptanalysis on pairs obtained from the RND function—effectively a known text attack. Although RND can only be called so many times per second, $K_1$ is common across System chips. Therefore known pairs can be generated in parallel.

The second way to limit an attacker's choice is to limit M, or at least the attacker's ability to choose M. The limiting of M is done by making some parts of M Read Only, yet different for each Authentication Chip, and other parts of M Decrement Only. The Read Only parts of M should ideally be different for each Authentication Chip, so could be information such as serial numbers, batch numbers, or random numbers. The Decrement Only parts of M mean that for an attacker to try a different M, they can only decrement those parts of M so many times—after the Decrement Only parts of M have been reduced to 0 those parts cannot be changed again. Obtaining a new Authentication chip provides a new M, but the Read Only portions will be different from the previous Authentication Chip's Read Only portions, thus reducing an attacker's ability to choose M even further. Consequently an attacker can only gain a limited number of chances at choosing values for Y and M.

Minimal Difference Outputs

This is where an attacker takes a set of X, $F_K[X]$ values where the $F_K[X]$ values are minimally different, and examines the statistical differences between the X values. The attack relies on $F_K[X]$ values that only differ by a minimal number of bits. For both $K_1$ and $K_2$, there is no way for an attacker to generate an X value for a given $F_K[X]$. To do so would violate the fact that F is a one-way function. Consequently the only way for an attacker to mount an attack of this nature is to record all observed X, $F_K[X]$ pairs in a table. A search must then be made through the observed values for enough minimally different $F_K[X]$ values to undertake a statistical analysis of the X values. Given that this requires more work than a minimally different input attack (which is extremely limited due to the restriction on M and the choice of R), this attack is not fruitful.

Message Substitution Attacks

In order for this kind of attack to be carried out, a clone consumable must contain a real Authentication chip, but one that is effectively reusable since it never gets decremented. The clone Authentication Chip would intercept messages, and substitute its own. However this attack does not give success to the attacker. A clone Authentication Chip may choose not to pass on a WR command to the real Authentication Chip. However the subsequent RD command must return the correct response (as if the WR had succeeded). To return the correct response, the hash value must be known for the specific R and M. As described in the Birthday Attack section, an attacker can only determine the hash value by actually updating M in a real Chip, which the attacker does not want to do. Even changing the R sent by System does not help since the System Authentication Chip must match the R during a subsequent TST. A Message substitution attack would therefore be unsuccessful. This is only true if System updates the amount of consumable remaining before it is used.

Reverse Engineering the Key Generator

If a pseudo-random number generator is used to generate keys, there is the potential for a clone manufacture to obtain the generator program or to deduce the random seed used. This was the way in which the Netscape security program was initially broken.

Bypassing Authentication Altogether

Protocol 3 requires the System to update the consumable state data before the consumable is used, and follow every write by a read (to authenticate the write). Thus each use of the consumable requires an authentication. If the System adheres to these two simple rules, a clone manufacturer will have to simulate authentication via a method above (such as sparse ROM lookup).

Reuse of Authentication Chips

As described above, Protocol 3 requires the System to update the consumable state data before the consumable is used, and follow every write by a read (to authenticate the write). Thus each use of the consumable requires an authentication. If a consumable has been used up, then its Authentication Chip will have had the appropriate state-data values decremented to 0. The chip can therefore not be used in another consumable. Note that this only holds true for Authentication Chips that hold Decrement-Only data items. If there is no state data decremented with each usage, there is nothing stopping the reuse of the chip. This is the basic difference between Presence-Only Authentication and Consumable Lifetime Authentication. Protocol 3 allows both. The bottom line is that if a consumable has Decrement Only data items that are used by the System, the Authentication Chip cannot be reused without being completely reprogrammed by a valid Programming Station that has knowledge of the secret key.

Management Decision to Omit Authentication to Save Costs

Although not strictly an external attack, a decision to omit authentication in future Systems in order to save costs will have widely varying effects on different markets. In the case of high volume consumables, it is essential to remember that it is very difficult to introduce authentication after the market has started, as systems requiring authenticated consumables will not work with older consumables still in circulation. Likewise, it is impractical to discontinue authentication at any stage, as older Systems will not work with the new, unauthenticated, consumables. In the second case, older Systems can be individually altered by replacing the System Authentication Chip by a simple chip that has the same programming interface, but whose TST function always succeeds. Of course the System may be programmed to test for an always-succeeding TST function, and shut down. In the case of a specialized pairing, such as a car/car-keys, or door/door-key, or some other similar situation, the omission of authentication in future systems is trivial and non-repercussive. This is because the consumer is sold the entire set of System and Consumable Authentication Chips at the one time.

Garrote/Bribe Attack

This form of attack is only successful in one of two circumstances:

$K_1$, $K_2$, and R are already recorded by the chip-programmer, or the attacker can coerce future values of $K_1$, $K_2$, and R to be recorded.

If humans or computer systems external to the Programming Station do not know the keys, there is no amount of force or bribery that can reveal them. The level of security against this kind of attack is ultimately a decision for the System/Consumable owner, to be made according to the desired level of service. For example, a car company may wish to keep a record of all keys manufactured, so that a person can request a new key to be made for their car. However this allows the potential compromise of the entire key database, allowing an attacker to make keys for any of the manufacturer's existing cars. It does not allow an attacker to make keys for any new cars. Of course, the key database itself may also be encrypted with a further key that requires a certain number of people to combine their key portions together for access. If no record is kept of which key is used in a particular car, there is no way to make additional keys should one become lost. Thus an owner will have to replace his car's Authentication Chip and all his car-keys. This is not necessarily a bad situation. By contrast, in a consumable such as a printer ink cartridge, the one key combination is used for all Systems and all consumables. Certainly if no backup of the keys is kept, there is no human with knowledge of the key, and therefore no attack is possible. However, a no-backup situation is not desirable for a consumable such as ink cartridges, since if the key is lost no more consumables can be made. The manufacturer should therefore keep a backup of the key information in several parts, where a certain number of people must together combine their portions to reveal the full key information. This may be required if case the chip programming station needs to be reloaded. In any case, none of these attacks are against Protocol 3 itself, since no humans are involved in the authentication process. Instead, it is an attack against the programming stage of the chips.

HMAC-SHA1

The mechanism for authentication is the HMAC-SHA1 algorithm, acting on one of:

HMAC-SHA1 (R, $K_1$), or

HMAC-SHA1 (R|M, $K_1$)

We will now examine the HMAC-SHA1 algorithm in greater detail than covered so far, and describes an optimization of the algorithm that requires fewer memory resources than the original definition.

HMAC

The HMAC algorithm proceeds, given the following definitions:

H=the hash function (e.g. MD5 or SHA-1)

n=number of bits output from H (e.g. 160 for SHA-1, 128 bits for MD5)

M=the data to which the MAC function is to be applied

K=the secret key shared by the two parties ipad=0x36 repeated 64 times opad=0x5C repeated 64 times The HMAC algorithm is as follows:
1. Extend K to 64 bytes by appending 0x00 bytes to the end of K
2. XOR the 64 byte string created in (1) with ipad
3. Append data stream M to the 64 byte string created in (2)
4. Apply H to the stream generated in (3)
5. XOR the 64 byte string created in (1) with opad
6. Append the H result from (4) to the 64 byte string resulting from (5)
7. Apply H to the output of (6) and output the result Thus:

$$HMAC[M]=H[(K \oplus opad)|H[(K \oplus ipad)|M]]$$

HMAC-SHA1 algorithm is simply HMAC with H=SHA-1.

SHA-1

The SHA1 hashing algorithm is defined in the algorithm as summarized here.

Nine 32-bit constants are defined. There are 5 constants used to initialize the chaining variables, and there are 4 additive constants.

| Initial Chaining Values | | Additive Constants | |
|---|---|---|---|
| $h_1$ | 0x67452301 | $y_1$ | 0x5A827999 |
| $h_2$ | 0xEFCDAB89 | $y_2$ | 0x6ED9EBA1 |
| $h_3$ | 0x98BADCFE | $y_3$ | 0x8F1BBCDC |
| $h_4$ | 0x10325476 | $y_4$ | 0xCA62C1D6 |
| $h_5$ | 0xC3D2E1F0 | | |

Non-optimized SHA-1 requires a total of 2912 bits of data storage:

Five 32-bit chaining variables are defined: $H_1$, $H_2$, $H_3$, $H_4$ and $H_5$.
Five 32-bit working variables are defined: A, B, C, D, and E.
One 32-bit temporary variable is defined: t.
Eighty 32-bit temporary registers are defined: $X_{0-79}$.
The following functions are defined for SHA-1:

| Symbolic Nomenclature | Description |
|---|---|
| + | Addition modulo $2^{32}$ |
| X↺Y | Result of rotating X left through Y bit positions |
| f(X, Y, Z) | (X ∧ Y) ∨ (~X ∧ Z) |
| g(X, Y, Z) | (X ∧ Y) ∨ (X ∧ Z) ∨ (Y ∧ Z) |
| h(X, Y, Z) | X ⊕ Y ⊕ Z |

The hashing algorithm consists of firstly padding the input message to be a multiple of 512 bits and initializing the chaining variables $H_{1-5}$ with $h_{1-5}$. The padded message is then processed in 512-bit chunks, with the output hash value being the final 160-bit value given by the concatenation of the chaining variables: $H_1|H_2|H_3|H_5$. The steps of the SHA-1 algorithm are now examined in greater detail.

Step 1. Preprocessing

The first step of SHA-1 is to pad the input message to be a multiple of 512 bits as follows and to initialize the chaining variables.

| Steps to follow to preprocess the input message | |
|---|---|
| Pad the input message | Append a 1 bit to the message Append 0 bits such that the length of the padded message is 64-bits short of a multiple of 512 bits. Append a 64-bit value containing the length in bits of the original input message. Store the length as most significant bit through to least significant bit. |
| Initialize the chaining variables | $H_1 \leftarrow h_1, H_2 \leftarrow h_2, H_3 \leftarrow h_3,$ $H_4 \leftarrow h_4, H_5 \leftarrow h_5$ |

Step 2. Processing

The padded input message can now be processed. We process the message in 512-bit blocks. Each 512-bit block is in the form of 16×32-bit words, referred to as $InputWord_{0-15}$.

| Steps to follow for each 512 bit block ($InputWord_{0-15}$) | |
|---|---|
| Copy the 512 input bits into $X_{0-15}$ | For j=0 to 15<br>$X_j$ = $InputWord_j$ |
| Expand $X_{0-15}$ into $X_{16-79}$ | For j=16 to 79<br>$X_j \leftarrow ((X_{j-3} \oplus X_{j-8} \oplus X_{j-14} \oplus X_{j-16})$ ↺1) |
| Initialize working variables | $A \leftarrow H_1, B \leftarrow H_2, C \leftarrow H_3, D \leftarrow H_4,$ $E \leftarrow H_5$ |
| Round 1 | For j=0 to 19<br>$t \leftarrow ((A↺5) + f(B, C, D) + E + X_j + y_1)$<br>$E \leftarrow D, D \leftarrow C, C \leftarrow (B↺30), B \leftarrow A,$<br>$A \leftarrow t$ |
| Round 2 | For j = 20 to 39<br>$t \leftarrow ((A↺5) + h(B, C, D) + E + X_j + y_2)$<br>$E \leftarrow D, D \leftarrow C, C \leftarrow (B↺30), B \leftarrow A,$<br>$A \leftarrow t$ |
| Round 3 | For j = 40 to 59<br>$t \leftarrow ((A↺5) + g(B, C, D) + E + X_j + y_3)$<br>$E \leftarrow D, D \leftarrow C, C \leftarrow (B↺30), B \leftarrow A,$<br>$A \leftarrow t$ |
| Round 4 | For j = 60 to 79<br>$t \leftarrow ((A↺5) + h(B, C, D) + E + X_j + y_4)$<br>$E \leftarrow D, D \leftarrow C, C \leftarrow (B↺30), B \leftarrow A,$<br>$A \leftarrow t$ |
| Update chaining variables | $H_1 \leftarrow H_1 + A, H_2 \leftarrow H_2 + B,$<br>$H_3 \leftarrow H_3 + C, H_4 \leftarrow H_4 + D,$<br>$H_5 \leftarrow H_5 + E$ |

Step 3. Completion

After all the 512-bit blocks of the padded input message have been processed, the output hash value is the final 160-bit value given by: $H_1|H_2|H_3|H_4|H_5$.

Optimization for Hardware Implementation

The SHA-1 Step 2 procedure is not optimized for hardware. In particular, the 80 temporary 32-bit registers use up valuable silicon on a hardware implementation. This section describes an optimization to the SHA-1 algorithm that only uses 16 temporary registers. The reduction in silicon is from 2560 bits down to 512 bits, a saving of over 2000 bits. It may not be important in some applications, but in the Authentication Chip storage space must be reduced where possible. The optimization is based on the fact that although the original 16-word message block is expanded into an 80-word message block, the 80 words are not updated during the algorithm. In addition, the words rely on the previous 16 words only, and hence the expanded words can be calculated on-the-fly during processing, as long as we keep 16 words for the backward references. We require rotating counters to keep track of which register we are up to using, but the effect is to save a large amount of storage. Rather than index X by a single value j, we use a 5 bit counter to count through the iterations. This can be achieved by initializing a 5-bit register with either 16 or 20, and decrementing it until it reaches 0. In order to update the 16 temporary variables as if they were 80, we require 4 indexes, each a 4-bit register. All 4 indexes increment (with wraparound) during the course of the algorithm.

| Steps to follow for each 512 bit block (InputWord$_{0-15}$) | |
|---|---|
| Initialize working variables | $A \leftarrow H_1, B \leftarrow H_2, C \leftarrow H_3, D \leftarrow H_4,$ $E \leftarrow H_5$ $N_1 \leftarrow 13, N_2 \leftarrow 8, N_3 \leftarrow 2, N_4 \leftarrow 0$ |
| Round 0 Copy the 512 input bits into X$_{0-15}$ | Do 16 times: $X_{N4} = InputWord_{N4}$ [⇑$N_1$, ⇑$N_2$, ⇑$N_3$]$_{optional}$ ⇑$N_4$ |
| Round 1A | Do 16 times: $t \leftarrow ((A \circlearrowleft 5) + f(B, C, D) + E + X_{N4} + y_1)$ [⇑$N_1$, ⇑$N_2$, ⇑$N_3$]$_{optional}$ ⇑$N_4$ $E \leftarrow D, D \leftarrow C, C \leftarrow (B \circlearrowleft 30), B \leftarrow A,$ $A \leftarrow t$ |
| Round 1B | Do 4 times: $X_{N4} \leftarrow ((X_{N1} \oplus X_{N2} \oplus X_{N3} \oplus X_{N4}) \circlearrowleft 1)$ $t \leftarrow ((A \circlearrowleft 5) + f(B, C, D) + E + X_{N4} + y_1)$ ⇑$N_1$, ⇑$N_2$, ⇑$N_3$, ⇑$N_4$ $E \leftarrow D, D \leftarrow C, C \leftarrow (B \circlearrowleft 30), B \leftarrow A,$ $A \leftarrow t$ |
| Round 2 | Do 20 times: $X_{N4} \leftarrow ((X_{N1} \oplus X_{N2} \oplus X_{N3} \oplus X_{N4}) \circlearrowleft 1)$ $t \leftarrow ((A \circlearrowleft 5) + h(B, C, D) + E + X_{N4} + y_2)$ ⇑$N_1$, ⇑$N_2$, ⇑$N_3$, ⇑$N_4$ $E \leftarrow D, D \leftarrow C, C \leftarrow (B \circlearrowleft 30), B \leftarrow A,$ $A \leftarrow t$ |
| Round 3 | Do 20 times: $X_{N4} \leftarrow ((X_{N1} \oplus X_{N2} \oplus X_{N3} \oplus X_{N4}) \circlearrowleft 1)$ $t \leftarrow ((A \circlearrowleft 5) + g(B, C, D) + E + X_{N4} + y_3)$ ⇑$N_1$, ⇑$N_2$, ⇑$N_3$, ⇑$N_4$ $E \leftarrow D, D \leftarrow C, C \leftarrow (B \circlearrowleft 30), B \leftarrow A,$ $A \leftarrow t$ |
| Round 4 | Do 20 times: $X_{N4} \leftarrow ((X_{N1} \oplus X_{N2} \oplus X_{N3} \oplus X_{N4}) \circlearrowleft 1)$ $t \leftarrow ((A \circlearrowleft 5) + h(B, C, D) + E + X_{N4} + y_4)$ ⇑$N_1$, ⇑$N_2$, ⇑$N_3$, ⇑$N_4$ $E \leftarrow D, D \leftarrow C, C \leftarrow (B \circlearrowleft 30), B \leftarrow A,$ $A \leftarrow t$ |
| Update chaining variables | $H_1 \leftarrow H_1 + A, H_2 \leftarrow H_2 + B,$ $H_3 \leftarrow H_3 + C, H_4 \leftarrow H_4 + D,$ $H_5 \leftarrow H_5 + E$ |

The incrementing of $N_1$, $N_2$, and $N_3$ during Rounds 0 and 1A is optional. A software implementation would not increment them, since it takes time, and at the end of the 16 times through the loop, all 4 counters will be their original values. Designers of hardware may wish to increment all 4 counters together to save on control logic. Round 0 can be completely omitted if the caller loads the 512 bits of $X_{0-15}$.

HMAC-SHA1

In the Authentication Chip implementation, the HMAC-SHA1 unit only ever performs hashing on two types of inputs: on R using $K_1$ and on R|M using $K_2$. Since the inputs are two constant lengths, rather than have HMAC and SHA-1 as separate entities on chip, they can be combined and the hardware optimized. The padding of messages in SHA-1 Step 1 (a 1 bit, a string of 0 bits, and the length of the message) is necessary to ensure that different messages will not look the same after padding. Since we only deal with 2 types of messages, our padding can be constant 0s. In addition, the optimized version of the SHA-1 algorithm is used, where only 16 32-bit words are used for temporary storage. These 16 registers are loaded directly by the optimized HMAC-SHA1 hardware. The Nine 32-bit constants $h_{1-5}$ and $y_{1-4}$ are still required, although the fact that they are constants is an advantage for hardware implementation. Hardware optimized HMAC-SHA-1 requires a total of 1024 bits of data storage:

Five 32-bit chaining variables are defined: $H_1$, $H_2$, $H_3$, $H_4$ and $H_5$.

Five 32-bit working variables are defined: A, B, C, D, and E.

Five 32-bit variables for temporary storage and final result: Buff160$_{1-5}$

One 32 bit temporary variable is defined: t.

Sixteen 32-bit temporary registers are defined: $X_{0-15}$.

The following two sections describe the steps for the two types of calls to HMAC-SHA1.

H[R, $K_1$]

In the case of producing the keyed hash of R using $K_1$, the original input message R is a constant length of 160 bits. We can therefore take advantage of this fact during processing. Rather than load $X_{0-15}$ during the first part of the SHA-1 algorithm, we load $X_{0-15}$ directly, and thereby omit Round 0 of the optimized Process Block (Step 2) of SHA-1. The pseudocode takes on the following steps:

| Step | Description | Action |
|---|---|---|
| 1 | Process K ⊕ ipad | $X_{0-4} \leftarrow K_1 \oplus 0x363636\ldots$ |
| 2 | | $X_{5-15} \leftarrow 0x363636\ldots$ |
| 3 | | $H_{1-5} \leftarrow h_{1-5}$ |
| 4 | | Process Block |
| 5 | Process R | $X_{0-4} \leftarrow R$ |
| 6 | | $X_{5-15} \leftarrow 0$ |
| 7 | | Process Block |
| 8 | | Buff160$_{1-5} \leftarrow H_{1-5}$ |
| 9 | Process K ⊕ opad | $X_{0-4} \leftarrow K_1 \oplus 0x5C5C5C\ldots$ |
| 10 | | $X_{5-15} \leftarrow 0x5C5C5C\ldots$ |
| 11 | | $H_{1-5} \leftarrow h_{1-5}$ |
| 12 | | Process Block |
| 13 | Process previous H[x] | $X_{0-4} \leftarrow$ Result |
| 14 | | $X_{5-15} \leftarrow 0$ |
| 15 | | Process Block |
| 16 | Get results | Buff160$_{1-5} \leftarrow H_{1-5}$ |

H[R|M, $K_2$]

In the case of producing the keyed hash of R|M using $K_2$, the original input message is a constant length of 416 (256+160) bits. We can therefore take advantage of this fact during processing. Rather than load $X_{0-15}$ during the first part of the SHA-1 algorithm, we load $X_{0-15}$ directly, and thereby omit Round 0 of the optimized Process Block (Step 2) of SHA-1. The pseudocode takes on the following steps:

| Step | Description | Action |
|---|---|---|
| 1 | Process K ⊕ ipad | $X_{0-4} \leftarrow K_2 \oplus 0x363636\ldots$ |
| 2 | | $X_{5-15} \leftarrow 0x363636\ldots$ |
| 3 | | $H_{1-5} \leftarrow h_{1-5}$ |
| 4 | | Process Block |
| 5 | Process R | M | $X_{0-4} \leftarrow R$ |
| 6 | | $X_{5-12} \leftarrow M$ |
| 7 | | $X_{13-15} \leftarrow 0$ |
| 8 | | Process Block |
| 9 | | Temp $\leftarrow H_{1-5}$ |
| 10 | Process K ⊕ opad | $X_{0-4} \leftarrow K_2 \oplus 0x5C5C5C\ldots$ |
| 11 | | $X_{5-15} \leftarrow 0x5C5C5C\ldots$ |
| 12 | | $H_{1-5} \leftarrow h_{1-5}$ |
| 13 | | Process Block |
| 14 | Process previous H[x] | $X_{0-4} \leftarrow$ Temp |
| 15 | | $X_{5-15} \leftarrow 0$ |
| 16 | | Process Block |
| 17 | Get results | Result $\leftarrow H_{1-5}$ |

Data Storage Integrity

Each Authentication Chip contains some non-volatile memory in order to hold the variables required by Authentication Protocol 3. The following non-volatile variables are defined:

| Variable Name | Size (in bits) | Description |
| --- | --- | --- |
| M[0...15] | 256 | 16 words (each 16 bits) containing state data such as serial numbers, media remaining etc. |
| $K_1$ | 160 | Key used to transform R during authentication. |
| $K_2$ | 160 | Key used to transform M during authentication. |
| R | 160 | Current random number |
| AccessMode [0...15] | 32 | The 16 sets of 2-bit AccessMode values for M[n]. |
| MinTicks | 32 | The minimum number of clock ticks between calls to key-based functions |
| SIWritten | 1 | If set, the secret key information ($K_1$, $K_2$, and R) has been written to the chip. If clear, the secret information has not been written yet. |
| IsTrusted | 1 | If set, the RND and TST functions can be called, but RD and WR functions cannot be called. If clear, the RND and TST functions cannot be called, but RD and WR functions can be called. |
| Total bits | 802 | |

Note that if these variables are in Flash memory, it is not a simple matter to write a new value to replace the old. The memory must be erased first, and then the appropriate bits set. This has an effect on the algorithms used to change Flash memory based variables. For example, Flash memory cannot easily be used as shift registers. To update a Flash memory variable by a general operation, it is necessary to follow these steps:

Read the entire N bit value into a general purpose register;

Perform the operation on the general purpose register;

Erase the Flash memory corresponding to the variable; and

Set the bits of the Flash memory location based on the bits set in the general-purpose register.

A RESET of the Authentication Chip has no effect on these non-volatile variables.

M and AccessMode

Variables M[0] through M[15] are used to hold consumable state data, such as serial numbers, batch numbers, and amount of consumable remaining. Each M[n] register is 16 bits, making the entire M vector 256 bits (32 bytes). Clients cannot read from or written to individual M[n] variables. Instead, the entire vector, referred to as M, is read or written in a single logical access. M can be read using the RD (read) command, and written to via the WR (write) command. The commands only succeed if $K_1$ and $K_2$ are both defined (SIWritten=1) and the Authentication Chip is a consumable non-trusted chip (IsTrusted=0). Although M may contain a number of different data types, they differ only in their write permissions. Each data type can always be read. Once in client memory, the 256 bits can be interpreted in any way chosen by the client. The entire 256 bits of M are read at one time instead of in smaller amounts for reasons of security, as described in the chapter entitled Authentication. The different write permissions are outlined in the following table:

| Data Type | Access Note |
| --- | --- |
| Read Only | Can never be written to |
| Read Write | Can always be written to |
| Decrement Only | Can only be written to if the new value is less than the old value. Decrement Only values are typically 16-bit or 32-bit values, but can be any multiple of 16 bits. |

To accomplish the protection required for writing, a 2-bit access mode value is defined for each M[n]. The following table defines the interpretation of the 2-bit access mode bit-pattern:

| Bits | Op | Interpretation | Action taken during Write command |
| --- | --- | --- | --- |
| 00 | RW | ReadWrite | The new 16-bit value is always written to M[n]. |
| 01 | MSR | Decrement Only (Most Significant Region) | The new 16-bit value is only written to M[n] if it is less than the value currently in M[n]. This is used for access to the Most Significant 16 bits of a Decrement Only number. |
| 10 | NMSR | Decrement Only (Not the Most Significant Region) | The new 16-bit value is only written to M[n] if M[n+1] can also be written. The NMSR access mode allows multiple precision values of 32 bits and more (multiples of 16 bits) to decrement. |
| 11 | RO | Read Only | The new 16-bit value is ignored. M[n] is left unchanged. |

The 16 sets of access mode bits for the 16 M[n] registers are gathered together in a single 32-bit AccessMode register. The 32 bits of the AccessMode register correspond to M[n] with n as follows:

| MSB | | | | | | | | | | | | | | | LSB |
| --- | --- | --- | --- | --- | --- | --- | --- | --- | --- | --- | --- | --- | --- | --- | --- |
| 15 | 14 | 13 | 12 | 10 | 11 | 10 | 9 | 8 | 7 | 6 | 5 | 4 | 2 | 1 | 0 |

Each 2-bit value is stored in hi/lo format. Consequently, if M[0-5] were access mode MSR, with M[6-15] access mode RO, the 32-bit AccessMode register would be:

11-11-11-11-11-11-11-11-11-11-01-01-01-01-01-01

During execution of a WR (write) command, AccessMode [n] is examined for each M[n], and a decision made as to whether the new M[n] value will replace the old. The AccessMode register is set using the Authentication Chip's SAM (Set Access Mode) command. Note that the Decrement Only comparison is unsigned, so any Decrement Only values that require negative ranges must be shifted into a positive range. For example, a consumable with a Decrement Only data item range of −50 to 50 must have the range shifted to be 0 to 100. The System must then interpret the range 0 to 100 as being −50 to 50. Note that most instances of Decrement Only ranges are N to 0, so there is no range shift required. For Decrement Only data items, arrange the data in order from most significant to least significant 16-bit quantities from M[n] onward. The access mode for the most significant 16 bits (stored in M[n]) should be set to MSR. The remaining registers (M[n+1], M[n+2] etc) should have their access modes set to NMSR. If erroneously set to NMSR, with no associated MSR region, each NMSR region will be considered independently instead of being a multi-precision comparison.

$K_1$ $K_1$ is the 160-bit secret key used to transform R during the authentication protocol. $K_1$ is programmed along with $K_2$ and R with the SSI (Set Secret Information) command. Since $K_1$ must be kept secret, clients cannot directly read $K_1$. The commands that make use of $K_1$ are RND and RD. RND returns a pair R, $F_{K1}[R]$ where R is a random number, while RD requires an X, $F_{K1}[X]$ pair as input. $K_1$ is used in the keyed one-way hash function HMAC-SHA1. As such it should be programmed with a physically generated random number, gathered from a physically random phenomenon. $K_1$ must NOT be generated with a computer-run random number generator. The security of the Authentication chips depends on $K_1$, $K_2$ and R being generated in a way that is not deterministic. For example, to set $K_1$, a person can toss a fair coin 160 times, recording heads as 1, and tails as 0. $K_1$ is automatically cleared to 0 upon execution of a CLR command. It can only be programmed to a non-zero value by the SSI command.

$K_2$ $K_2$ is the 160-bit secret key used to transform M|R during the authentication protocol. $K_2$ is programmed along with $K_1$ and R with the SSI (Set Secret Information) command. Since $K_2$ must be kept secret, clients cannot directly read $K_2$. The commands that make use of $K_2$ are RD and TST. RD returns a pair M, $F_{K2}[M|X]$ where X was passed in as one of the parameters to the RD function. TST requires an M, $F_{K2}[M|R]$ pair as input, where R was obtained from the Authentication Chip's RND function. $K_2$ is used in the keyed one-way hash function HMAC-SHA1. As such it should be programmed with a physically generated random number, gathered from a physically random phenomenon. $K_2$ must NOT be generated with a computer-run random number generator. The security of the Authentication chips depends on $K_1$, $K_2$ and R being generated in a way that is not deterministic. For example, to set $K_2$, a person can toss a fair coin 160 times, recording heads as 1, and tails as 0. $K_2$ is automatically cleared to 0 upon execution of a CLR command. It can only be programmed to a non-zero value by the SSI command.

R and IsTrusted

R is a 160-bit random number seed that is programmed along with $K_1$ and $K_2$ with the SSI (Set Secret Information) command. R does not have to be kept secret, since it is given freely to callers via the RND command. However R must be changed only by the Authentication Chip, and not set to any chosen value by a caller. R is used during the TST command to ensure that the R from the previous call to RND was used to generate the $F_{K2}[M|R]$ value in the non-trusted Authentication Chip (ChipA). Both RND and TST are only used in trusted Authentication Chips (ChipT).

IsTrusted is a 1-bit flag register that determines whether or not the Authentication Chip is a trusted chip (ChipT):
- If the IsTrusted bit is set, the chip is considered to be a trusted chip, and hence clients can call RND and TST functions (but not RD or WR).
- If the IsTrusted bit is clear, the chip is not considered to be trusted. Therefore RND and TST functions cannot be called (but RD and WR functions can be called instead). System never needs to call RND or TST on the consumable (since a clone chip would simply return 1 to a function such as TST, and a constant value for RND).

The IsTrusted bit has the added advantage of reducing the number of available R, $F_{K1}[R]$ pairs obtainable by an attacker, yet still maintain the integrity of the Authentication protocol.

To obtain valid R, $F_{K1}[R]$ pairs, an attacker requires a System Authentication Chip, which is more expensive and less readily available than the consumables. Both R and the IsTrusted bit are cleared to 0 by the CLR command. They are both written to by the issuing of the SSI command. The IsTrusted bit can only set by storing a non-zero seed value in R via the SSI command (R must be non-zero to be a valid LFSR state, so this is quite reasonable). R is changed via a 160-bit maximal period LFSR with taps on bits 1, 2, 4, and 159, and is changed only by a successful call to TST (where 1 is returned).

Authentication Chips destined to be trusted Chips used in Systems (ChipT) should have their IsTrusted bit set during programming, and Authentication Chips used in Consumables (ChipA) should have their IsTrusted bit kept clear (by storing 0 in R via the SSI command during programming). There is no command to read or write the IsTrusted bit directly. The security of the Authentication Chip does not only rely upon the randomness of $K_1$ and $K_2$ and the strength of the HMAC-SHA1 algorithm. To prevent an attacker from building a sparse lookup table, the security of the Authentication Chip also depends on the range of R over the lifetime of all Systems. What this means is that an attacker must not be able to deduce what values of R there are in produced and future Systems. As such R should be programmed with a physically generated random number, gathered from a physically random phenomenon. R must NOT be generated with a computer-run random number generator. The generation of R must not be deterministic. For example, to generate an R for use in a trusted System chip, a person can toss a fair coin 160 times, recording heads as 1, and tails as 0.0 is the only non-valid initial value for a trusted R is 0 (or the IsTrusted bit will not be set).

SIWritten

The SIWritten (Secret Information Written) 1-bit register holds the status of the secret information stored within the Authentication Chip. The secret information is $K_1$, $K_2$ and R. A client cannot directly access the SIWritten bit. Instead, it is cleared via the CLR command (which also clears $K_1$, $K_2$ and R). When the Authentication Chip is programmed with secret keys and random number seed using the SSI command (regardless of the value written), the SIWritten bit is set automatically. Although R is strictly not secret, it must be written together with $K_1$ and $K_2$ to ensure that an attacker cannot generate their own random number seed in order to obtain chosen R, $F_{K1}[R]$ pairs. The SIWritten status bit is used by all functions that access $K_1$, $K_2$, or R. If the SIWritten bit is clear, then calls to RD, WR, RND, and TST are interpreted as calls to CLR.

MinTicks

There are two mechanisms for preventing an attacker from generating multiple calls to TST and RD functions in a short period of time. The first is a clock limiting hardware component that prevents the internal clock from operating at a speed more than a particular maximum (e.g. 10 MHz). The second mechanism is the 32-bit MinTicks register, which is used to specify the minimum number of clock ticks that must elapse between calls to key-based functions. The MinTicks variable is cleared to 0 via the CLR command. Bits can then be set via the SMT (Set MinTicks) command. The input parameter to SMT contains the bit pattern that represents which bits of MinTicks are to be set. The practical effect is that an attacker can only increase the value in MinTicks (since the SMT function only sets bits). In addition, there is no function provided to allow a caller to read the current value of this register. The value of MinTicks depends on the operating clock speed and the notion of what constitutes a reasonable time between key-based function calls (application specific). The duration of a single tick depends on the operating clock speed. This is the maximum of the input clock speed and the Authentication Chip's clock-limiting hardware. For example, the Authentication Chip's clock-limiting hardware may be set at 10 MHz (it is not changeable), but the input clock is 1 MHz. In this case, the value of 1 tick is based on 1 MHz, not 10 MHz. If the input clock was 20 MHz instead of 1 MHz, the value of 1 tick is based on 10 MHz (since the clock speed is limited to 10 MHz).

Once the duration of a tick is known, the MinTicks value can to be set. The value for MinTicks is the minimum number of ticks required to pass between calls to the key-based RD and TST functions. The value is a real-time number, and divided by the length of an operating tick. Suppose the input clock speed matches the maximum clock speed of 10 MHz. If we want a minimum of 1 second between calls to key based functions, the value for MinTicks is set to 10,000,000. Consider an attacker attempting to collect X, $F_{K1}[X]$ pairs by calling RND, RD and TST multiple times. If the MinTicks value is set such that the amount of time between calls to TST is 1 second, then each pair requires 1 second to generate. To generate 225 pairs (only requiring 1.25 GB of storage), an attacker requires more than 1 year. An attack requiring 264 pairs would require $5.84 \times 10^{11}$ years using a single chip, or 584 years if 1 billion chips were used, making such an attack completely impractical in terms of time (not to mention the storage requirements!).

With regards to $K_1$, it should be noted that the MinTicks variable only slows down an attacker and causes the attack to cost more since it does not stop an attacker using multiple System chips in parallel. However MinTicks does make an attack on $K_2$ more difficult, since each consumable has a different M (part of M is random read-only data). In order to launch a differential attack, minimally different inputs are required, and this can only be achieved with a single consumable (containing an effectively constant part of M). Minimally different inputs require the attacker to use a single chip, and MinTicks causes the use of a single chip to be slowed down. If it takes a year just to get the data to start searching for values to begin a differential attack this increases the cost of attack and reduces the effective market time of a clone consumable.

Authentication Chip Commands

The System communicates with the Authentication Chips via a simple operation command set. This section details the actual commands and parameters necessary for implementation of Protocol 3. The Authentication Chip is defined here as communicating to System via a serial interface as a minimum implementation. It is a trivial matter to define an equivalent chip that operates over a wider interface (such as 8, 16 or 32 bits). Each command is defined by 3-bit opcode. The interpretation of the opcode can depend on the current value of the IsTrusted bit and the current value of the IsWritten bit. The following operations are defined:

| Op  | T | W | Mn  | Input           | Output      | Description           |
|-----|---|---|-----|-----------------|-------------|-----------------------|
| 000 | — | — | CLR | —               | —           | Clear                 |
| 001 | 0 | 0 | SSI | [160, 160, 160] | —           | Set Secret Information|
| 010 | 0 | 1 | RD  | [160, 160]      | [256, 160]  | Read M securely       |
| 010 | 1 | 1 | RND | —               | [160, 160]  | Random                |
| 011 | 0 | 1 | WR  | [256]           | —           | Write M               |
| 011 | 1 | 1 | TST | [256, 160]      | [1]         | Test                  |

-continued

| Op  | T | W | Mn  | Input | Output | Description     |
|-----|---|---|-----|-------|--------|-----------------|
| 100 | 0 | 1 | SAM | [32]  | [32]   | Set Access Mode |
| 101 | — | 1 | GIT | —     | [1]    | Get Is Trusted  |
| 110 | — | 1 | SMT | [32]  | —      | Set MinTicks    |

Op = Opcode,
T = IsTrusted value,
W = IsWritten value,
Mn = Mnemonic,
[n]= number of bits required for parameter Any command not defined in this table is interpreted as NOP (No Operation). Examples include opcodes 110 and 111 (regardless of IsTrusted or IsWritten values), and any opcode other than SSI when IsWritten=0. Note that the opcodes for RD and RND are the same, as are the opcodes for WR and TST. The actual command run upon receipt of the opcode will depend on the current value of the IsTrusted bit (as long as IsWritten is 1). Where the IsTrusted bit is clear, RD and WR functions will be called. Where the IsTrusted bit is set, RND and TST functions will be called. The two sets of commands are mutually exclusive between trusted and non-trusted Authentication Chips, and the same opcodes enforces this relationship. Each of the commands is examined in detail in the subsequent sections. Note that some algorithms are specifically designed because Flash memory is assumed for the implementation of non-volatile variables.

| CLR     | Clear |
|---------|-------|
| Input   | None  |
| Output  | None  |
| Changes | All   |

The CLR (Clear) Command is designed to completely erase the contents of all Authentication Chip memory. This includes all keys and secret information, access mode bits, and state data. After the execution of the CLR command, an Authentication Chip will be in a programmable state, just as if it had been freshly manufactured. It can be reprogrammed with a new key and reused. A CLR command consists of simply the CLR command opcode. Since the Authentication Chip is serial, this must be transferred one bit at a time. The bit order is LSB to MSB for each command component. A CLR command is therefore sent as bits 0-2 of the CLR opcode. A total of 3 bits are transferred. The CLR command can be called directly at any time. The order of erasure is important. SIWritten must be cleared first, to disable further calls to key access functions (such as RND, TST, RD and WR). If the AccessMode bits are cleared before SIWritten, an attacker could remove power at some point after they have been cleared, and manipulate M, thereby have a better chance of retrieving the secret information with a partial chosen text attack. The CLR command is implemented with the following steps:

| Step | Action                                                              |
|------|---------------------------------------------------------------------|
| 1    | Erase SIWritten  Erase IsTrusted  Erase $K_1$  Erase $K_2$  Erase R  Erase M |

| Step | Action |
|---|---|
| 2 | Erase AccessMode |
|   | Erase MinTicks |

Once the chip has been cleared it is ready for reprogramming and reuse. A blank chip is of no use to an attacker, since although they can create any value for M (M can be read from and written to), key-based functions will not provide any information as $K_1$ and $K_2$ will be incorrect. It is not necessary to consume any input parameter bits if CLR is called for any opcode other than CLR. An attacker will simply have to RESET the chip. The reason for calling CLR is to ensure that all secret information has been destroyed, making the chip useless to an attacker.

SSI—Set Secret Information

| Input: | $K_1$, $K_2$, R = [160 bits, 160 bits, 160 bits] |
|---|---|
| Output: | None |
| Changes: | $K_1$, $K_2$, R, SIWritten, IsTrusted |

The SSI (Set Secret Information) command is used to load the $K_1$, $K_2$ and R variables, and to set SIWritten and IsTrusted flags for later calls to RND, TST, RD and WR commands. An SSI command consists of the SSI command opcode followed by the secret information to be stored in the $K_1$, $K_2$ and R registers. Since the Authentication Chip is serial, this must be transferred one bit at a time. The bit order is LSB to MSB for each command component. An SSI command is therefore sent as: bits 0-2 of the SSI opcode, followed by bits 0-159 of the new value for $K_1$, bits 0-159 of the new value for $K_2$, and finally bits 0-159 of the seed value for R. A total of 483 bits are transferred. The $K_1$, $K_2$, R, SIWritten, and IsTrusted registers are all cleared to 0 with a CLR command. They can only be set using the SSI command.

The SSI command uses the flag SIWritten to store the fact that data has been loaded into $K_1$, $K_2$, and R. If the SIWritten and IsTrusted flags are clear (this is the case after a CLR instruction), then $K_1$, $K_2$ and R are loaded with the new values. If either flag is set, an attempted call to SSI results in a CLR command being executed, since only an attacker or an erroneous client would attempt to change keys or the random seed without calling CLR first. The SSI command also sets the IsTrusted flag depending on the value for R. If R=0, then the chip is considered untrustworthy, and therefore IsTrusted remains at 0. If R≠0, then the chip is considered trustworthy, and therefore IsTrusted is set to 1. Note that the setting of the IsTrusted bit only occurs during the SSI command. If an Authentication Chip is to be reused, the CLR command must be called first. The keys can then be safely reprogrammed with an SSI command, and fresh state information loaded into M using the SAM and WR commands. The SSI command is implemented with the following steps:

| Step | Action |
|---|---|
| 1 | CLR |
| 2 | $K_1$ ← Read 160 bits from client |
| 3 | $K_2$ ← Read 160 bits from client |
| 4 | R ← Read 160 bits from client |
| 5 | IF (R ≠ 0) |
|   |    IsTrusted ← 1 |
| 6 | SIWritten ← 1 |

RD—Read

| Input: | X, $F_{K1}[X]$ = [160 bits, 160 bits] |
|---|---|
| Output: | M, $F_{K2}[X | M]$ = [256 bits, 160 bits] |
| Changes: | R |

The RD (Read) command is used to securely read the entire 256 bits of state data (M) from a non-trusted Authentication Chip. Only a valid Authentication Chip will respond correctly to the RD request. The output bits from the RD command can be fed as the input bits to the TST command on a trusted Authentication Chip for verification, with the first 256 bits (M) stored for later use if (as we hope) TST returns 1. Since the Authentication Chip is serial, the command and input parameters must be transferred one bit at a time. The bit order is LSB to MSB for each command component. A RD command is therefore: bits 0-2 of the RD opcode, followed by bits 0-159 of X, and bits 0-159 of $F_{K1}[X]$. 323 bits are transferred in total. X and $F_{K1}[X]$ are obtained by calling the trusted Authentication Chip's RND command. The 320 bits output by the trusted chip's RND command can therefore be fed directly into the non-trusted chip's RD command, with no need for these bits to be stored by System. The RD command can only be used when the following conditions have been met:

| SIWritten = 1 | indicating that $K_1$, $K_2$ and R have been set up via the SSI command; and |
|---|---|
| IsTrusted = 0 | indicating the chip is not trusted since it is not permitted to generate random number sequences; |

In addition, calls to RD must wait for the MinTicksRemaining register to reach 0. Once it has done so, the register is reloaded with MinTicks to ensure that a minimum time will elapse between calls to RD. Once MinTicksRemaining has been reloaded with MinTicks, the RD command verifies that the input parameters are valid. This is accomplished by internally generating $F_{K1}[X]$ for the input X, and then comparing the result against the input $F_{K1}[X]$. This generation and comparison must take the same amount of time regardless of whether the input parameters are correct or not. If the times are not the same, an attacker can gain information about which bits of $F_{K1}[X]$ are incorrect. The only way for the input parameters to be invalid is an erroneous System (passing the wrong bits), a case of the wrong consumable in the wrong System, a bad trusted chip (generating bad pairs), or an attack on the Authentication Chip. A constant value of 0 is returned when the input parameters are wrong. The time taken for 0 to be returned must be the same for all bad inputs so that attackers can learn nothing about what was invalid. Once the input parameters have been verified the output values are calculated. The 256 bit content of M are transferred in the following order: bits 0-15 of M[0], bits 0-15 of M[1], through to bits 0-15 of M[15]. $F_{K2}[X|M]$ is calculated and output as bits 0-159. The R register is used to store the X value during the validation of the X, $F_{K1}[X]$ pair. This is because RND and RD are mutually exclusive. The RD command is implemented with the following steps:

| Step | Action |
|---|---|
| 1 | IF (MinTicksRemaining ≠ 0<br>    GOTO 1 |
| 2 | MinTicksRemaining ← MinTicks |
| 3 | R ← Read 160 bits from client |
| 4 | Hash ← Calculate $F_{K1}[R]$ |
| 5 | OK ← (Hash = next 160 bits from client)<br>Note that this operation must take constant time so an attacker cannot determine how much of their guess is correct. |
| 6 | IF (OK)<br>    Output 256 bits of M to client<br>ELSE<br>    Output 256 bits of 0 to client |
| 7 | Hash ← Calculate $F_{K2}[R \mid M]$ |
| 8 | IF (OK)<br>    Output 160 bits of Hash to client<br>ELSE<br>    Output 160 bits of 0 to client |

RND—Random

| | |
|---|---|
| Input: | None |
| Output: | R, $F_{K1}[R]$ = [160 bits, 160 bits] |
| Changes: | None |

The RND (Random) command is used by a client to obtain a valid R, $F_{K1}[R]$ pair for use in a subsequent authentication via the RD and TST commands. Since there are no input parameters, an RND command is therefore simply bits 0-2 of the RND opcode. The RND command can only be used when the following conditions have been met:

SIWritten=1 indicating $K_1$ and R have been set up via the SSI command;
IsTrusted=1 indicating the chip is permitted to generate random number sequences;

RND returns both R and $F_{K1}[R]$ to the caller. The 288-bit output of the RND command can be fed straight into the non-trusted chip's RD command as the input parameters. There is no need for the client to store them at all, since they are not required again. However the TST command will only succeed if the random number passed into the RD command was obtained first from the RND command. If a caller only calls RND multiple times, the same R, $F_{K1}[R]$ pair will be returned each time. R will only advance to the next random number in the sequence after a successful call to TST. See TST for more information. The RND command is implemented with the following steps:

| Step | Action |
|---|---|
| 1 | Output 160 bits of R to client |
| 2 | Hash ← Calculate $F_{K1}[R]$ |
| 3 | Output 160 bits of Hash to client |

TST—Test

| | |
|---|---|
| Input: | X, $F_{K2}[R \mid X]$ = [256 bits, 160 bits] |
| Output: | 1 or 0 = [1 bit] |
| Changes: | M, R and MinTicksRemaining (or all registers if attack detected) |

The TST (Test) command is used to authenticate a read of M from a non-trusted Authentication Chip. The TST (Test) command consists of the TST command opcode followed by input parameters: X and $F_{K2}[R \mid X]$. Since the Authentication Chip is serial, this must be transferred one bit at a time. The bit order is LSB to MSB for each command component. A TST command is therefore: bits 0-2 of the TST opcode, followed by bits 0-255 of M, bits 0-159 of $F_{K2}[R \mid M]$. 419 bits are transferred in total. Since the last 416 input bits are obtained as the output bits from a RD command to a non-trusted Authentication Chip, the entire data does not even have to be stored by the client. Instead, the bits can be passed directly to the trusted Authentication Chip's TST command. Only the 256 bits of M should be kept from a RD command. The TST command can only be used when the following conditions have been met:

SIWritten=1 indicating $K_2$ and R have been set up via the SSI command;
IsTrusted=1 indicating the chip is permitted to generate random number sequences;

In addition, calls to TST must wait for the MinTicksRemaining register to reach 0. Once it has done so, the register is reloaded with MinTicks to ensure that a minimum time will elapse between calls to TST. TST causes the internal M value to be replaced by the input M value. $F_{K2}[M \mid R]$ is then calculated, and compared against the 160 bit input hash value. A single output bit is produced: 1 if they are the same, and 0 if they are different. The use of the internal M value is to save space on chip, and is the reason why RD and TST are mutually exclusive commands. If the output bit is 1, R is updated to be the next random number in the sequence. This forces the caller to use a new random number each time RD and TST are called. The resultant output bit is not output until the entire input string has been compared, so that the time to evaluate the comparison in the TST function is always the same. Thus no attacker can compare execution times or number of bits processed before an output is given.

The next random number is generated from R using a 160-bit maximal period LFSR (tap selections on bits 159, 4, 2, and 1). The initial 160-bit value for R is set up via the SSI command, and can be any random number except 0 (an LFSR filled with 0s will produce a never-ending stream of 0s). R is transformed by XORing bits 1, 2, 4, and 159 together, and shifting all 160 bits right 1 bit using the XOR result as the input bit to $b_{159}$. The new R will be returned on the next call to RND. Note that the time taken for 0 to be returned from TST must be the same for all bad inputs so that attackers can learn nothing about what was invalid about the input.

The TST command is implemented with the following steps:

| Step | Action |
|---|---|
| 1 | IF (MinTicksRemaining ≠ 0<br>    GOTO 1 |
| 2 | MinTicksRemaining ← MinTicks |
| 3 | M ← Read 256 bits from client |
| 4 | IF (R = 0)<br>    GOTO CLR |
| 5 | Hash ← Calculate $F_{K2}[R \mid M]$ |
| 6 | OK ← (Hash = next 160 bits from client)<br>Note that this operation must take constant time so an attacker cannot determine how much of their guess is correct. |
| 7 | IF (OK)<br>    Temp ← R<br>    Erase R |

-continued

| Step | Action |
|---|---|
|  | Advance TEMP via LFSR |
|  | R ← TEMP |
| 8 | Output 1 bit of OK to client |

Note that we can't simply advance R directly in Step 7 since R is Flash memory, and must be erased in order for any set bit to become 0. If power is removed from the Authentication Chip during Step 7 after erasing the old value of R, but before the new value for R has been written, then R will be erased but not reprogrammed. We therefore have the situation of IsTrusted=1, yet R=0, a situation only possible due to an attacker. Step 4 detects this event, and takes action if the attack is detected. This problem can be avoided by having a second 160-bit Flash register for R and a Validity Bit, toggled after the new value has been loaded. It has not been included in this implementation for reasons of space, but if chip space allows it, an extra 160-bit Flash register would be useful for this purpose.

WR—Write

| Input: | $M_{new}$ = [256 bits] |
|---|---|
| Output: | None |
| Changes: | M |

A WR (Write) command is used to update the writeable parts of M containing Authentication Chip state data. The WR command by itself is not secure. It must be followed by an authenticated read of M (via a RD command) to ensure that the change was made as specified. The WR command is called by passing the WR command opcode followed by the new 256 bits of data to be written to M. Since the Authentication Chip is serial, the new value for M must be transferred one bit at a time. The bit order is LSB to MSB for each command component. A WR command is therefore: bits 0-2 of the WR opcode, followed by bits 0-15 of M[0], bits 0-15 of M[1], through to bits 0-15 of M[15]. 259 bits are transferred in total. The WR command can only be used when SIWritten=1, indicating that $K_1$, $K_2$ and R have been set up via the SSI command (if SIWritten is 0, then $K_1$, $K_2$ and R have not been setup yet, and the CLR command is called instead). The ability to write to a specific M[n] is governed by the corresponding Access Mode bits as stored in the AccessMode register. The AccessMode bits can be set using the SAM command. When writing the new value to M[n] the fact that M[n] is Flash memory must be taken into account. All the bits of M[n] must be erased, and then the appropriate bits set. Since these two steps occur on different cycles, it leaves the possibility of attack open. An attacker can remove power after erasure, but before programming with the new value. However, there is no advantage to an attacker in doing this:

A Read/Write M[n] changed to 0 by this means is of no advantage since the attacker could have written any value using the WR command anyway.

A Read Only M[n] changed to 0 by this means allows an additional known text pair (where the M[n] is 0 instead of the original value). For future use M[n] values, they are already 0, so no information is given.

A Decrement Only M[n] changed to 0 simply speeds up the time in which the consumable is used up. It does not give any new information to an attacker that using the consumable would give.

The WR command is implemented with the following steps:

| Step | Action |
|---|---|
| 1 | DecEncountered ← 0 |
|  | EqEncountered ← 0 |
|  | n ← 15 |
| 2 | Temp ← Read 16 bits from client |
| 3 | AM = AccessMode[~n] |
|  | Compare to the previous value |
| 4 | LT ← (Temp < M[~n]) [comparison is unsigned] |
|  | EQ ← (Temp = M[~n]) |
| 5 | WE ← (AM = RW) ∨ |
|  | ((AM = MSR) ∧ LT) ∨ |
|  | ((AM = NMSR) ∧ (DecEncountered ∨ LT)) |
| 6 | DecEncountered ← ((AM = MSR) ∧ LT) ∨ |
|  | ((AM = NMSR) ∧ DecEncountered) ∨ |
|  | ((AM = NMSR) ∧ EqEncountered ∧ LT) |
|  | EqEncountered ← ((AM = MSR) ∧ EQ) ∨ |
|  | ((AM = NMSR) ∧ EqEncountered ∧ EQ) |
|  | Advance to the next Access Mode set and write the new M[~n] if applicable |
| 8 | IF (WE) |
|  | Erase M[~n] |
|  | M[~n] ← Temp |
| 10 | ⇓n |
| 11 | IF (n ≠ 0) |
|  | GOTO 2 |

SAM—Set AccessMode

| Input: | $AccessMode_{new}$ = [32 bits] |
|---|---|
| Output: | AccessMode = [32 bits] |
| Changes: | AccessMode |

The SAM (Set Access Mode) command is used to set the 32 bits of the AccessMode register, and is only available for use in consumable Authentication Chips (where the IsTrusted flag=0). The SAM command is called by passing the SAM command opcode followed by a 32-bit value that is used to set bits in the AccessMode register. Since the Authentication Chip is serial, the data must be transferred one bit at a time. The bit order is LSB to MSB for each command component. A SAM command is therefore: bits 0-2 of the SAM opcode, followed by bits 0-31 of bits to be set in AccessMode. 35 bits are transferred in total. The AccessMode register is only cleared to 0 upon execution of a CLR command. Since an access mode of 00 indicates an access mode of RW (read/write), not setting any AccessMode bits after a CLR means that all of M can be read from and written to. The SAM command only sets bits in the AccessMode register. Consequently a client can change the access mode bits for M[n] from RW to RO (read only) by setting the appropriate bits in a 32-bit word, and calling SAM with that 32-bit value as the input parameter. This allows the programming of the access mode bits at different times, perhaps at different stages of the manufacturing process. For example, the read only random data can be written to during the initial key programming stage, while allowing a second programming stage for items such as consumable serial numbers.

Since the SAM command only sets bits, the effect is to allow the access mode bits corresponding to M[n] to progress from RW to either MSR, NMSR, or RO. It should be noted that an access mode of MSR can be changed to RO, but this would not help an attacker, since the authentication of M after a write to a doctored Authentication Chip would detect that the write was not successful and hence abort the operation. The setting of bits corresponds to the way that Flash memory works best. The only way to clear bits in the AccessMode register, for example to change a Decrement Only M[n] to be Read/Write, is to use the CLR command. The CLR command not only erases (clears) the AccessMode register, but also clears the keys and all of M. Thus the AccessMode[n] bits corresponding to M[n] can only usefully be changed once between CLR commands. The SAM command returns the new value of the AccessMode register (after the appropriate bits have been set due to the input parameter). By calling SAM with an input parameter of 0, AccessMode will not be changed, and therefore the current value of AccessMode will be returned to the caller.

The SAM Command is Implemented with the Following Steps:

| Step | Action |
| --- | --- |
| 1 | Temp ← Read 32 bits from client |
| 2 | SetBits(AccessMode, Temp) |
| 3 | Output 32 bits of AccessMode to client |

GIT—Get is Trusted

| Input: | None |
| --- | --- |
| Output: | IsTrusted = [1 bit] |
| Changes: | None |

The GIT (Get Is Trusted) command is used to read the current value of the IsTrusted bit on the Authentication Chip. If the bit returned is 1, the Authentication Chip is a trusted System Authentication Chip. If the bit returned is 0, the Authentication Chip is a consumable Authentication Chip. A GIT command consists of simply the GIT command opcode. Since the Authentication Chip is serial, this must be transferred one bit at a time. The bit order is LSB to MSB for each command component. A GIT command is therefore sent as bits 0-2 of the GIT opcode. A total of 3 bits are transferred. The GIT command is implemented with the following steps:

| Step | Action |
| --- | --- |
| 1 | Output IsTrusted bit to client |

SMT—Set MinTicks

| Input: | MinTicks$_{new}$ = [32 bits] |
| --- | --- |
| Output: | None |
| Changes: | MinTicks |

The SMT (Set MinTicks) command is used to set bits in the MinTicks register and hence define the minimum number of ticks that must pass in between calls to TST and RD. The SMT command is called by passing the SMT command opcode followed by a 32-bit value that is used to set bits in the MinTicks register. Since the Authentication Chip is serial, the data must be transferred one bit at a time. The bit order is LSB to MSB for each command component. An SMT command is therefore: bits 0-2 of the SMT opcode, followed by bits 0-31 of bits to be set in MinTicks. 35 bits are transferred in total. The MinTicks register is only cleared to 0 upon execution of a CLR command. A value of 0 indicates that no ticks need to pass between calls to key-based functions. The functions may therefore be called as frequently as the clock speed limiting hardware allows the chip to run.

Since the SMT command only sets bits, the effect is to allow a client to set a value, and only increase the time delay if further calls are made. Setting a bit that is already set has no effect, and setting a bit that is clear only serves to slow the chip down further. The setting of bits corresponds to the way that Flash memory works best. The only way to clear bits in the MinTicks register, for example to change a value of 10 ticks to a value of 4 ticks, is to use the CLR command. However the CLR command clears the MinTicks register to 0 as well as clearing all keys and M. It is therefore useless for an attacker. Thus the MinTicks register can only usefully be changed once between CLR commands.

The SMT command is implemented with the following steps:

| Step | Action |
| --- | --- |
| 1 | Temp ← Read 32 bits from client |
| 2 | SetBits(MinTicks, Temp) |

Programming Authentication Chips

Authentication Chips must be programmed with logically secure information in a physically secure environment. Consequently the programming procedures cover both logical and physical security. Logical security is the process of ensuring that $K_1$, $K_2$, R, and the random M[n] values are generated by a physically random process, and not by a computer. It is also the process of ensuring that the order in which parts of the chip are programmed is the most logically secure. Physical security is the process of ensuring that the programming station is physically secure, so that $K_1$ and $K_2$ remain secret, both during the key generation stage and during the lifetime of the storage of the keys. In addition, the programming station must be resistant to physical attempts to obtain or destroy the keys. The Authentication Chip has its own security mechanisms for ensuring that $K_1$ and $K_2$ are kept secret, but the Programming Station must also keep $K_1$ and $K_2$ safe.

Overview

After manufacture, an Authentication Chip must be programmed before it can be used. In all chips values for $K_1$ and $K_2$ must be established. If the chip is destined to be a System Authentication Chip, the initial value for R must be determined. If the chip is destined to be a consumable Authentication Chip, R must be set to 0, and initial values for M and AccessMode must be set up. The following stages are therefore identified:

1. Determine Interaction between Systems and Consumables
2. Determine Keys for Systems and Consumables
3. Determine MinTicks for Systems and Consumables
4. Program Keys, Random Seed, MinTicks and Unused M
5. Program State Data and Access Modes Once the consumable or system is no longer required, the attached Authentication Chip can be reused. This is easily accomplished by reprogrammed the chip starting at Stage 4 again. Each of the stages is examined in the subsequent sections.

Stage 0: Manufacture

The manufacture of Authentication Chips does not require any special security. There is no secret information programmed into the chips at manufacturing stage. The algorithms and chip process is not special. Standard Flash processes are used. A theft of Authentication Chips between the chip manufacturer and programming station would only provide the clone manufacturer with blank chips. This merely compromises the sale of Authentication chips, not anything authenticated by Authentication Chips. Since the programming station is the only mechanism with consumable and system product keys, a clone manufacturer would not be able to program the chips with the correct key. Clone manufacturers would be able to program the blank chips for their own systems and consumables, but it would be difficult to place these items on the market without detection. In addition, a single theft would be difficult to base a business around.

Stage 1: Determine Interaction Between Systems and Consumables

The decision of what is a System and what is a Consumable needs to be determined before any Authentication Chips can be programmed. A decision needs to be made about which Consumables can be used in which Systems, since all connected Systems and Consumables must share the same key information. They also need to share state-data usage mechanisms even if some of the interpretations of that data have not yet been determined. A simple example is that of a car and car-keys. The car itself is the System, and the car-keys are the consumables. There are several car-keys for each car, each containing the same key information as the specific car. However each car (System) would contain a different key (shared by its car-keys), since we don't want car-keys from one car working in another. Another example is that of a photocopier that requires a particular toner cartridge. In simple terms the photocopier is the System, and the toner cartridge is the consumable. However the decision must be made as to what compatibility there is to be between cartridges and photocopiers. The decision has historically been made in terms of the physical packaging of the toner cartridge: certain cartridges will or won't fit in a new model photocopier based on the design decisions for that copier. When Authentication Chips are used, the components that must work together must share the same key information.

In addition, each type of consumable requires a different way of dividing M (the state data). Although the way in which M is used will vary from application to application, the method of allocating M[n] and AccessMode[n] will be the same:

Define the consumable state data for specific use
Set some M[n] registers aside for future use (if required). Set these to be 0 and Read Only. The value can be tested for in Systems to maintain compatibility.
Set the remaining M[n] registers (at least one, but it does not have to be M[15]) to be Read Only, with the contents of each M[n] completely random. This is to make it more difficult for a clone manufacturer to attack the authentication keys.

The following examples show ways in which the state data may be organized.

Example 1

Suppose we have a car with associated car-keys. A 16-bit key number is more than enough to uniquely identify each car-key for a given car. The 256 bits of M could be divided up as follows:

| M[n] | Access | Description |
| --- | --- | --- |
| 0 | RO | Key number (16 bits) |
| 1-4 | RO | Car engine number (64 bits) |
| 5-8 | RO | For future expansion = 0 (64 bits) |
| 8-15 | RO | Random bit data (128 bits) |

If the car manufacturer keeps all logical keys for all cars, it is a trivial matter to manufacture a new physical car-key for a given car should one be lost. The new car-key would contain a new Key Number in M[0], but have the same $K_1$ and $K_2$ as the car's Authentication Chip. Car Systems could allow specific key numbers to be invalidated (for example if a key is lost). Such a system might require Key 0 (the master key) to be inserted first, then all valid keys, then Key 0 again. Only those valid keys would now work with the car. In the worst case, for example if all car-keys are lost, then a new set of logical keys could be generated for the car and its associated physical car-keys if desired. The Car engine number would be used to tie the key to the particular car. Future use data may include such things as rental information, such as driver/renter details.

Example 2

Suppose we have a photocopier image unit which should be replaced every 100,000 copies. 32 bits are required to store the number of pages remaining. The 256 bits of M could be divided up as follows:

| M[n] | Access | Description |
| --- | --- | --- |
| 0 | RO | Serial number (16 bits) |
| 1 | RO | Batch number (16 bits) |
| 2 | MSR | Page Count Remaining (32 bits, hi/lo) |
| 3 | NMSR | |
| 4-7 | RO | For future expansion = 0 (64 bits) |
| 8-15 | RO | Random bit data (128 bits) |

If a lower quality image unit is made that must be replaced after only 10,000 copies, the 32-bit page count can still be used for compatibility with existing photocopiers. This allows several consumable types to be used with the same system.

Example 3

Consider a Polaroid camera consumable containing 25 photos. A 16-bit countdown is all that is required to store the number of photos remaining. The 256 bits of M could be divided up as follows:

| M[n] | Access | Description |
|---|---|---|
| 0 | RO | Serial number (16 bits) |
| 1 | RO | Batch number (16 bits) |
| 2 | MSR | Photos Remaining (16 bits) |
| 3-6 | RO | For future expansion = 0 (64 bits) |
| 7-15 | RO | Random bit data (144 bits) |

The Photos Remaining value at M[2] allows a number of consumable types to be built for use with the same camera System. For example, a new consumable with 36 photos is trivial to program. Suppose 2 years after the introduction of the camera, a new type of camera was introduced. It is able to use the old consumable, but also can process a new film type. M[3] can be used to define Film Type. Old film types would be 0, and the new film types would be some new value. New Systems can take advantage of this. Original systems would detect a non-zero value at M[3] and realize incompatibility with new film types. New Systems would understand the value of M[3] and so react appropriately. To maintain compatibility with the old consumable, the new consumable and System needs to have the same key information as the old one. To make a clean break with a new System and its own special consumables, a new key set would be required.

Example 4

Consider a printer consumable containing 3 inks: cyan, magenta, and yellow. Each ink amount can be decremented separately. The 256 bits of M could be divided up as follows:

| M[n] | Access | Description |
|---|---|---|
| 0 | RO | Serial number (16 bits) |
| 1 | RO | Batch number (16 bits) |
| 2 | MSR | Cyan Remaining (32 bits, hi/lo) |
| 3 | NMSR | |
| 4 | MSR | Magenta Remaining (32 bits, hi/lo) |
| 5 | NMSR | |
| 6 | MSR | Yellow Remaining (32 bits, hi/lo) |
| 7 | NMSR | |
| 8-11 | RO | For future expansion = 0 (64 bits) |
| 12-15 | RO | Random bit data (64 bits) |

Stage 2: Determine Keys for Systems and Consumables

Once the decision has been made as to which Systems and consumables are to share the same keys, those keys must be defined. The values for $K_1$ and $K_2$ must therefore be determined. In most cases, $K_1$ and $K_2$ will be generated once for all time. All Systems and consumables that have to work together (both now and in the future) need to have the same $K_1$ and $K_2$ values. $K_1$ and $K_2$ must therefore be kept secret since the entire security mechanism for the System/Consumable combination is made void if the keys are compromised. If the keys are compromised, the damage depends on the number of systems and consumables, and the ease to which they can be reprogrammed with new non-compromised keys: In the case of a photocopier with toner cartridges, the worst case is that a clone manufacturer could then manufacture their own Authentication Chips (or worse, buy them), program the chips with the known keys, and then insert them into their own consumables. In the case of a car with car-keys, each car has a different set of keys. This leads to two possible general scenarios. The first is that after the car and car-keys are programmed with the keys, $K_1$ and $K_2$ are deleted so no record of their values are kept, meaning that there is no way to compromise $K_1$ and $K_2$. However no more car-keys can be made for that car without reprogramming the car's Authentication Chip. The second scenario is that the car manufacturer keeps $K_1$ and $K_2$, and new keys can be made for the car. A compromise of $K_1$ and $K_2$ means that someone could make a car-key specifically for a particular car.

The keys and random data used in the Authentication Chips must therefore be generated by a means that is non-deterministic (a completely computer generated pseudo-random number cannot be used because it is deterministic—knowledge of the generator's seed gives all future numbers). $K_1$ and $K_2$ should be generated by a physically random process, and not by a computer. However, random bit generators based on natural sources of randomness are subject to influence by external factors and also to malfunction. It is imperative that such devices be tested periodically for statistical randomness.

A simple yet useful source of random numbers is the Lavarand® system from SGI. This generator uses a digital camera to photograph six lava lamps every few minutes. Lava lamps contain chaotic turbulent systems. The resultant digital images are fed into an SHA-1 implementation that produces a 7-way hash, resulting in a 160-bit value from every 7th bye from the digitized image. These 7 sets of 160 bits total 140 bytes. The 140 byte value is fed into a BBS generator to position the start of the output bitstream. The output 160 bits from the BBS would be the key or the Authentication chip.

An extreme example of a non-deterministic random process is someone flipping a coin 160 times for $K_1$ and 160 times for $K_2$ in a clean room. With each head or tail, a 1 or 0 is entered on a panel of a Key Programmer Device. The process must be undertaken with several observers (for verification) in silence (someone may have a hidden microphone). The point to be made is that secure data entry and storage is not as simple as it sounds. The physical security of the Key Programmer Device and accompanying Programming Station requires an entire document of its own. Once keys $K_1$ and $K_2$ have been determined, they must be kept for as long as Authentication Chips need to be made that use the key. In the first car/car-key scenario $K_1$ and $K_2$ are destroyed after a single System chip and a few consumable chips have been programmed. In the case of the photocopier/toner cartridge, $K_1$ and $K_2$ must be retained for as long as the toner-cartridges are being made for the photocopiers. The keys must be kept securely.

Stage 3: Determine MinTicks for Systems and Consumables

The value of MinTicks depends on the operating clock speed of the Authentication Chip (System specific) and the notion of what constitutes a reasonable time between RD or TST function calls (application specific). The duration of a single tick depends on the operating clock speed. This is the maximum of the input clock speed and the Authentication Chip's clock-limiting hardware. For example, the Authentication Chip's clock-limiting hardware may be set at 10 MHz (it is not changeable), but the input clock is 1 MHz. In this case, the value of 1 tick is based on 1 MHz, not 10 MHz. If the input clock was 20 MHz instead of 1 MHz, the value of 1 tick is based on 10 MHz (since the clock speed is limited to 10 MHz). Once the duration of a tick is known, the MinTicks value can be set. The value for MinTicks is the minimum number of ticks required to pass between calls to RD or RND key-based functions. Suppose the input clock speed matches the maximum clock speed of 10 MHz. If we want a minimum of 1 second between calls to TST, the value for MinTicks is set to 10,000,000. Even a value such as 2 seconds might be a completely reasonable value for a System such as a printer (one authentication per page, and one page produced every 2 or 3 seconds).

Stage 4: Program Keys, Random Seed, MinTicks and Unused M

Authentication Chips are in an unknown state after manufacture. Alternatively, they have already been used in one consumable, and must be reprogrammed for use in another. Each Authentication Chip must be cleared and programmed with new keys and new state data. Clearing and subsequent programming of Authentication Chips must take place in a secure Programming Station environment.

Programming a Trusted System Authentication Chip

If the chip is to be a trusted System chip, a seed value for R must be generated. It must be a random number derived from a physically random process, and must not be 0. The following tasks must be undertaken, in the following order, and in a secure programming environment:

1. RESET the chip
2. CLR[ ]
3. Load R (160 bit register) with physically random data
4. SSI[$K_1$, $K_2$, R]
5. SMT[MinTicks$_{System}$]

The Authentication Chip is now ready for insertion into a System. It has been completely programmed. If the System Authentication Chips are stolen at this point, a clone manufacturer could use them to generate R, $F_{K1}$[R] pairs in order to launch a known text attack on $K_1$, or to use for launching a partially chosen-text attack on $K_2$. This is no different to the purchase of a number of Systems, each containing a trusted Authentication Chip. The security relies on the strength of the Authentication protocols and the randomness of $K_1$ and $K_2$.

Programming a Non-Trusted Consumable Authentication Chip

If the chip is to be a non-trusted Consumable Authentication Chip, the programming is slightly different to that of the trusted System Authentication Chip. Firstly, the seed value for R must be 0. It must have additional programming for M and the AccessMode values. The future use M[n] must be programmed with 0, and the random M[n] must be programmed with random data. The following tasks must be undertaken, in the following order, and in a secure programming environment:

1. RESET the chip
2. CLR[ ]
3. Load R (160 bit register) with 0
4. SSI[$K_1$, $K_2$, R]
5. Load X (256 bit register) with 0
6. Set bits in X corresponding to appropriate M[n] with physically random data
7. WR[X]
8. Load Y (32 bit register) with 0
9. Set bits in Y corresponding to appropriate M[n] with Read Only Access Modes
10. SAM[Y]
11. SMT[MinTicks$_{Consumable}$]

The non-trusted consumable chip is now ready to be programmed with the general state data. If the Authentication Chips are stolen at this point, an attacker could perform a limited chosen text attack. In the best situation, parts of M are Read Only (0 and random data), with the remainder of M completely chosen by an attacker (via the WR command). A number of RD calls by an attacker obtains $F_{K2}$[M|R] for a limited M. In the worst situation, M can be completely chosen by an attacker (since all 256 bits are used for state data). In both cases however, the attacker cannot choose any value for R since it is supplied by calls to RND from a System Authentication Chip. The only way to obtain a chosen R is by a Brute Force attack. It should be noted that if Stages 4 and 5 are carried out on the same Programming Station (the preferred and ideal situation), Authentication Chips cannot be removed in between the stages. Hence there is no possibility of the Authentication Chips being stolen at this point. The decision to program the Authentication Chips at one or two times depends on the requirements of the System/Consumable manufacturer.

Stage 5: Program State Data and Access Modes

This stage is only required for consumable Authentication Chips, since M and AccessMode registers cannot be altered on System Authentication Chips. The future use and random values of M[n] have already been programmed in Stage 4. The remaining state data values need to be programmed and the associated Access Mode values need to be set. Bear in mind that the speed of this stage will be limited by the value stored in the MinTicks register. This stage is separated from Stage 4 on account of the differences either in physical location or in time between where/when Stage 4 is performed, and where/when Stage 5 is performed. Ideally, Stages 4 and 5 are performed at the same time in the same Programming Station. Stage 4 produces valid Authentication Chips, but does not load them with initial state values (other than 0). This is to allow the programming of the chips to coincide with production line runs of consumables. Although Stage 5 can be run multiple times, each time setting a different state data value and Access Mode value, it is more likely to be run a single time, setting all the remaining state data values and setting all the remaining Access Mode values. For example, a production line can be set up where the batch number and serial number of the Authentication Chip is produced according to the physical consumable being produced. This is much harder to match if the state data is loaded at a physically different factory.

The Stage 5 process involves first checking to ensure the chip is a valid consumable chip, which includes a RD to gather the data from the Authentication Chip, followed by a WR of the initial data values, and then a SAM to permanently set the new data values. The steps are outlined here:

1. IsTrusted = GIT[ ]
2. If (IsTrusted), exit with error (wrong kind of chip!)
3. Call RND on a valid System chip to get a valid input pair
4. Call RD on chip to be programmed, passing in valid input pair
5. Load X (256 bit register) with results from a RD of Authentication Chip
6. Call TST on valid System chip to ensure X and consumable chip are valid
7. If (TST returns 0), exit with error (wrong consumable chip for system)
8. Set bits of X to initial state values
9. WR[X]
10. Load Y (32 bit register) with 0
11. Set bits of Y corresponding to Access Modes for new state values
12. SAM[Y]

Of course the validation (Steps 1 to 7) does not have to occur if Stage 4 and 5 follow on from one another on the same Programming Station. But it should occur in all other situations where Stage 5 is run as a separate programming process from Stage 4. If these Authentication Chips are now stolen, they are already programmed for use in a particular consumable. An attacker could place the stolen chips into a clone consumable. Such a theft would limit the number of cloned products to the number of chips stolen. A single theft should not create a supply constant enough to provide clone manufacturers with a cost-effective business. The alternative use for the chips is to save the attacker from purchasing the same number of consumables, each with an Authentication Chip, in order to launch a partially chosen text attack or brute force attack. There is no special security breach of the keys if such an attack were to occur.

Manufacture

The circuitry of the Authentication Chip must be resistant to physical attack. A summary of manufacturing implementation guidelines is presented, followed by specification of the chip's physical defenses (ordered by attack).

Guidelines for Manufacturing

The following are general guidelines for implementation of an Authentication Chip in terms of manufacture:
  Standard process
  Minimum size (if possible)
  Clock Filter
  Noise Generator
  Tamper Prevention and Detection circuitry
  Protected memory with tamper detection
  Boot circuitry for loading program code
  Special implementation of FETs for key data paths
  Data connections in polysilicon layers where possible
  OverUnderPower Detection Unit
  No test circuitry Standard Process The Authentication Chip should be implemented with a standard manufacturing process (such as Flash). This is necessary to:
  Allow a great range of manufacturing location options
  Take advantage of well-defined and well-known technology
  Reduce cost
  Note that the standard process still allows physical protection mechanisms.

Minimum Size

The Authentication chip must have a low manufacturing cost in order to be included as the authentication mechanism for low cost consumables. It is therefore desirable to keep the chip size as low as reasonably possible. Each Authentication Chip requires 802 bits of non-volatile memory. In addition, the storage required for optimized HMAC-SHA1 is 1024 bits. The remainder of the chip (state machine, processor, CPU or whatever is chosen to implement Protocol 3) must be kept to a minimum in order that the number of transistors is minimized and thus the cost per chip is minimized. The circuit areas that process the secret key information or could reveal information about the key should also be minimized (see Non-Flashing CMOS below for special data paths).

Clock Filter

The Authentication Chip circuitry is designed to operate within a specific clock speed range.

Since the user directly supplies the clock signal, it is possible for an attacker to attempt to introduce race-conditions in the circuitry at specific times during processing. An example of this is where a high clock speed (higher than the circuitry is designed for) may prevent an XOR from working properly, and of the two inputs, the first may always be returned. These styles of transient fault attacks can be very efficient at recovering secret key information. The lesson to be learned from this is that the input clock signal cannot be trusted. Since the input clock signal cannot be trusted, it must be limited to operate up to a maximum frequency. This can be achieved a number of ways.

In clock filter 80 an edge detect unit 81 passes the edge on to a delay 82, which in turn enables a gate 83 so that the clock signal is able to pass from the input port 84 to the output 85.

Figure 8:
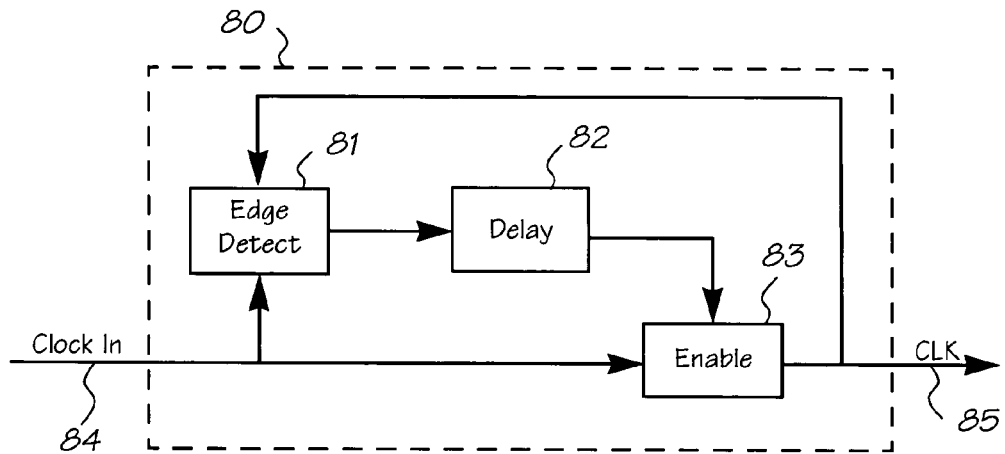
FIG. 8 is a schematic block diagram of a clock limiting filter.

FIG. 8 shows the Clock Filter.

The delay should be set so that the maximum clock speed is a particular frequency (e.g. about 4 MHz). Note that this delay is not programmable—it is fixed. The filtered clock signal would be further divided internally as required.

Noise Generator

Each Authentication Chip should contain a noise generator that generates continuous circuit noise. The noise will interfere with other electromagnetic emissions from the chip's regular activities and add noise to the $I_{dd}$ signal. Placement of the noise generator is not an issue on an Authentication Chip due to the length of the emission wavelengths. The noise generator is used to generate electronic noise, multiple state changes each clock cycle, and as a source of pseudo-random bits for the Tamper Prevention and Detection circuitry. A simple implementation of a noise generator is a 64-bit LFSR seeded with a non-zero number. The clock used for the noise generator should be running at the maximum clock rate for the chip in order to generate as much noise as possible.

Tamper Prevention and Detection Circuitry

A set of circuits is required to test for and prevent physical attacks on the Authentication Chip. However what is actually detected as an attack may not be an intentional physical attack. It is therefore important to distinguish between these two types of attacks in an Authentication Chip:
  where you can be certain that a physical attack has occurred.
  where you cannot be certain that a physical attack has occurred.

The two types of detection differ in what is performed as a result of the detection. In the first case, where the circuitry can be certain that a true physical attack has occurred, erasure of Flash memory key information is a sensible action. In the second case, where the circuitry cannot be sure if an attack has occurred, there is still certainly something wrong. Action must be taken, but the action should not be the erasure of secret key information. A suitable action to take in the second case is a chip RESET. If what was detected was an attack that has permanently damaged the chip, the same conditions will occur next time and the chip will RESET again. If, on the other hand, what was detected was part of the normal operating environment of the chip, a RESET will not harm the key.

A good example of an event that circuitry cannot have knowledge about, is a power glitch. The glitch may be an intentional attack, attempting to reveal information about the key. It may, however, be the result of a faulty connection, or simply the start of a power-down sequence. It is therefore best to only RESET the chip, and not erase the key. If the chip was powering down, nothing is lost. If the System is faulty, repeated RESETs will cause the consumer to get the System repaired. In both cases the consumable is still intact. A good example of an event that circuitry can have knowledge about, is the cutting of a data line within the chip. If this attack is somehow detected, it could only be a result of a faulty chip (manufacturing defect) or an attack. In either case, the erasure of the secret information is a sensible step to take.

Consequently each Authentication Chip should have 2 Tamper Detection Lines—one for definite attacks, and one for possible attacks. Connected to these Tamper Detection Lines would be a number of Tamper Detection test units, each testing for different forms of tampering. In addition, we want to ensure that the Tamper Detection Lines and Circuits themselves cannot also be tampered with.

Figure 9:
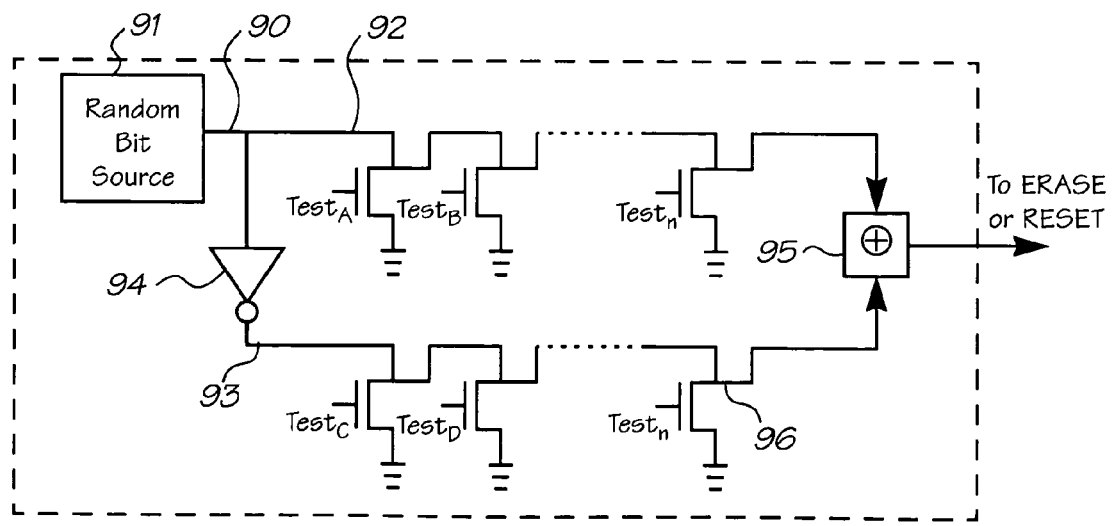
FIG. 9 is a schematic block diagram of the tamper detection lines.

At one end of the Tamper Detection Line 90 is a source of pseudo-random bits 91 (clocking at high speed compared to the general operating circuitry). The Noise Generator circuit described above is an adequate source. The generated bits pass through two different paths—one 92 carries the original data, and the other 93 carries the inverse of the data, it having passed through an inverter 94. The wires carrying these bits are in the layer above the general chip circuitry (for example, the memory, the key manipulation circuitry etc). The wires must also cover the random bit generator. The bits are recombined at a number of places via an XOR gate 95. If the bits are different (they should be), a 1 is output, and used by the particular unit (for example, each output bit from a memory read should be ANDed with this bit value). The lines finally come together at the Flash memory Erase circuit, where a complete erasure is triggered by a 0 from the XOR. Attached to the line is a number of triggers, each detecting a physical attack on the chip. Each trigger has oversize NMOS transistors, such as 96, attached to GND. The Tamper Detection Line physically goes through these NMOS transistors. If the test fails, the trigger causes the Tamper Detect Line to become 0. The XOR test will therefore fail on either this clock cycle or the next one (on average), thus RESETing or erasing the chip. FIG. 9 illustrates the basic principle of a Tamper Detection Line with its outputs connected to either the Erase or RESET circuitry.

Figure 10:
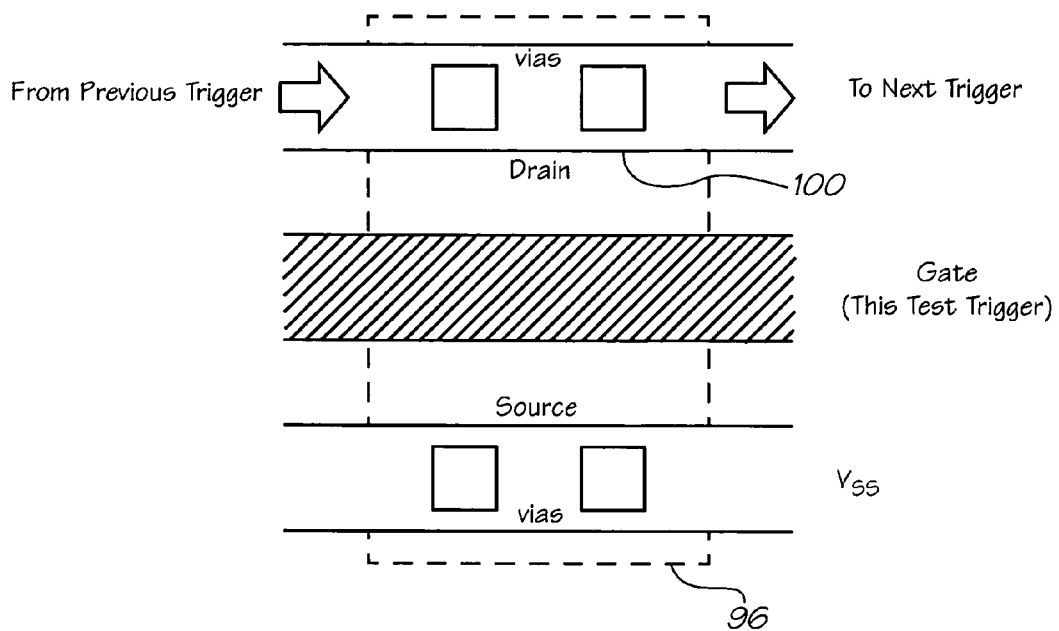
FIG. 10 illustrates an oversized NMOS transistor used as test transistors in the tamper detection line of FIG. 9.

The Tamper Detection Line must go through the drain 100 of an output transistor 96 for each test, as illustrated by FIG. 10. It is not possible to break the Tamper Detect Line since this would stop the flow of 1s and 0s from the random source. The XOR tests would therefore fail. As the Tamper Detect Line physically passes through each test, it is not possible to eliminate any particular test without breaking the Tamper Detect Line.

Figure 11:
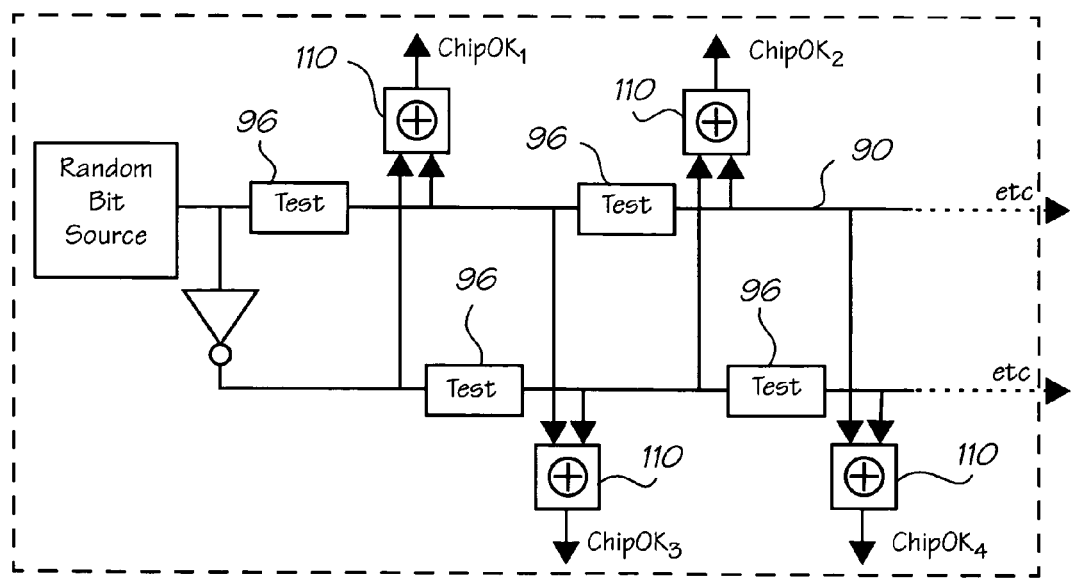
FIG. 11 is a circuit diagram of part of the tamper detection line of FIG. 9 including XOR gates between the two paths.

It is important that the XORs take values from a variety of places along the Tamper Detect Lines in order to reduce the chances of an attack. FIG. 11 illustrates the taking of multiple XORs, indicated generally at 110, from the Tamper Detect Line to be used in the different parts of the chip. Each of these XORs 110 can be considered to be generating a ChipOK bit that can be used within each unit or sub-unit.

A sample usage would be to have an OK bit in each unit that is ANDed with a given ChipOK bit each cycle. The OK bit is loaded with 1 on a RESET. If OK is 0, that unit will fail until the next RESET. If the Tamper Detect Line is functioning correctly, the chip will either RESET or erase all key information. If the RESET or erase circuitry has been destroyed, then this unit will not function, thus thwarting an attacker. The destination of the RESET and Erase line and associated circuitry is very context sensitive. It needs to be protected in much the same way as the individual tamper tests. There is no point generating a RESET pulse if the attacker can simply cut the wire leading to the RESET circuitry. The actual implementation will depend very much on what is to be cleared at RESET, and how those items are cleared.

Figure 12:
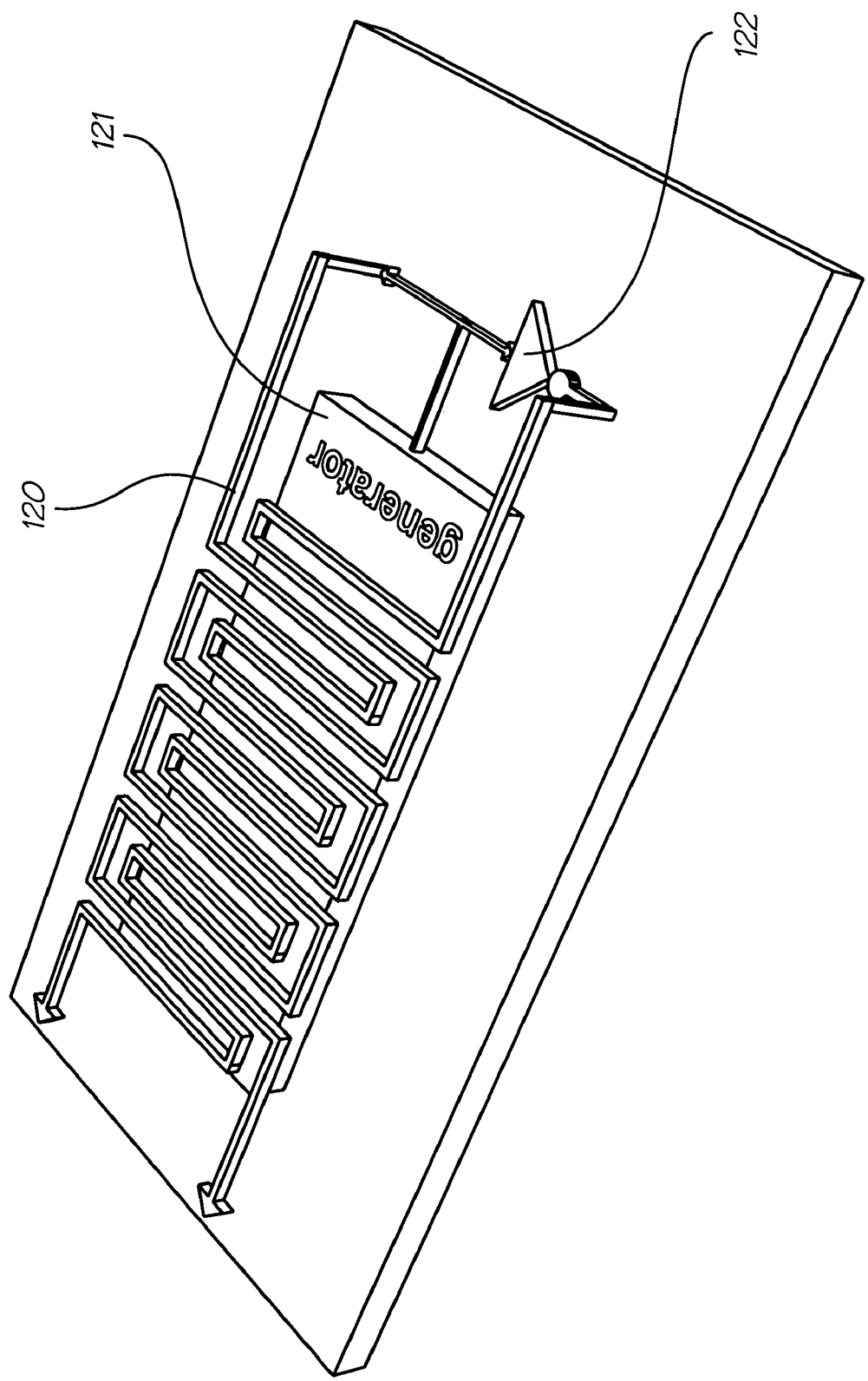
FIG. 12 illustrates how the Tamper Lines cover the noise generator circuitry.

Finally, FIG. 12 shows how the Tamper Lines 120 cover the noise generator circuitry 121 of the chip. The generator 121 and NOT gate 122 are on one level, while the Tamper Detect Lines 120 run on a level above the generator 121.

Protected Memory with Tamper Detection

It is not enough to simply store secret information or program code in Flash memory. The Flash memory and RAM must be protected from an attacker who would attempt to modify (or set) a particular bit of program code or key information. The mechanism used must conform to being used in the Tamper Detection Circuitry (described above). The first part of the solution is to ensure that the Tamper Detection Line passes directly above each Flash or RAM bit. This ensures that an attacker cannot probe the contents of Flash or RAM. A breach of the covering wire is a break in the Tamper Detection Line. The breach causes the Erase signal to be set, thus deleting any contents of the memory. The high frequency noise on the Tamper Detection Line also obscures passive observation.

The second part of the solution for Flash is to use multi-level data storage, but only to use a subset of those multiple levels for valid bit representations. Normally, when multi-level Flash storage is used, a single floating gate holds more than one bit. For example, a 4-voltage-state transistor can represent two bits. Assuming a minimum and maximum voltage representing 00 and 11 respectively, the two middle voltages represent 01 and 10. In the Authentication Chip, we can use the two middle voltages to represent a single bit, and consider the two extremes to be invalid states. If an attacker attempts to force the state of a bit one way or the other by closing or cutting the gate's circuit, an invalid voltage (and hence invalid state) results.

The second part of the solution for RAM is to use a parity bit. The data part of the register can be checked against the parity bit (which will not match after an attack). The bits coming from Flash and RAM can therefore be validated by a number of test units (one per bit) connected to the common Tamper Detection Line. The Tamper Detection circuitry would be the first circuitry the data passes through (thus stopping an attacker from cutting the data lines).

Boot Circuitry for Loading Program Code

Program code should be kept in multi-level Flash instead of ROM, since ROM is subject to being altered in a non-testable way. A boot mechanism is therefore required to load the program code into Flash memory (Flash memory is in an indeterminate state after manufacture). The boot circuitry must not be in ROM—a small state-machine would suffice. Otherwise the boot code could be modified in an undetectable way. The boot circuitry must erase all Flash memory, check to ensure the erasure worked, and then load the program code. Flash memory must be erased before loading the program code. Otherwise an attacker could put the chip into the boot state, and then load program code that simply extracted the existing keys. The state machine must also check to ensure that all Flash memory has been cleared (to ensure that an attacker has not cut the Erase line) before loading the new program code. The loading of program code must be undertaken by the secure Programming Station before secret information (such as keys) can be loaded.

Special Implementation of FETs for Key Data Paths

Figure 13:
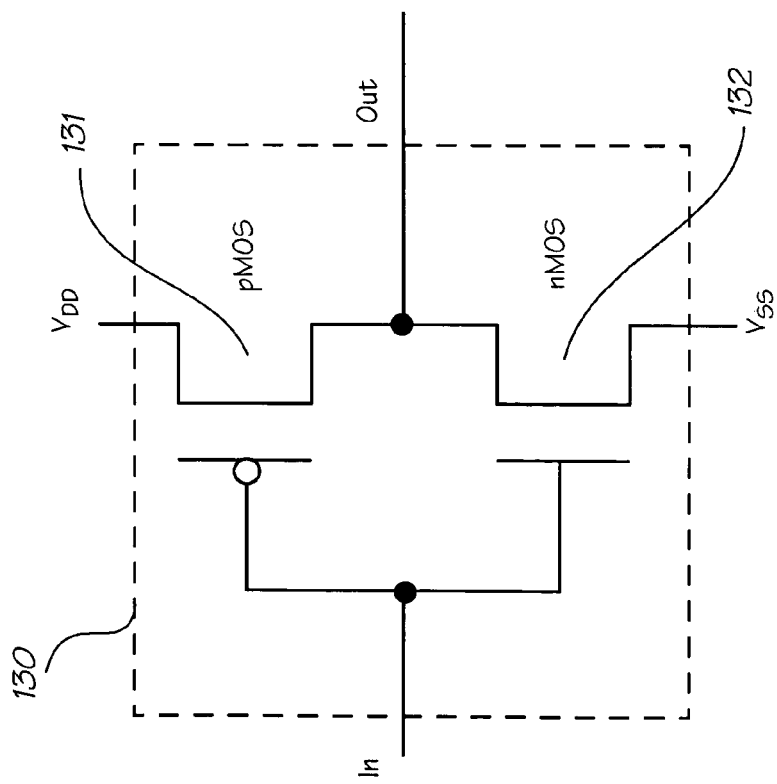
FIG. 13 is a circuit diagram of the normal FET implementation of a CMOS inverter.

The normal situation for FET implementation for the case of a CMOS Inverter 130, which involves a pMOS transistor 131 combined with an nMOS transistor 132) is shown in FIG. 13.

Figure 14:
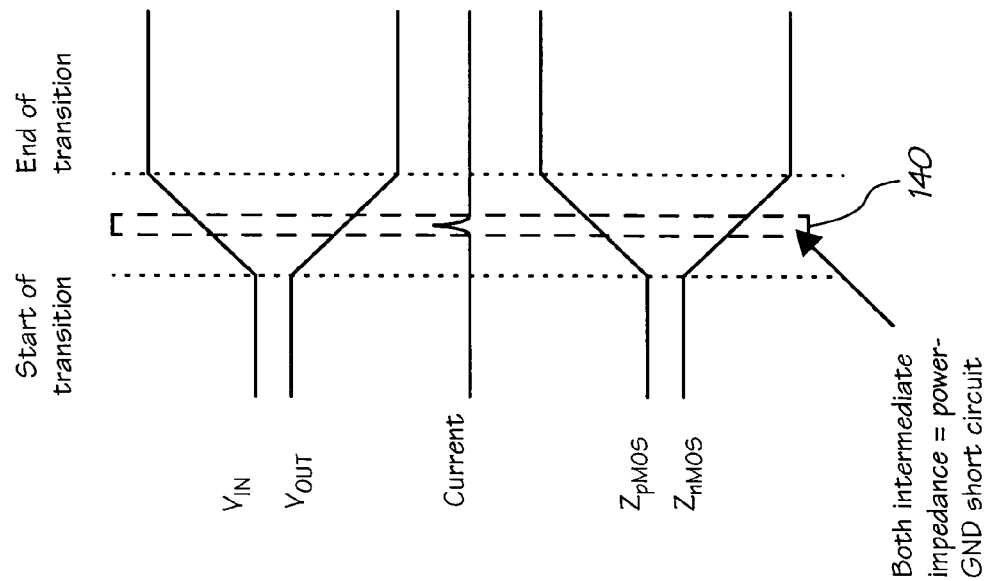
FIG. 14 is voltage/current diagram for the transistors of the CMOS inverter of FIG. 13.

FIG. 14 is the voltage/current diagram for the CMOS inverter 130. During the transition, there is a small period of time 140 where both the NMOS transistor 132 and the pMOS transistor 131 have an intermediate resistance. The resultant power-ground short circuit causes a temporary increase in the current, and in fact accounts for the majority of current consumed by a CMOS device. A small amount of infrared light is emitted during the short circuit, and can be viewed through the silicon substrate (silicon is transparent to infrared light). A small amount of light is also emitted during the charging and discharging of the transistor gate capacitance and transmission line capacitance.

Figure 16:
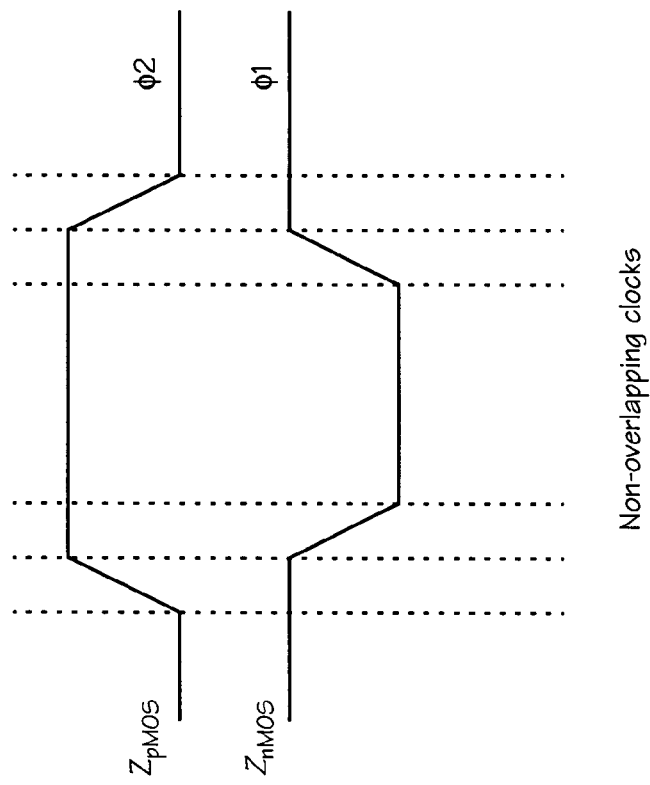
FIG. 16 is impedance diagram for the transistors of the CMOS inverter of FIG. 15.
Figure 15:
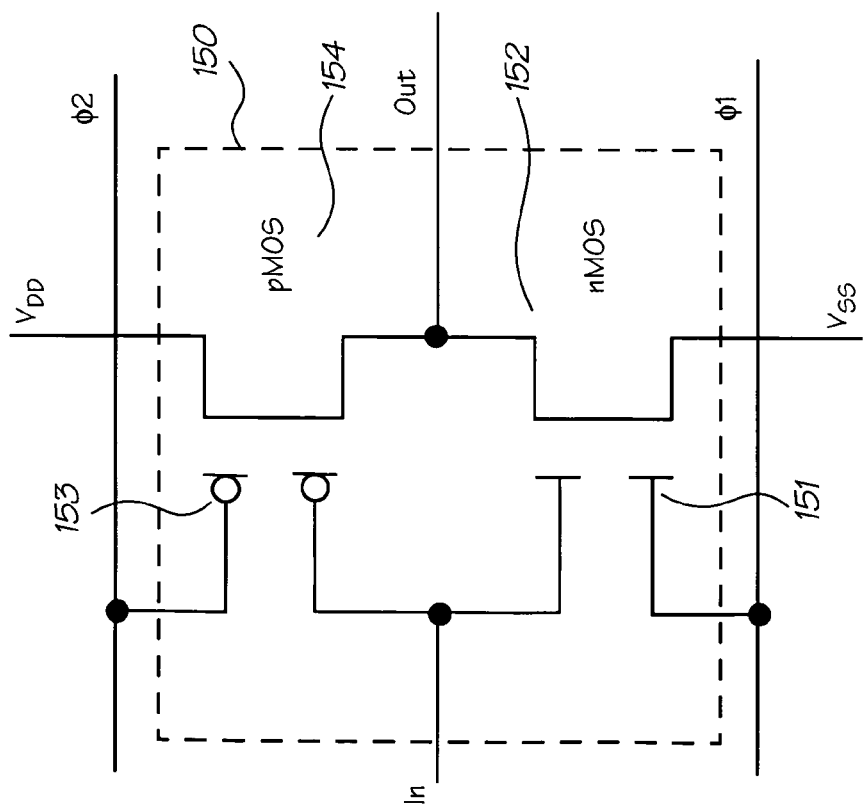
FIG. 15 is a circuit diagram of the FET implementation of a non-flashing CMOS inverter.

For circuitry that manipulates secret key information, such information must be kept hidden. An alternative non-flashing CMOS implementation 150 should therefore be used for all data paths that manipulate the key or a partially calculated value that is based on the key. The use of two non-overlapping clocks $\phi 1$ and $\phi 2$ can provide a non-flashing mechanism. $\phi 1$ is connected to a second gate 151 of all NMOS transistors 152, and $\phi 2$ is connected to a second gate 153 of all pMOS transistors 154. The transition can only take place in combination with the clock. Since $\phi 1$ and $\phi 2$ are non-overlapping, the pMOS and nMOS transistors will not have a simultaneous intermediate resistance. The setup is shown in FIG. 15 and the impedance diagram in FIG. 16.

Finally, regular CMOS inverters can be positioned near critical non-Flashing CMOS components. These inverters should take their input signal from the Tamper Detection Line above. Since the Tamper Detection Line operates multiple times faster than the regular operating circuitry, the net effect will be a high rate of light-bursts next to each non-Flashing CMOS component. Since a bright light overwhelms observation of a nearby faint light, an observer will not be able to detect what switching operations are occurring in the chip proper. These regular CMOS inverters will also effectively increase the amount of circuit noise, reducing the SNR and obscuring useful EMI.

There are a number of side effects due to the use of non-Flashing CMOS:

- The effective speed of the chip is reduced by twice the rise time of the clock per clock cycle. This is not a problem for an Authentication Chip.
- The amount of current drawn by the non-Flashing CMOS is reduced (since the short circuits do not occur). However, this is offset by the use of regular CMOS inverters.
- Routing of the clocks increases chip area, especially since multiple versions of $\phi 1$ and $\phi 2$ are required to cater for different levels of propagation. The estimation of chip area is double that of a regular implementation.
- Design of the non-Flashing areas of the Authentication Chip are slightly more complex than to do the same with a with a regular CMOS design. In particular, standard cell components cannot be used, making these areas full custom. This is not a problem for something as small as an Authentication Chip, particularly when the entire chip does not have to be protected in this manner.

Connections in Polysilicon Layers where Possible

Wherever possible, the connections along which the key or secret data flows, should be made in the polysilicon layers. Where necessary, they can be in metal 1, but must never be in the top metal layer (containing the Tamper Detection Lines).

OverUnderPower Detection Unit

Each Authentication Chip requires an OverUnderPower Detection Unit to prevent Power Supply Attacks. An OverUnderPower Detection Unit detects power glitches and tests the power level against a Voltage Reference to ensure it is within a certain tolerance. The Unit contains a single Voltage Reference and two comparators. The OverUnderPower Detection Unit would be connected into the RESET Tamper Detection Line, thus causing a RESET when triggered. A side effect of the OverUnderPower Detection Unit is that as the voltage drops during a power-down, a RESET is triggered, thus erasing any work registers.

No Test Circuitry

Test hardware on an Authentication Chip could very easily introduce vulnerabilities. As a result, the Authentication Chip should not contain any BIST or scan paths. The Authentication Chip must therefore be testable with external test vectors. This should be possible since the Authentication Chip is not complex.

Reading ROM

This attack depends on the key being stored in an addressable ROM. Since each Authentication Chip stores its authentication keys in internal Flash memory and not in an addressable ROM, this attack is irrelevant.

Reverse Engineering the Chip

Reverse engineering a chip is only useful when the security of authentication lies in the algorithm alone. However our Authentication Chips rely on a secret key, and not in the secrecy of the algorithm. Our authentication algorithm is, by contrast, public, and in any case, an attacker of a high volume consumable is assumed to have been able to obtain detailed plans of the internals of the chip. In light of these factors, reverse engineering the chip itself, as opposed to the stored data, poses no threat.

Usurping the Authentication Process

There are several forms this attack can take, each with varying degrees of success. In all cases, it is assumed that a clone manufacturer will have access to both the System and the consumable designs. An attacker may attempt to build a chip that tricks the System into returning a valid code instead of generating an authentication code. This attack is not possible for two reasons. The first reason is that System Authentication chips and Consumable Authentication Chips, although physically identical, are programmed differently. In particular, the RD opcode and the RND opcode are the same, as are the WR and TST opcodes. A System authentication Chip cannot perform a RD command since every call is interpreted as a call to RND instead. The second reason this attack would fail is that separate serial data lines are provided from the System to the System and Consumable Authentication Chips. Consequently neither chip can see what is being transmitted to or received from the other. If the attacker builds a clone chip that ignores WR commands (which decrement the consumable remaining), Protocol 3 ensures that the subsequent RD will detect that the WR did not occur. The System will therefore not go ahead with the use of the consumable, thus thwarting the attacker. The same is true if an attacker simulates loss of contact before authentication—since the authentication does not take place, the use of the consumable doesn't occur. An attacker is therefore limited to modifying each System in order for clone consumables to be accepted.

Modification of System

The simplest method of modification is to replace the System's Authentication Chip with one that simply reports success for each call to TST. This can be thwarted by System calling TST several times for each authentication, with the first few times providing false values, and expecting a fail from TST. The final call to TST would be expected to succeed. The number of false calls to TST could be determined by some part of the returned result from RD or from the system clock. Unfortunately an attacker could simply rewire System so that the new System clone authentication chip can monitor the returned result from the consumable chip or clock. The clone System Authentication Chip would only return success when that monitored value is presented to its TST function. Clone consumables could then return any value as the hash result for RD, as the clone System chip would declare that value valid. There is therefore no point for the System to call the System Authentication Chip multiple times, since a rewiring attack will only work for the System that has been rewired, and not for all Systems. A similar form of attack on a System is a replacement of the System ROM. The ROM program code can be altered so that the Authentication never occurs. There is nothing that can be done about this, since the System remains in the hands of a consumer. Of course this would void any warranty, but the consumer may consider the alteration worthwhile if the clone consumable were extremely cheap and more readily available than the original item.

The System/consumable manufacturer must therefore determine how likely an attack of this nature is. Such a study must include given the pricing structure of Systems and Consumables, frequency of System service, advantage to the consumer of having a physical modification performed, and where consumers would go to get the modification performed. The limit case of modifying a system is for a clone manufacturer to provide a completely clone System which takes clone consumables. This may be simple competition or violation of patents. Either way, it is beyond the scope of the Authentication Chip and depends on the technology or service being cloned.

Direct Viewing of Chip Operation by Conventional Probing

In order to view the chip operation, the chip must be operating. However, the Tamper Prevention and Detection circuitry covers those sections of the chip that process or hold the key. It is not possible to view those sections through the Tamper Prevention lines. An attacker cannot simply slice the chip past the Tamper Prevention layer, for this will break the Tamper Detection Lines and cause an erasure of all keys at power-up. Simply destroying the erasure circuitry is not sufficient, since the multiple ChipOK bits (now all 0) feeding into multiple units within the Authentication Chip will cause the chip's regular operating circuitry to stop functioning. To set up the chip for an attack, then, requires the attacker to delete the Tamper Detection lines, stop the Erasure of Flash memory, and somehow rewire the components that relied on the ChipOK lines. Even if all this could be done, the act of slicing the chip to this level will most likely destroy the charge patterns in the non-volatile memory that holds the keys, making the process fruitless.

Direct Viewing of the Non-Volatile Memory

If the Authentication Chip were sliced so that the floating gates of the Flash memory were exposed, without discharging them, then the keys could probably be viewed directly using an STM or SKM. However, slicing the chip to this level without discharging the gates is probably impossible. Using wet etching, plasma etching, ion milling, or chemical mechanical polishing will almost certainly discharge the small charges present on the floating gates. This is true of regular Flash memory, but even more so of multi-level Flash memory.

Viewing the Light Bursts Caused by State Changes

All sections of circuitry that manipulate secret key information are implemented in the non-Flashing CMOS described above. This prevents the emission of the majority of light bursts. Regular CMOS inverters placed in close proximity to the non-Flashing CMOS will hide any faint emissions caused by capacitor charge and discharge. The inverters are connected to the Tamper Detection circuitry, so they change state many times (at the high clock rate) for each non-Flashing CMOS state change.

Monitoring EMI

The Noise Generator described above will cause circuit noise. The noise will interfere with other electromagnetic emissions from the chip's regular activities and thus obscure any meaningful reading of internal data transfers.

Viewing $I_{dd}$ Fluctuations

The solution against this kind of attack is to decrease the SNR in the $I_{dd}$ signal. This is accomplished by increasing the amount of circuit noise and decreasing the amount of signal. The Noise Generator circuit (which also acts as a defense against EMI attacks) will also cause enough state changes each cycle to obscure any meaningful information in the $I_{dd}$ signal. In addition, the special Non-Flashing CMOS implementation of the key-carrying data paths of the chip prevents current from flowing when state changes occur. This has the benefit of reducing the amount of signal.

Differential Fault Analysis

Differential fault bit errors are introduced in a non-targeted fashion by ionization, microwave radiation, and environmental stress. The most likely effect of an attack of this nature is a change in Flash memory (causing an invalid state) or RAM (bad parity). Invalid states and bad parity are detected by the Tamper Detection Circuitry, and cause an erasure of the key. Since the Tamper Detection Lines cover the key manipulation circuitry, any error introduced in the key manipulation circuitry will be mirrored by an error in a Tamper Detection Line. If the Tamper Detection Line is affected, the chip will either continually RESET or simply erase the key upon a power-up, rendering the attack fruitless. Rather than relying on a non-targeted attack and hoping that "just the right part of the chip is affected in just the right way", an attacker is better off trying to introduce a targeted fault (such as overwrite attacks, gate destruction etc). For information on these targeted fault attacks, see the relevant sections below.

Clock Glitch Attacks

The Clock Filter (described above) eliminates the possibility of clock glitch attacks.

Power Supply Attacks

The OverUnderPower Detection Unit (described above) eliminates the possibility of power supply attacks.

Overwriting ROM

Authentication Chips store Program code, keys and secret information in Flash memory, and not in ROM. This attack is therefore not possible.

Modifying EEPROM/Flash

Authentication Chips store Program code, keys and secret information in Flash memory. However, Flash memory is covered by two Tamper Prevention and Detection Lines. If either of these lines is broken (in the process of destroying a gate) the attack will be detected on power-up, and the chip will either RESET (continually) or erase the keys from Flash memory. However, even if the attacker is able to somehow access the bits of Flash and destroy or short out the gate holding a particular bit, this will force the bit to have no charge or a full charge. These are both invalid states for the Authentication Chip's usage of the multi-level Flash memory (only the two middle states are valid). When that data value is transferred from Flash, detection circuitry will cause the Erasure Tamper Detection Line to be triggered—thereby erasing the remainder of Flash memory and RESETing the chip. A Modify EEPROM/Flash Attack is therefore fruitless.

Gate Destruction Attacks

Gate Destruction Attacks rely on the ability of an attacker to modify a single gate to cause the chip to reveal information during operation. However any circuitry that manipulates secret information is covered by one of the two Tamper Prevention and Detection lines. If either of these lines is broken (in the process of destroying a gate) the attack will be detected on power-up, and the chip will either RESET (continually) or erase the keys from Flash memory. To launch this kind of attack, an attacker must first reverse-engineer the chip to determine which gate(s) should be targeted. Once the location of the target gates has been determined, the attacker must break the covering Tamper Detection line, stop the Erasure of Flash memory, and somehow rewire the components that rely on the ChipOK lines. Rewiring the circuitry cannot be done without slicing the chip, and even if it could be done, the act of slicing the chip to this level will most likely destroy the charge patterns in the non-volatile memory that holds the keys, making the process fruitless.

Overwrite Attacks

An Overwrite Attack relies on being able to set individual bits of the key without knowing the previous value. It relies on probing the chip, as in the Conventional Probing Attack and destroying gates as in the Gate Destruction Attack. Both of these attacks (as explained in their respective sections), will not succeed due to the use of the Tamper Prevention and Detection Circuitry and ChipOK lines. However, even if the attacker is able to somehow access the bits of Flash and destroy or short out the gate holding a particular bit, this will force the bit to have no charge or a full charge. These are both invalid states for the Authentication Chip's usage of the multi-level Flash memory (only the two middle states are valid). When that data value is transferred from Flash detection circuitry will cause the Erasure Tamper Detection Line to be triggered—thereby erasing the remainder of Flash memory and RESETing the chip. In the same way, a parity check on tampered values read from RAM will cause the Erasure Tamper Detection Line to be triggered. An Overwrite Attack is therefore fruitless.

Memory Remanence Attack

Any working registers or RAM within the Authentication Chip may be holding part of the authentication keys when power is removed. The working registers and RAM would continue to hold the information for some time after the removal of power. If the chip were sliced so that the gates of the registers/RAM were exposed, without discharging them, then the data could probably be viewed directly using an STM. The first defense can be found above, in the description of defense against Power Glitch Attacks. When power is removed, all registers and RAM are cleared, just as the RESET condition causes a clearing of memory. The chances then, are less for this attack to succeed than for a reading of the Flash memory. RAM charges (by nature) are more easily lost than Flash memory. The slicing of the chip to reveal the RAM will certainly cause the charges to be lost (if they haven't been lost simply due to the memory not being refreshed and the time taken to perform the slicing). This attack is therefore fruitless.

Chip Theft Attack

There are distinct phases in the lifetime of an Authentication Chip. Chips can be stolen when at any of these stages:

After manufacture, but before programming of key

After programming of key, but before programming of state data

After programming of state data, but before insertion into the consumable or system After insertion into the system or consumable A theft in between the chip manufacturer and programming station would only provide the clone manufacturer with blank chips. This merely compromises the sale of Authentication chips, not anything authenticated by the Authentication chips. Since the programming station is the only mechanism with consumable and system product keys, a clone manufacturer would not be able to program the chips with the correct key. Clone manufacturers would be able to program the blank chips for their own Systems and Consumables, but it would be difficult to place these items on the market without detection. The second form of theft can only happen in a situation where an Authentication Chip passes through two or more distinct programming phases. This is possible, but unlikely. In any case, the worst situation is where no state data has been programmed, so all of M is read/write. If this were the case, an attacker could attempt to launch an Adaptive Chosen Text Attack on the chip. The HMAC-SHA1 algorithm is resistant to such attacks. The third form of theft would have to take place in between the programming station and the installation factory. The Authentication chips would already be programmed for use in a particular system or for use in a particular consumable. The only use these chips have to a thief is to place them into a clone System or clone Consumable. Clone systems are irrelevant—a cloned System would not even require an authentication chip. For clone Consumables, such a theft would limit the number of cloned products to the number of chips stolen. A single theft should not create a supply constant enough to provide clone manufacturers with a cost-effective business. The final form of theft is where the System or Consumable itself is stolen. When the theft occurs at the manufacturer, physical security protocols must be enhanced. If the theft occurs anywhere else, it is a matter of concern only for the owner of the item and the police or insurance company. The security mechanisms that the Authentication Chip uses assume that the consumables and systems are in the hands of the public. Consequently, having them stolen makes no difference to the security of the keys.

We claim:

1. An integrated circuit including: non-volatile memory for storing secret information and an indicator that the secret information is stored therein; and a detection unit for preventing at least one form of power supply attack on the secret information, the detection unit comprising:
   a comparator having a first input connected to a reference voltage and a second input connected to a power supply line, the comparator being configured to output a detection signal when a power supply voltage is under a predetermined limit determined by the reference voltage; and
   an output connected into a reset line of the integrated circuit, the output providing a reset signal to first delete, overwrite, or otherwise render unreadable the indicator and then delete, overwrite, or otherwise render unreadable the secret information in the memory when the detection signal is output by the comparator,
   wherein the reset signal is provided when the power supply voltage drops below the predetermined limit due to a power-down of the integrated circuit.

2. An integrated circuit according to claim 1, wherein the reset line is a tamper detection line, the tamper detection line responding to the signal to delete, overwrite, or otherwise render unreadable at least the secret information in the memory.

3. An integrated circuit according to claim 1, wherein the detection unit is implemented in CMOS.

4. An integrated circuit according to claim 1, wherein the detection unit is covered by a tamper detection line, or by a tamper prevention line, or both.

* * * * *